United States Patent [19]

Saitoh et al.

[11] Patent Number: 4,579,797
[45] Date of Patent: Apr. 1, 1986

[54] PHOTOCONDUCTIVE MEMBER WITH AMORPHOUS GERMANIUM AND SILICON REGIONS, NITROGEN AND DOPANT

[75] Inventors: Keishi Saitoh, Ibaraki; Yukihiko Ohnuki, Kawasaki; Shigeru Ohno, Yokohama, all of Japan

[73] Assignee: Canon Kabushiki Kaisha, Tokyo, Japan

[21] Appl. No.: 662,977

[22] Filed: Oct. 19, 1984

[30] Foreign Application Priority Data

Oct. 25, 1983 [JP] Japan ................................ 58-200562
Dec. 26, 1983 [JP] Japan ................................ 58-249090
Dec. 27, 1983 [JP] Japan ................................ 58-252018

[51] Int. Cl.$^4$ .................. G03G 5/08; G03G 5/082; G03G 5/085
[52] U.S. Cl. .................................... 430/57; 430/63; 430/84; 430/95
[58] Field of Search .................... 430/57, 95, 84, 69, 430/63

[56] References Cited

U.S. PATENT DOCUMENTS 4,451,546  5/1984  Kawamura et al. ................. 430/69
4,490,454  12/1984  Misumi et al. ....................... 430/95
4,491,626  1/1985  Kawamura et al. .................. 430/95

*Primary Examiner*—John L. Goodrow
*Attorney, Agent, or Firm*—Fitzpatrick, Cella, Harper & Scinto

[57] ABSTRACT

A photoconductive member comprises a substrate for photoconductive member and a light receiving layer provided on said substrate having a layer constitution in which a first layer region (G) comprising an amorphous material containing germanium atoms and a second layer region (S) exhibiting photoconductivity comprising an amorphous material containing silicon atoms are successively provided from the substrate side, said light receiving layer containing nitrogen atoms together with a substance for controlling conductivity (C) in a distributed state such that, in said light receiving layer, the maximum value $C(PN)_{max}$ of the content of said substance (C) in the layer thickness direction exists within said second layer region (S) or at the interface between said first and second layer region and, in said second layer region (S), said substance (C) is distributed in greater amount on the side of said substrate.

99 Claims, 47 Drawing Figures

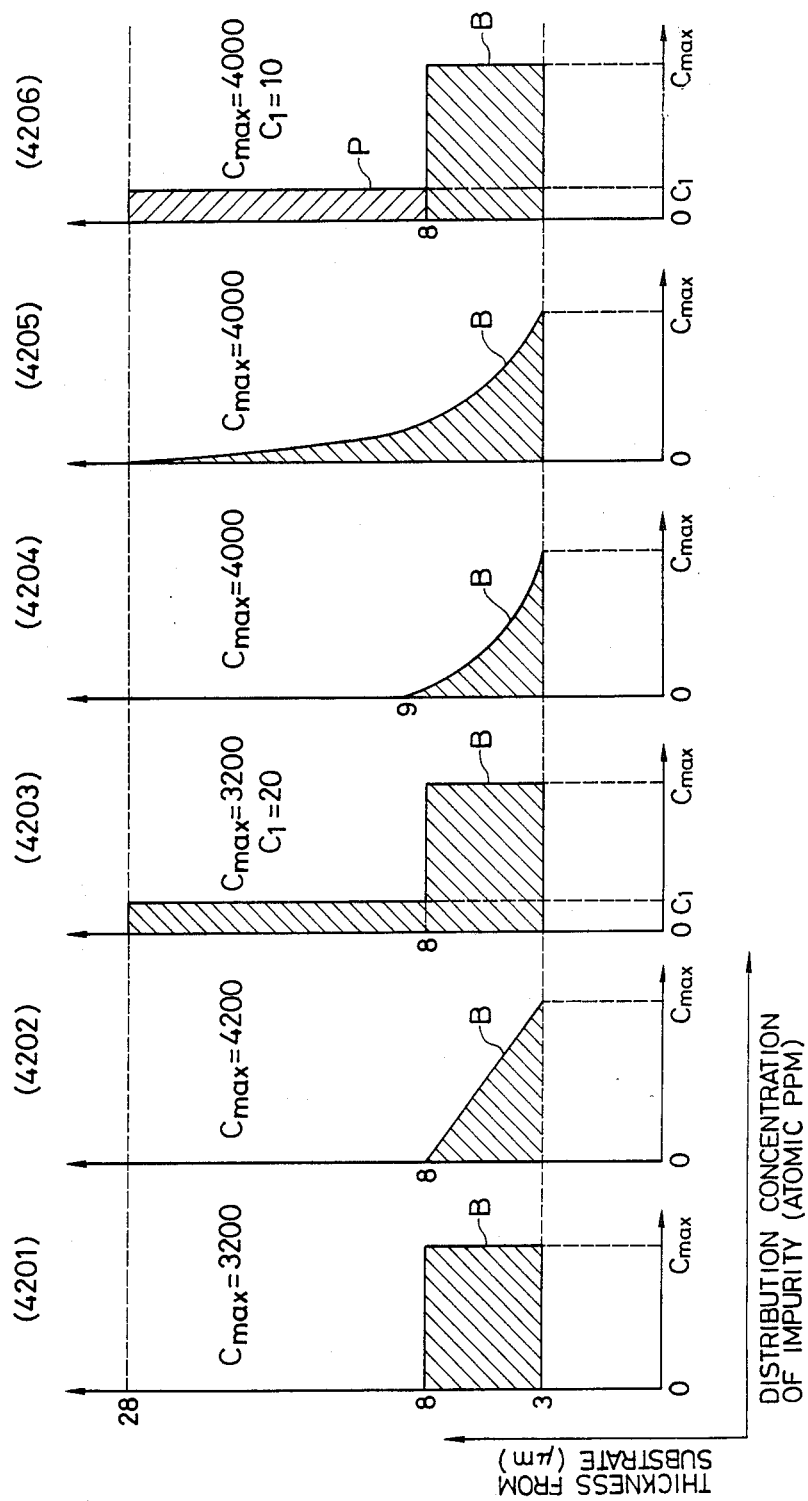

PHOTOCONDUCTIVE MEMBER WITH AMORPHOUS GERMANIUM AND SILICON REGIONS, NITROGEN AND DOPANT

BACKGROUND OF THE INVENTION

1. Field of the Invention

This invention relates to a photoconductive member having sensitivity to electromagnetic waves such as light [herein used in a broad sense, including ultraviolet rays, visible light, infrared rays, X-rays gamma-rays, and the like].

2. Description of the Prior Art

Photoconductive materials, which constitute photoconductive layers in solid state image pickup devices, image forming members for electrophotography in the field of image formation, or manuscript reading devices and the like, are required to have a high sensitivity, a high SN ratio [photocurrent $(I_p)$/dark current $(I_d)$], spectral characteristics matching to those of electromagnetic waves to be irradiated, a rapid response to light, a desired dark resistance value as well as no harm to human bodies during usage. Further, in a solid state image pick-up device, it is also required that the residual image should easily be treated within a predetermined time. Particularly, in case of an image forming member for electrophotography to be assembled in an electrophotographic device to be used in an office as office apparatus, the aforesaid harmless characteristic is very important.

From the standpoint as mentioned above, amorphous silicon [hereinafter referred to as a-Si] has recently attracted attention as a photoconductive material. For example, German OLS Nos. 2746967 and 2855718 disclose applications of a-Si for use in image forming members for electrophotography, and German OLS No. 2933411 discloses an application of a-Si for use in a photoelectric transducing reading device.

However, under the present situation, the photoconductive members of the prior art having photoconductive layers constituted of a-Si are further required to be improved in a balance of overall characteristics including electrical, optical and photoconductive characteristics such as dark resistance value, photosensitivity and response to light, etc., and environmental characteristics during use such as humidity resistance, and further stability with the lapse of time.

For instance, when the above photoconductive member is applied in an image forming member for electrophotography, residual potential is frequently observed to remain during use thereof if improvements to higher photosensitivity and higher dark resistance are scheduled to be effected at the same time. When such a photoconductive member is repeatedly used for a long time, there will be caused various inconveniences such as accumulation of fatigues by repeated uses or so called ghost phenomenon wherein residual images are formed.

Further, a-Si has a relatively smaller coefficient of absorption of the light on the longer wavelength side in the visible light region as compared with that on the shorter wavelength side. Accordingly, in matching to the semiconductor laser practically applied at the present time, the light on the longer wavelength side cannot effectively be utilized, when employing a halogen lamp or a fluorescent lamp as the light source. Thus, various points remain to be improved.

On the other hand, when the light irradiated is not sufficiently absorbed in the photoconductive layer, but the amount of the light reaching the substrate is increased, interference due to multiple reflection may occur in the photoconductive layer to become a cause for "unfocused" image, in the case when the substrate itself has a high reflectance against the light transmitted through the photoconductive layer.

This effect will be increased, if the irradiated spot is made smaller for the purpose of enhancing resolution, thus posing a great problem in the case of using a semiconductor laser as the light source.

Further, a-Si materials to be used for constituting the photoconductive layer may contain as constituent atoms hydrogen atoms or halogen atoms such as fluorine atoms, chlorine atoms, etc. for improving their electrical, photoconductive characteristics, boron atoms, phosphorous atoms, etc. for controlling the electroconduction type as well as other atoms for improving other characteristics. Depending on the manner in which these constituent atoms are contained, there may sometimes be caused problems with respect to electrical or photoconductive characteristics of the layer formed.

That is, for example, in many cases, the life of the photocarriers generated by light irradiation in the photoconductive layer formed is insufficient, or at the dark portion, the charges injected from the substrate side cannot sufficiently be impeded.

Accordingly, while attempting to improve the characteristics of a-Si material per se on one hand, it is also required to make efforts to overcome all the problems as mentioned above in designing of the photoconductive member on the other hand.

In view of the above points, the present invention contemplates the achievement obtained as a result of extensive studies made comprehensively from the standpoints of applicability and utility of a-Si as a photoconductive member for image forming members for electrophotography, solid state image pick-up devices, reading devices, etc. It has now been found that a photoconductive member having a layer constitution comprising a light receiving layer exhibiting photoconductivity, which comprises a-Si, especially an amorphous material containing at least one of hydrogen atom (H) and halogen atom (X) in a matrix of silicon atoms such as so called hydrogenated amorphous silicon, halogenated amorphous silicon or halogen-containing hydrogenated amorphous silicon [hereinafter referred to comprehensively as a-Si(H,X)], said photoconductive member being prepared by designing so as to have a specific structure as hereinafter described, not only exhibits practically extremely excellent characteristics but also surpass the photoconductive members of the prior art in substantially all respects, especially having markedly excellent characteristics as a photoconductive member for electrophotography and also excellent absorption spectrum characteristics on the longer wavelength side.

SUMMARY OF THE INVENTION

A primary object of the present invention is to provide a photoconductive member having electrical, optical and photoconductive characteristics which are constantly stable and all-environment type with virtually no dependence on the environments under use, which member is markedly excellent in photosensitive characteristic on the longer wavelength side and light fatigue resistance, and also excellent in durability without causing deterioration phenomenon when used repeatedly, exhibiting no or substantially no residual potential observed.

Another object of the present invention is to provide a photoconductive member which is high in photosensitivity throughout the whole visible light region, particularly excellent in matching to a semiconductor laser and also rapid in response to light.

Still another object of the present invention is to provide a photoconductive member having sufficient charge retentivity during charging treatment for formation of electrostatic images to the extent such that a conventional electrophotographic method can be very effectively applied when it is provied for use as an image forming member for electrophotography.

Further, still another object of the present invention is to provide a photoconductive member for electrophotography, which can easily provide an image of high quality which is high in density, clear in halftone, high in resolution and free from "unfocused" image.

Still another object of the present invention is to provide a photoconductive member having high photosensitivity and high SN ratio characteristic.

According to an aspect of the present invention, there is provided a photoconductive member comprising a substrate for photoconductive member and a light receiving layer provided on said substrate having a layer constitution in which a first layer region (G) comprises an amorphous material containing germanium atoms and a second layer region (S) exhibiting photoconductivity comprising an amorphous material containing silicon atoms are successively provided from the substrate side, said light receiving layer containing nitrogen atoms together with a substance for controlling conductivity (C) in a distribution state such that, in said light receiving layer, the maximum value of the content of said substance (C) in the layer thickness direction exists within said second layer region (S) or at the interface between said first and second layer regions and, in said second layer region (S), said substance (C) is distributed in greater amount on the side of said substrate.

According to another aspect of the present invention, there is provided a photoconductive member comprising a substrate for photoconductive member and a light receiving layer provided on said substrate consisting of a first layer (I) with a layer constitution in which a first layer region (G) comprising an amorphous material containing germanium atoms and a second layer region (S) exhibiting photoconductivity comprising an amorphous material containing silicon atoms are successively provided from the substrate side and a second layer (II) comprising an amorphous material containing silicon atoms and at least one atom selected from carbon atoms and oxygen atoms, said first layer (I) containing nitrogen atoms together with a substance for controlling conductivity (C) in a distribution state such that the maximum value of the distribution concentration C(PN)max of said substance (C) in the layer thickness direction exists within said second layer region (S) and, in said second layer region (S), said substance (C) is distributed in greater amount on the side of said substrate.

BRIEF DESCRIPTION OF THE DRAWINGS

FIGS. 43, 44A and 44B through 46 each shows a distribution of the respective atoms in Examples of the present invention.

DETAILED DESCRIPTION OF THE PREFERRED EMBODIMENTS

Figure 1:
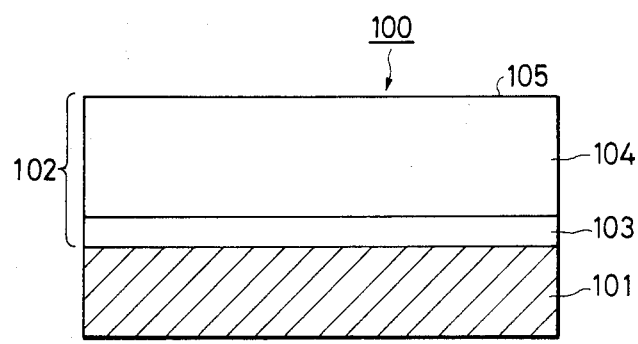
FIG. 1 and FIG. 41 each shows a schematic sectional view for illustration of the layer constitution of the photoconductive member according to the present invention.

Referring now to the drawings, the photoconductive members according to the present invention are to be described in detail below.

FIG. 1 shows a schematic sectional view for illustration of the layer structure of a first embodiment of the constitution of the photoconductive member of this invention.

The photoconductive member 100 as shown in FIG. 1 is constituted of a light receiving layer 102 formed on a substrate 101 for photoconductive member, said light receiving layer 102 having a free surface 105 on one side.

The light receiving layer 102 has a layer structure constituted of a first layer region (G) 103 composed of an amorphous material comprising germanium atoms and, if desired, at least one of silicon atoms (Si), hydrogen atoms (H) and halogen atoms (X) (hereinafter abbreviated as "a-Ge(Si,H,X)" and a second layer region (S) 104 having photoconductivity composed of a-Si(H,X) laminated successively from the support side 101.

The light receiving layer 102 contains nitrogen atoms together with a substance for controlling conductivity (C), said substance (C) being contained in a distribution state such that, in the light receiving layer 102, the maximum value $C(PN)_{max}$ of the distribution concentration in the layer thickness direction exists in the second layer region (S) and, in the second layer region (S), it is distributed in greater amount on the side of the substrate 101.

The germanium atoms contained in the first layer region (G) are contained in uniform state in the interplanar direction in parallel to the surface of the substrate, but may be either uniform or ununiform in the layer thickness direction.

Also, when the distribution of germanium atoms contained in the first layer region (G) is ununiform, it is desirable that the distribution concentration C in the layer thickness direction should be changed toward the substrate side or the side of the second layer region (S) gradually or stepwise, or linearly.

Particularly, in the case where the distribution of germanium atoms in the first layer region (G) is varied such that germanium atoms are distributed continuously over all the layer region with the concentration C of germanium atoms in the layer thickness direction being reduced from the substrate side to the second layer region (S), affinity between the first layer region (G) and the second layer region (S) is excellent. Also, as described hereinafter, by increasing the concentration C of germanium atoms at the end portion on the substrate side extremely great, the light on the longer wavelength side which cannot substantially be absorbed by the second layer region (S) can be absorbed in the first layer region (G) substantially completely, when employing a semiconductor layer, whereby interference by reflection from the substrate surface can be prevented and reflection against the interface between the layer region (G) and the layer region (S) can sufficiently be suppressed.

Also, in the photoconductive member of the present invention, the respective amorphous materials constituting the first layer region (G) and the second layer region (S) have the common constituent of silicon atoms, and therefore chemical stability can be sufficiently ensured at the laminated interface.

FIGS. 2 through 10 show typical examples of distribution in the direction of layer thickness of germanium atoms contained in the first layer region (G) of the photoconductive member in the present invention.

In FIGS. 2 through 10, the axis of abscissa indicates the distribution concentration C of germanium atoms and the axis of ordinate the layer thickness of the first layer region (G), $t_B$ showing the position of the end surface of the first layer region (G) on the substrate side and $t_T$ the position of the end surface of the first layer region (G) on the side opposite to the substrate side. That is, layer formation of the first layer region (G) containing germanium proceeds from the $t_B$ side toward the $t_T$ side.

Figure 2:
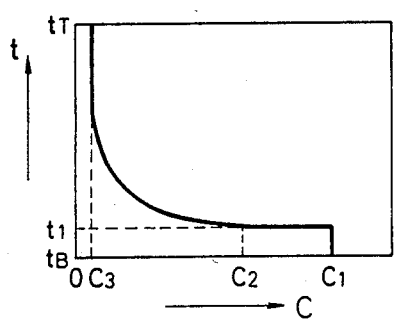
FIGS. 2 to 10 illustrate the depth profiles of germanium atoms in the layer region (G)

In FIG. 2, there is shown a first typical embodiment of the depth profile of germanium atoms in the layer thickness direction contained in the first layer region (G).

In the embodiment as shown in FIG. 2, from the interface position $t_B$ at which the surface, on which the first layer region (G) containing germanium atoms is to be formed, is contacted with the surface of said first layer region (G) to the position $t_1$, germanium atoms are contained in the first layer region (G) formed, while the concentration C of germanium atoms taking a constant value of $C_1$, the concentration being gradually decreased from the concentration $C_2$ continuously from the position $t_1$ to the interface position $t_T$. At the interface position $t_T$, the concentration C of germanium atoms is made $C_3$.

Figure 3:
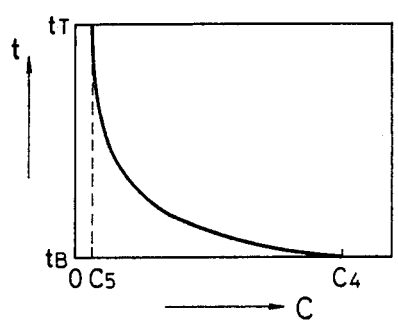

In the embodiment shown in FIG. 3, the concentration C of germanium atoms contained is decreased gradually and continuously from the position $t_B$ to the position $t_T$ from the concentration $C_4$ until it becomes the concentration $C_5$ at the position $t_T$.

Figure 4:
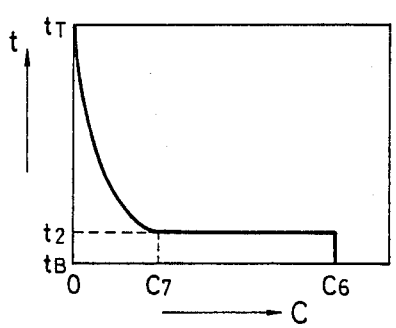

In case of FIG. 4, the concentration C of germanium atoms is made constant as $C_6$ from the position $t_B$ to the position $t_2$, gradually decreased continuously from the position $t_2$ to the position $t_T$ and the concentration C is made substantially zero at the position $t_T$ (substantially zero herein means the content less than the detectable limit).

Figure 5:
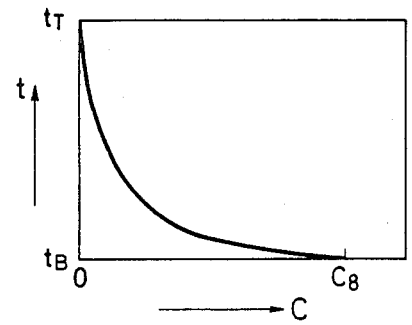

In case of FIG. 5, the concentration C of germanium atoms are decreased gradually and continuously from the position $t_B$ to the position $t_T$ from the concentration $C_8$, until it is made substantially zero at the position $t_T$.

Figure 6:
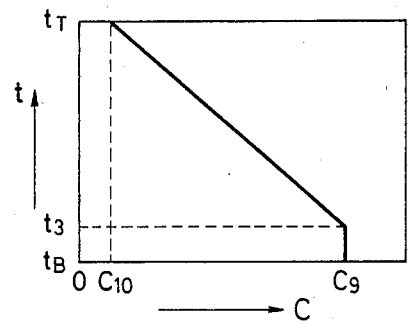

In the embodiment shown in FIG. 6, the concentration C of germanium atoms is constantly $C_9$ between the position $t_B$ and the position $t_3$, and it is made $C_{10}$ at the position $t_T$. Between the position $t_3$ and the position $t_T$, the concentration C is decreased linearly from the position $t_3$ to the position $t_T$.

Figure 7:
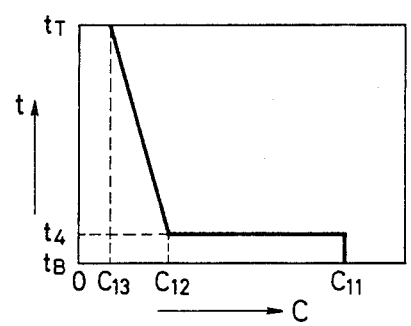

In the embodiment shown in FIG. 7, there is formed a depth profile such that the concentration C takes a constant value of $C_{11}$ from the position $t_B$ to the position $t_4$, and is decreased as a first order function from the concentration $C_{12}$ to the concentration $C_{13}$ from the position $t_4$ to the position $t_T$.

Figure 8:
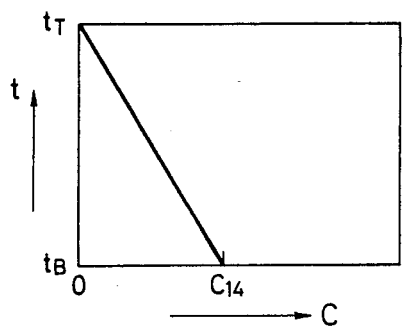

In the embodiment shown in FIG. 8, the concentration C of germanium atoms is decreased as a first order function from the concentration $C_{14}$ to zero from the position $t_B$ to the position $t_T$.

Figure 9:
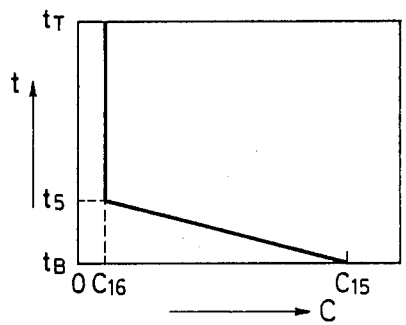

In FIG. 9, there is shown an embodiment, where the concentration C(G) of germanium atoms is decreased as a first order function from the concentration $C_{15}$ to $C_{16}$ from the position $t_B$ to $t_T$ and made constantly at the concentration $C_{16}$ between the position $t_5$ and $t_T$.

Figure 10:
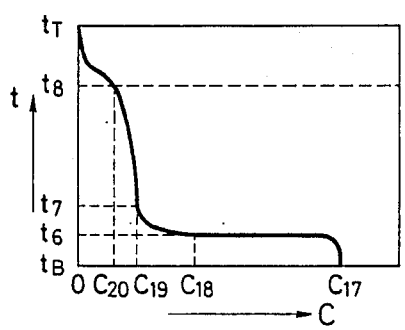

In the embodiment shown in FIG. 10, the concentration C of germanium atoms is at the concentration $C_{17}$ at the position $t_B$, which concentration $C_{17}$ is initially decreased gradually and abruptly near the position $t_6$, until it reaches the concentration $C_{18}$ at the position $t_6$.

Between the position $t_6$ and the position $t_7$, the concentration is initially decreased abruptly and thereafter gradually, until it reaches the concentration $C_{19}$ at the position $t_7$. Between the position $t_7$ and the position $t_8$, the concentration is decreased very gradually to the concentration $C_{20}$ at the position $t_8$. Between the position $t_8$ and the position $t_T$, the concentration is decreased along the curve having a shape as shown in the Figure from the concentration $C_{20}$ to substantially zero.

As described above about some typical examples of depth profiles of germanium atoms contained in the first layer region (G) in the direction of the layer thickness by referring to FIGS. 2 through 10, in the preferred embodiment of the present invention, the first layer region (G) is provided desirably in a depth profile so as to have a portion enriched in concentration C of germanium atoms on the substrate side and a portion depleted in concentration C of germanium atoms to considerably lower than that of the substrate side on the interface $t_T$ side.

The first layer region (G) constituting the light receiving layer of the photoconductive member in the present invention is desired to have a localized region (A) containing germanium atoms preferably at a relatively higher concentration on the substrate side as described above.

In the present invention, the localized region (A), as explained in terms of the symbols shown in FIG. 2 through FIG. 10, may be desirably provided within $5\mu$ from the interface position $t_B$.

In the present invention, the above localized region (A) may be made to be identical with the whole layer region ($L_T$) on the interface position $t_B$ to the thickness of $5\mu$, or alternatively a part of the layer region ($L_T$).

It may suitably be determined depending on the characteristics required for the light receiving layer to be formed, whether the localized region (A) is made a part or whole of the layer region ($L_T$).

The localized region (A) may preferably be formed according to such a layer formation that the maximum value Cmax of the concentrations C of germanium atoms in a distribution in the layer thickness direction may preferably be 1000 atomic ppm or more, more preferably 5000 atomic ppm or more, most preferably $1 \times 10^4$ atomic ppm or more.

That is, according to the present invention, the layer region (G) containing germanium atoms is formed so that the maximum value Cmax of the distribution concentration C(G) may exist within a layer thickness of $5\mu$ from the substrate side (the layer region within $5\mu$ thickness from $t_B$).

In the present invention, the content of germanium atoms in the first layer region (G) containing germanium atoms, which may suitably be determined as desired so as to achieve effectively the objects of the present invention, may preferably be 1 to $10 \times 10^5$ atomic ppm, more preferably 100 to $9.5 \times 10^5$ atomic ppm, most preferably 500 to $8 \times 10^5$ atomic ppm.

In the present invention, the layer thickness of the first layer region (G) and the thickness of the second layer region (S) are important factors for accomplishing effectively the object of the present invention and therefore sufficient care should be paid in designing of the photoconductive member so that desirable characteristics may be imparted to the photoconductive member formed.

In the present invention, the layer thickness $T_B$ of the first layer region (G) may preferably be 30 Å to 50$\mu$, more preferably 40 Å to 40$\mu$, most preferably 50 Å to 30 $\mu$.

On the other hand, the layer thickness T of the second layer region (S) may be preferably 0.5 to 90$\mu$, more preferably 1 to 80$\mu$, most preferably 2 to 50 $\mu$.

The sum of the above layer thickness T and $T_B$, namely (T+$T_B$) may be suitably determined as desired in designing of the layers of the photoconductive member, based on the mutual organic relationship between the characteristics required for both layer regions and the characteristics required for the whole amorphous layer.

In the photoconductive member of the present invention, the numerical range for the above ($T_B$+T) may generally be from 1 to 100$\mu$, preferably 1 to 80$\mu$, most preferably 2 to 50 $\mu$.

In a more preferred embodiment of the present invention, it is preferred to select the numerical values for respective thicknesses $T_B$ and T as mentioned above so that the relation of $T_B/T \leq 1$ may be satisfied.

In selection of the numerical values for the thicknesses $T_B$ and T in the above case, the values of $T_B$ and T should preferably be determined so that the relation $T_B/T \leq 0.9$, most preferably, $T_B/T \leq 0.8$, may be satisfied.

In the present invention, when the content of germanium atoms in the first layer region (G) is $1 \times 10^5$ atomic ppm or more, the layer thickness $T_B$ should desirably be made as thin as possible, preferably 30$\mu$ or less, more preferably 25$\mu$ or less, most preferably 20$\mu$ or less.

In the present invention, illustrative of halogen atoms (X), which may optionally be incorporated in the first layer region (G) or/and the second layer region (S) constituting the light receiving layer, are fluorine, chlorine, bromine and iodine, particularly preferably fluorine and chlorine.

In the present invention, formation of the first layer region (G) constituted of a-Ge(Si,H,X) may be conducted according to the vacuum deposition method utilizing discharging phenomenon, such as glow discharge method, sputtering method or ion-plating method. For example, for formation of the first layer region (G) constituted of a-Ge(Si,H,X) according to the glow discharge method, the basic procedure comprises introducing a starting gas for Ge supply capable of supplying germanium atoms (Ge) optionally together with a starting gas for Si supply capable of supplying silicon atoms (Si), and a starting gas for introduction of hydrogen atoms (H) and/or halogen atoms (X) into a deposition chamber which can be internally brought to a reduced pressure, and exciting glow discharge in said deposition chamber, thereby effecting layer formation on the surface of a substrate placed at a predetermined position. For distributing ununiformly the germanium atoms, a layer consisting of a-Ge(Si,H,X) may be formed while controlling the depth profile of germanium atoms according to a desired change rate curve. Alternatively, for formation according to the sputtering method, when carrying out sputtering by use of a target constituted of Si or two sheets of targets of said target and a target constituted of Ge, or a target of a mixture of Si and Ge in an atmosphere of an inert gas such as Ar, He, etc. or a gas mixture based on these gases, a starting gas for Ge supply optionally together with, if desired, a gas for introduction of hydrogen atoms (H) and/or halogen atoms (X) may be introduced into a deposition chamber for sputtering, thereby forming a plasma atmosphere of a desired gas, and sputtering of the aforesaid target may be effected, while controlling the gas flow rates of the starting gas for supply of Ge or/and the starting gas for supply of Si according to a desired change rate curve.

In the case of the ion-plating method, for example, a vaporizing source such as a polycrystalline silicon or a single crystalline silicon and a polycrystalline germanium or a single crystalline germanium may be placed as vaporizing source in an evaporating boat, and the vaporizing source is heated by the resistance heating method or the electron beam method (EB method) to be vaporized, and the flying vaporized product is permitted to pass through a desired gas plasma atmosphere, otherwise following the same procedure as in the case of sputtering.

The starting gas for supplying Si to be used in the present invention may include gaseous or gasifiable hydrogenated silicons (silanes) such as $SiH_4$, $Si_2H_6$, $Si_3H_8$, $Si_4H_{10}$ and others as effective materials. In particular, $SiH_4$ and $Si_2H_6$ are preferred with respect to easy handling during layer formation and efficiency for supplying Si.

As the substances which can be starting gases for Ge supply, there may be effectively employed gaseous or gasifiable hydrogenated germanium such as $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, $Ge_9H_{20}$, etc. In particular, $GeH_4$, $Ge_2H_6$ and $Ge_3H_8$ are preferred with respect to easy handling during layer formation and efficiency for supplying Ge.

Effective starting gases for introduction of halogen atoms to be used in the present invention may include a large number of halogenic compounds, as exemplified preferably by halogenic gases, halides, interhalogen compounds, or gaseous or gasifiable halogenic compounds such as silane derivatives substituted with halogens.

Further, there may also be included gaseous or gasifiable silicon compounds containing halogen atoms constituted of silicon atoms and halogen atoms as constituent elements as effective ones in the present invention.

Typical examples of halogen compounds preferably used in the present invention may include halogen gases such as of fluorine, chlorine, bromine or iodine, interhalogen compounds such as BrF, ClF, $ClF_3$, $BrF_5$, $BrF_3$, $IF_3$, $IF_7$, ICl, IBr, etc.

As the silicon compounds containing halogen atoms, namely so called silane derivatives substituted with halogens, there may preferably be employed silicon halides such as $SiF_4$, $Si_2F_6$, $SiCl_4$, $SiBr_4$ and the like.

When the characteristic photoconductive member of the present invention is formed according to the glow discharge method by employment of such a silicon compound containing halogen atoms, it is possible to form the first layer region (G) constituted of a-SiGe containing halogen atoms on a desired substrate without use of a hydrogenated silicon gas as the starting gas capable of supplying Si together with the starting gas for Ge supply.

In the case of forming the first layer region (G) containing halogen atoms according to the glow discharge method, the basic procedure comprises introducing, for example, a silicon halide as the starting gas for Si supply, a hydrogenated germanium as the starting gas for Ge supply and a gas such as Ar, $H_2$, He, etc. at a predetermined mixing ratio into the deposition chamber for formation of the first layer region (G) and exciting glow discharge to form a plasma atmosphere of these gases, whereby the first layer region (G) can be formed on a desired substrate. In order to control the ratio of hydrogen atoms incorporated more easily, hydrogen gas or a gas of a silicon compound containing hydrogen atoms may also be mixed with these gases in a desired amount to form the layer.

Also, each gas is not restricted to a single species, but multiple species may be available at any desired ratio.

In either case of the sputtering method and the ion-plating method, introduction of halogen atoms into the layer formed may be performed by introducing the gas of the above halogen compound or the above silicon compound containing halogen atoms into a deposition and forming a plasma atmosphere of said gas.

On the other hand, for introduction of hydrogen atoms, a starting gas for introduction of hydrogen atoms, for example, $H_2$ or gases such as silanes or/and hydrogenated germanium as mentioned above, may be introduced into a deposition chamber for sputtering, followed by formation of the plasma atmosphere of said gases.

In the present invention, as the starting gas for introduction of halogen atoms, the halides or halo-containing silicon compounds as mentioned above can effectively be used. Otherwise, it is also possible to use effectively as the starting material for formation of the first layer region (G) gaseous or gasifiable substances, including halides containing hydrogen atom as one of the constituents, e.g. hydrogen halide such as HF, HCl, HBr, HI, etc.; halo-substituted hyrogenated silicon such as $SiH_2F_2$, $SiH_2I_2$, $SiH_2Cl_2$, $SiHCl_3$, $SiH_2Br_2$, $SiHBr_3$, etc.; hydrogenated germanium halides such as $GeHF_3$, $GeH_2F_2$, $GeH_3F$, $GeHCl_3$, $GeH_2Cl_2$, $GeH_3Cl$, $GeHBr_3$, $GeH_2Br_2$, $GeH_3Br$, $GeHI_3$, $GeH_2I_2$, $GeH_3I$, etc.; germanium halides such as $GeF_4$, $GeCl_4$, $GeBr_4$, $GeI_4$, $GeF_2$, $GeCl_2$, $GeBr_2$, $GeI_2$, etc.

Among these substances, halides containing hydrogen atoms can preferably be used as the starting material for introduction of halogens, because hydrogen atoms, which are very effective for controlling electrical or photoelectric characteristics, can be introduced into the layer simultaneously with introduction of halogen atoms during formation of the first layer region (G).

For introducing hydrogen atoms structurally into the first layer region (G), other than those as mentioned above, $H_2$ or a hydrogenated silicon such as $SiH_4$, $Si_2H_6$, $Si_3H_8$, $Si_4H_{10}$, etc. together with germanium or a germanium compound for supplying Ge, or a hydrogenated germanium such as $GeH_4$, $Ge_2H_6$, $Ge_3H_8$, $Ge_4H_{10}$, $Ge_5H_{12}$, $Ge_6H_{14}$, $Ge_7H_{16}$, $Ge_8H_{18}$, $Ge_9H_{20}$, etc. together with silicon of a silicon compound for supplying Si can be permitted to co-exist in a deposition chamber, followed by excitation of discharging.

According to a preferred embodiment of the present invention, the amount of hydrogen atoms (H) or the amount of halogen atoms (X) or the sum of the amounts of hydrogen atoms and halogen atoms (H+X) to be contained in the first layer region (G) constituting the photoconductive member to be formed should preferably be 0.01 to 40 atomic %, more preferably 0.05 to 30 atomic %, most preferably 0.1 to 25 atomic %.

For controlling the amount of hydrogen atoms (H) or/and halogen atoms (X) to be contained in the first layer region (G), for example, the substrate temperature or/and the amount of the starting materials used for incorporation of hydrogen atoms (H) or halogen atoms (X) to be introduced into the deposition device system, discharging power, etc. may be controlled.

In the photoconductive member of the present invention, by incorporating a substance (C) for controlling conductivity in the second layer region (S) containing no germanium atom and also, if desired, in the first layer region (G) containing germanium atoms, the conductivities of said layer region (S) and said layer region (G) can be controlled freely as desired.

The above substance (C) contained in the second layer region (S) may be contained in either the whole region or a part of the layer region (S), but it is required that it should be distributed more enriched toward the substrate side. More specifically, the layer region (SPN) containing the substance (C) provided in the second layer region (S) is provided throughout the whole layer region of the second layer region (S) or as an end portion layer region (SE) on the substrate side as a part of the second layer region (S). In the former case of being provided as the whole layer region, it is provided so that its distribution concentration may be increased toward the support side linearly, stepwise or in a curve.

When the distribution concentration C(S) is increased in a curve, it is desirable that the substance (C) for controlling conductivity should be contained in the layer region (S) so that it may be increased monotonously toward the substrate side.

In the case of providing the layer region (SPN) in the second layer region (S) as a part thereof, the distribution state of the substance (C) in the layer region (SPN) is made uniform in the interplanar direction parallel to the surface of the support, but it may be either uniform or ununiform in the layer thickness direction. In this case, in the layer region (SPN), for making the substance (C) distributed ununiformly in the layer thickness direction, it is desirable that the depth profile of the substance (C) should be similar to that in the case of providing it in the whole region of the second layer region (S).

Provision of a layer region (GPN) containing a substance for controlling conductivity (C) in the first layer region (G) can also be done similarly as provision of the layer region (SPN) in the second layer region (S).

In the present invention, when the substance (C) for controlling conductivity is contained in both of the first layer region (G) and the second layer region (S), the substances (C) to be contained in both layer regions may be either of the same kind or of different kinds. However, when the same kind of the substance (C) is contained is both layer regions, it is preferred that the maximum distribution concentration of said substance (C) in the layer thickness direction should be in the second layer region (S), namely internally within the second layer region (S) or at the interface with the first layer region (G). In particular, it is desirable that the aforesaid maximum distribution concentration should be provided at the interface contacting with the first layer region (G) or in the vicinity of said interface.

In the present invention, by incorporating a substance (C) for controlling conductivity in the light receiving layer as described above, the layer region (PN) containing said substance (C) is provided so as to occupy at least a part of the second layer region (S), preferably as an end portion layer region (SE) on the support side of the second layer region (S).

When the layer region (PN) is provided in both sides of the first layer region (G) and the second layer region (S), the substance (C) is incorporated in the light receiving layer so that the maximum distribution concentration $C(G)_{max}$ of the substance (C) for controlling conductivity in the layer region (GPN) and the maximum distribution concentration $C(S)_{max}$ in the layer region (SPN) may satisfy the relation of $C(G)_{max} < C(S)_{max}$.

As a substance (C) for controlling conductivity characteristics, there may be mentioned so called impurities in the field of semiconductors. In the present invention, there may be included p-type impurities giving p-type conductivity characteristics and n-type impurities giving n-type conductivity characteristics to Si or Ge constituting the layer region (PN) containing a substance (C).

More specifically, there may be mentioned as p-type impurities atoms belonging to the group III of the periodic table (Group III atoms), such as B (boron), Al (aluminum), Ga (gallium), In (indium), Tl (thallium), etc., particularly preferably B and Ga.

As n-type impurities, there may be included the atoms belonging to the group V of the periodic table, such as P (phosphorus), As (arsenic), Sb (antimony), Bi (bismuth), etc., particularly preferably P and As.

In the present invention, the content of the substance (C) for controlling conductivity in the layer region (PN) provided in the light receiving layer may be suitably selected depending on the conductivity required for said layer region (PN), or characteristics of other layer regions provided in direct contact with said layer region, the organic relationships such as relation with the characteristics of said other layers or the substrate at the contacted interface, etc. Also, the content of the substance (C) for controlling conductivity is determined suitably with due considerations of the relationships with characteristics of other layer regions provided in direct contact with said layer region or the characteristics at the interface contacting with said other layer regions.

In the present invention, the content of the substance (C) for controlling conductivity contained in the layer region (PN) should preferably be 0.01 to $5 \times 10^4$ atomic ppm, more preferably 0.5 to $1 \times 10^4$ atomic ppm, most preferably 1 to $5 \times 10^3$ atomic ppm.

In the present invention, by providing the layer region (PN) containing the substance (C) for controlling conductivity so as to be in contact with the interface between the first layer region (G) and the second layer region (S) or so that a part of the layer region (PN) may occupy at least a part of the first layer region (G), and making the content of said substance (C) in the layer region (PN) preferably 30 atomic ppm or more, more preferably 50 atomic ppm or more, most preferably 100 atomic ppm or more, for example, in the case when said substance (C) to be incorporated is a p-type impurity as mentioned above, migration of electrons injected from the substrate side into the light receiving layer can be effectively inhibited when the free surface of the light receiving layer is subjected to the charging treatment to ⊕ polarity. On the other hand, when the substance to be incorporated is a n-type impurity, migration of positive holes injected from the substrate side into the light-receiving layer can be effectively inhibited when the free surface of the light-receiving layer is subjected to the charging treatment to ⊖ polarity.

In the case as mentioned above, the layer region (Z) at the portion excluding the above layer region (PN) under the basic constitution of the present invention as described above may contain a substance for controlling conductivity of the other polarity, or a substance for controlling conductivity characteristics of the same polarity may be contained therein in an amount by far smaller than that practically contained in the layer region (PN).

In such a case, the content of the substance (C) for controlling conductivity contained in the above layer region (Z) can be determined adequately as desired depending on the polarity or the content of the substance contained in the layer region (PN), but it is preferably 0.001 to 1000 atomic ppm, more preferably 0.05 to 500 atomic ppm, most preferably 0.1 to 200 atomic ppm.

In the present invention, when the same kind of a substance (C) for controlling conductivity is contained in the layer region (PN) and the layer region (Z), the content in the layer region (Z) should preferably be 30 atomic ppm or less. As different from the cases mentioned above, in the present invention, it is also possible to provide a layer region containing a substance for controlling conductivity having one polarity and a layer region containing a substance for controlling conductivity having the other polarity in direct contact with each other, thus providing a so called depletion layer at said contact region. In short, for example, a layer containing the aforesaid p-type impurity and a layer region containing the aforesaid n-type impurity are provided in the light receiving layer in direct contact with each other to form the so called p-n junction, whereby a depletion layer can be provided.

FIGS. 11 through 24 show typical examples of depth profiles in the layer thickness direction of the substance (C) for controlling conductivity to be contained in the light receiving layer.

In these Figures, the axis of abscissa indicates the distribution concentration of C(PN) of the substance (C) in the layer thickness direction, and the axis of ordinate the layer thickness t of the light receiving layer from the substrate side. $t_0$ shows the interface between the layer region (G) and the layer region (S). Also, the symbols employed in the abscissa and the ordinate have the same meanings as employed in FIG. 2 through 10, unless otherwise noted.

Figure 11:
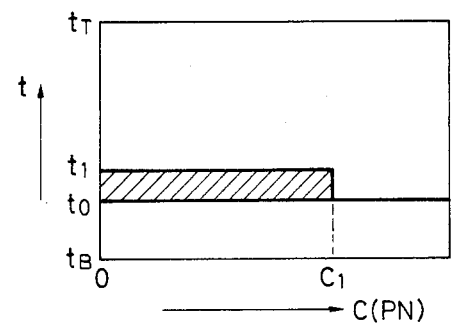
FIGS. 11 through 24 illustrate the depth profiles of impurity atoms.

FIG. 11 shows a typical embodiment of the depth profile of the distribution concentration in the layer thickness direction of the substance (C) for controlling conductivity contained in the light receiving layer. In the embodiment shown in FIG. 11, the substance (C) is not contained in the layer region (G), but only in the layer region (S) at a constant distribution concentration of $C_1$. In short, in the layer region (S), at the end portion layer region between $t_0$ and $t_1$, the substance (C) is contained at a constant distribution concentration of the concentration $C_1$.

Figure 12:
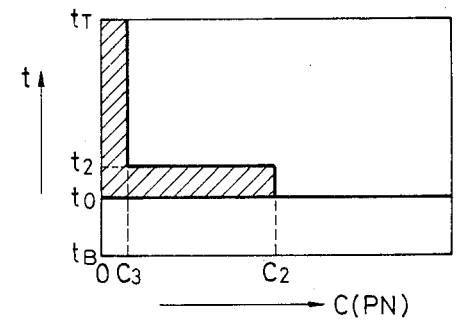

In the embodiment in FIG. 12, while the substance (C) is contained throughout the layer region (S), no substance (C) is contained in the layer region (G). And, the substance (C) is contained in the layer region between $t_0$ and $t_2$ at a constant distribution concentration of $C_2$, while in the layer region between $t_2$ and $t_T$ at a constant concentration of $C_3$ which is by far lower than $C_2$.

By having the substance (C) at such a distribution concentration C(PN) incorporated in the layer region (S), migration of charges injected from the layer region (G) to the layer region (S) can effectively be inhibited, and at the same time photosensitivity and dark resistance can be improved.

Figure 13:
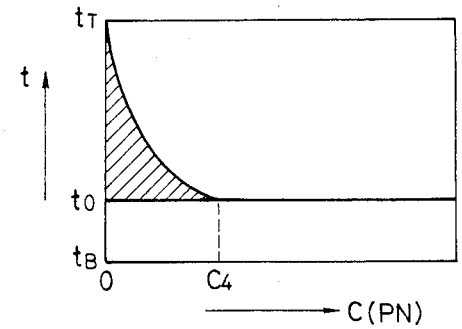

In the embodiment of FIG. 13, the substance (C) is contained throughout the layer region (S), but the substance (C) is contained in a state such that the distribution concentration C(PN) is changed while being reduced monotonously from the concentration $C_4$ at $t_0$ until becoming the concentration 0 at $t_T$. No substance (C) is contained in the layer region (G).

Figure 14:
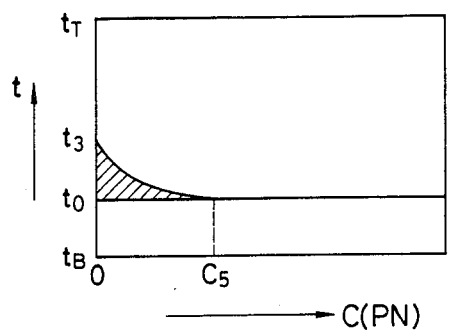
Figure 17:
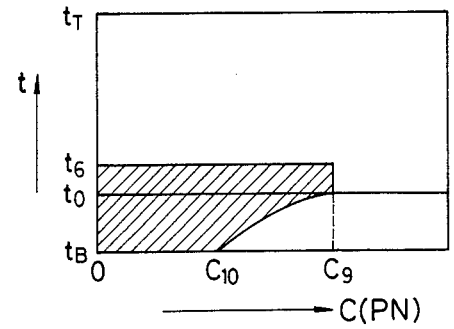
Figure 15:
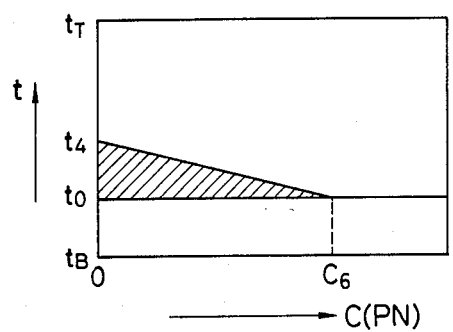
Figure 18:
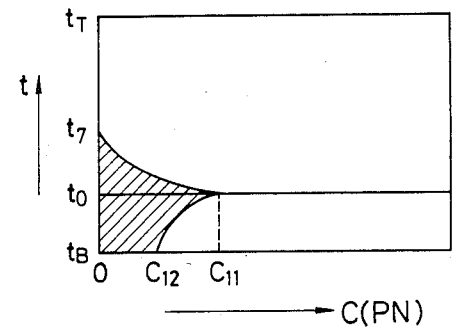
Figure 16:
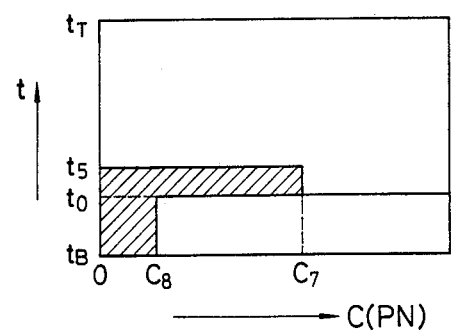
Figure 19:
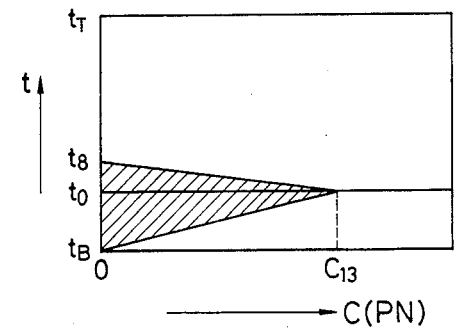
Figure 20:
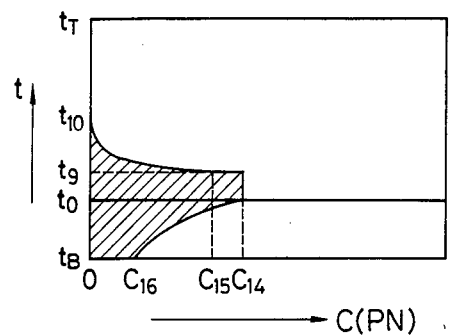
Figure 23:
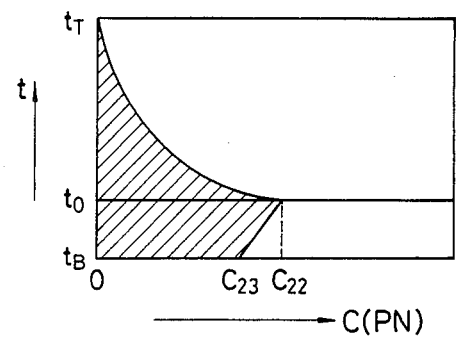
Figure 21:
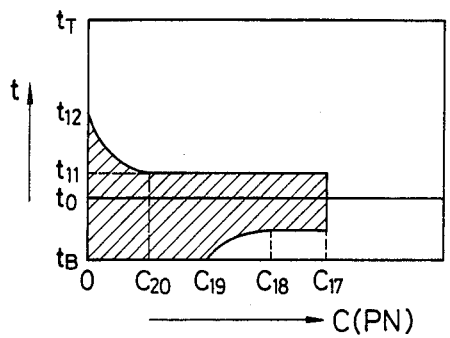

In the case of the embodiments shown in FIG. 14 and FIG. 15, the substance (C) is contained locally in the layer region at the lower end portion of the layer region (S). Thus, in the case of embodiments of FIG. 14 and FIG. 15, the layer region (S) has a layer structure, in which the layer region containing the substance (C) and the layer region containing no substance (C) are laminated in this order from the substrate side.

The difference between the embodiments of FIG. 14 and FIG. 15 is that the distribution concentration C(PN) is reduced from the concentration $C_5$ at the position $t_0$ to the concentration 0 at the position $t_3$ monotonously in a curve between $t_0$ and $t_3$ in the case of FIG. 14, while, in the case of FIG. 15, between $t_0$ and $t_4$, the distribution concentration is reduced continuously and linearly from the concentration $C_6$ at the position $t_0$ to the concentration 0 at the position $t_4$. In both embodiments of FIG. 14 and FIG. 15, no substance (C) is contained in the layer region (G).

In the embodiments shown in FIGS. 16 through 24, the substance (C) for controlling conductivity is contained in both the layer region (G) and the layer region (S).

In the case of FIGS. 16 through FIG. 22, the layer regions (S) commonly possess the two-layer structure, in which the layer region containing the substance (C) and the layer region containing no substance (C) are laminated in this order from the support side. Among them, in the embodiments shown in FIGS. 17 through 21 and FIG. 23, the depth profile of the substance in the layer region (G) is changed in the distribution concentration C(PN) so as to be reduced from the interface position $t_0$ with the second layer region (S) toward the substrate side.

In the embodiments of Examples 23 and 24, the substance (C) is contained in the layer thickness direction over the whole layer region of the light receiving layer. In addition, in the case of FIG. 23, in the layer region (G), the concentration is increased linearly from $t_B$ to $t_0$ from the concentration $C_{23}$ at $t_B$ up to the concentration $C_{22}$ at $t_0$, while in the layer region (S), it is continuously reduced monotonously in a curve from the concentration $C_{22}$ at $t_0$ to the concentration 0 at $t_T$.

Figure 24:
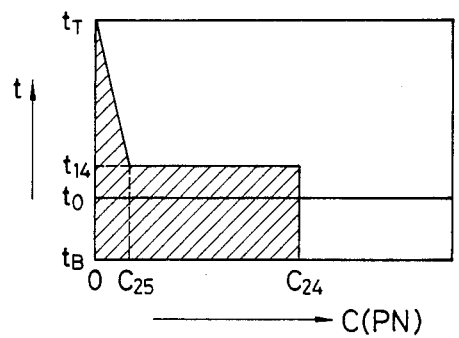
Figure 22:
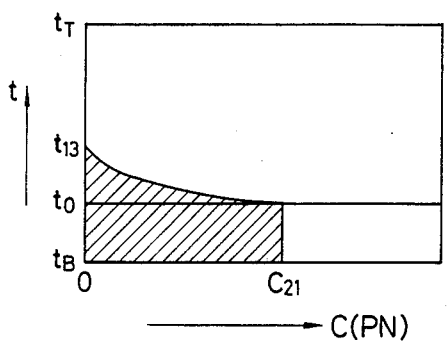

In the case of FIG. 24, in the layer region between $t_B$ and $t_{14}$, the substance (C) is contained at a constant distribution concentration of $C_{24}$, and the concentration is reduced in the layer region between $t_{14}$ and $t_T$ linearly from $C_{25}$ until it reaches 0 at $t_T$.

As described about typical examples of changes of the distribution concentration C(PN) of the substance (C) for controlling conductivity in the light receiving layer in FIGS. 11 through 24, in either one of the embodiments, the substance (C) is contained in the light receiving layer so that the maximum distribution concentration may exist within the second layer region (S).

In the present invention, for formation of the second layer region (S) constituted of a-Si(H,X), the starting materials (I) for formation of the first layer region (G), from which the starting material for the starting gases for supplying Ge is omitted, are used as the starting materials (II) for formation of the second layer region (S), and layer formation can be effected following the same procedure and conditions as in formation of the first layer region (G).

More specifically, in the present invention, formation of the second layer region (S) constituted of a-S(H,X) may be carried out according to the vacuum deposition method utilizing discharging phenomenon such as the glow discharge method, the sputtering method or the ion-plating method. For example, for formation of the second layer region (S) constituted of a-Si(H,X), the basic procedure comprises introducing a starting for Si supply capable of supplying silicon atoms as described above, optionally together with starting gases for introduction of hydrogen atoms (H) or/and halogen atoms (X), into a deposition chamber which can be brought internally to a reduced pressure and exciting glow discharge in said deposition chamber, thereby forming a layer comprising a-Si(H,X) on a desired support placed at a predetermined position. Alternatively, for formation according to the sputtering method, gases for introduction of hydrogen atoms (H) or/and halogen atoms (X) may be introduced into a deposition chamber when effecting sputtering of a target constituted of Si in an inert gas such as Ar, He, etc. or a gas mixture based on these gases.

In the present invention, the amount of hydrogen atoms (H) or the amount of halogen atoms (X) or the sum of the amounts of hydrogen atoms and halogen atoms (H+X) to be contained in the second layer region (S) constituting the light receiving layer to be formed should preferably be 1 to 40 atomic %, more preferably 5 to 30 atomic %, most preferably 5 to 25 atomic %.

For formation of the layer region (PN) containing the aforesaid substance (C) by incorporating a substance (C) for controlling conductivity such as the group III atoms or the group V atoms structurally into the light receiving layer, a starting material for introduction of the group III atoms or a starting material for introduction of the group V atoms may be introduced under gaseous state into a deposition chamber together with the starting materials for formation of the layer region during layer formation. As the starting material which can be used for introduction of the group III atoms, it is desirable to use those which are gaseous at room temperature under atmospheric pressure or can readily be gasified under layer forming conditions. Typical examples of such starting materials for introduction of the group III atoms, there may be included as the compounds for introduction of boron atoms boron hydride such as $B_2H_6$, $B_4H^{10}$, $B_5H_9$, $B_5H_{11}$, $B_6H_{10}$, $B_6H_{12}$, $B_6H_{14}$, etc. and boron halides such as $BF_3$, $BCl_3$, $BBr_3$, etc. Otherwise, it is also possible to use $AlCl_3$, $GaCl_3$, $Ga(CH_3)_3$, $InCl_3$, $TlCl_3$ and the like.

The starting materials which can effectively be used in the present invention for introduction of the group atoms may include, for introduction of phosphorus atom, phosphorus hydride such as $PH_3$, $P_2H_4$, etc., phosphorus halides such as $PH_4I$, $PF_3$, $PF_5$, $PCl_3$, $PCl_5$, $PBr_3$, $PI_3$ and the like. Otherwise, it is also possible to utilize $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_{13}$, $BiBr_3$ and the like effectively as the starting material for introduction of the group V atoms.

In the photoconductive member of the present invention, for the purpose of improvements to higher photosentivity, higher dark resistance and, further, improvement of adhesion between the support and the light receiving layer, nitrogen atoms are contained in the light receiving layer. The nitrogen atoms contained in the light receiving layer may be contained either throughout the whole layer region of the light receiving layer or locally only in a part of the layer region of the light receiving layer.

Nitrogen atoms may be distributed in such a state that the distribution concentration C(N) may be either uniform or ununiform in the layer thickness direction in the light receiving layer.

In the present invention, the layer region (N) containing nitrogen atoms provided in the light receiving layer is provided so as to occupy the whole layer region of the light receiving layer when it is intended to improve primarily photosensitivity and dark resistance. On the other hand, when the main object is to strengthen adhesion between the first layer region (G) and the second layer region (S), it is provided depending on the object so as to occupy the end portion layer region on the support side of the light receiving layer or the region in the vicinity of the interface between the first and the second layer regions.

In the former case, the content of nitrogen atoms to be contained in the layer region (N) is made relatively smaller in order to maintain high photosensitivity, while in the latter case, it should desirably be made relatively larger in order to ensure strengthening of adhesion between the layers.

For the purpose of accomplishing simultaneously both of the former and the latter cases, nitrogen atoms may be distributed at relatively higher concentration on the support side and at relatively lower concentration on the free surface side of the light receiving layer, or alternatively, there may be formed a distribution of nitrogen atoms such that no nitrogen atom is positively contained in the surface layer region on the free surface side of the light receiving region.

Further, when it is intended to increase apparent dark resistance by preventing injection of charges from the first layer region (G) to the second layer region (S), nitrogen atoms may be distributed at higher concentration at the end portion on the support side of the first layer region (G), or nitrogen atoms may be distributed at higher concentration in the vicinity of the interface between the first layer region and the second layer region.

FIGS. 25 through 40 show typical examples of depth profiles of nitrogen atoms in the light receiving layer as a whole. In explanation of these Figures, the symbols have the same meanings as employed in FIGS. 2 through 10, unless otherwise noted.

Figure 25:
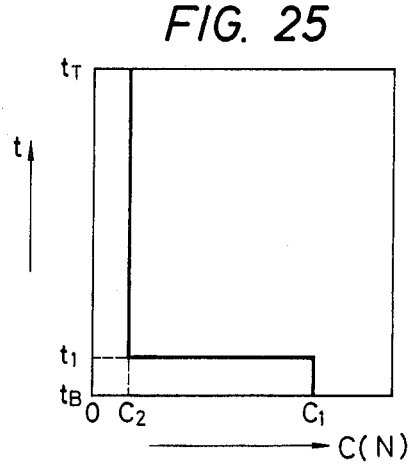
FIGS. 25 through 40 illustrate the depth profiles of nitrogen atoms.

In the embodiment shown in FIG. 25, from the position $t_B$ to the position $t_1$, the distribution concentration of nitrogen atoms is made a constant value of $C_1$, while from the position $t_1$ to the position $t_T$, it is made constantly $C_2$.

Figure 26:
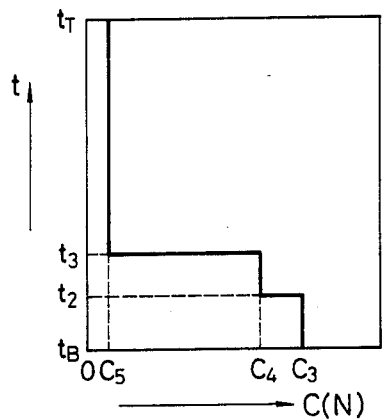

In the embodiment shown in FIG. 26, from the position $t_B$ to the position $t_2$, the distribution concentration of nitrogen atoms is made a constant value of $C_3$, while it is made $C_4$ from the position $t_2$ to the position $t_3$, and $C_5$ from the position $t_3$ to the position $t_T$, thus being decreased in three stages.

Figure 27:
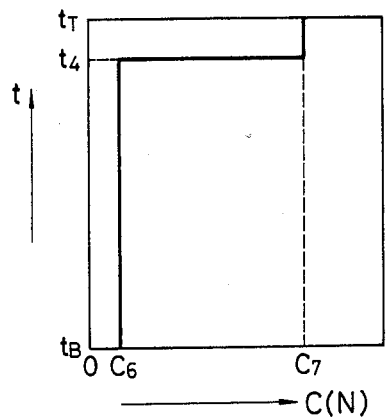

In the embodiment of FIG. 27, the concentration of nitrogen atoms is made $C_6$ from the position $t_B$ to the position $t_4$, while it is made $C_7$ from the position $t_4$ to the position $t_T$.

Figure 28:
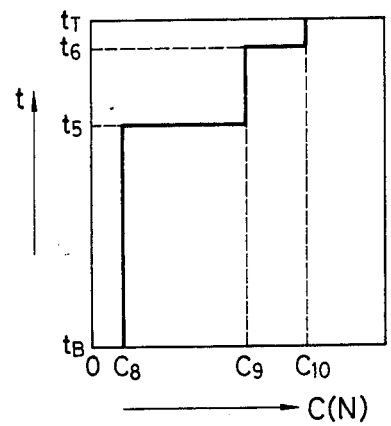

In the embodiment of FIG. 28, from the position $t_B$ to the position $t_5$, the concentration of nitrogen is made $C_8$, while it is made $C_9$ from the position $t_5$ to the position $t_6$, and $C_{10}$ from the position $t_6$ to the position $t_T$. Thus, the distribution concentration of nitrogen atoms is increased in three stages.

Figure 29:
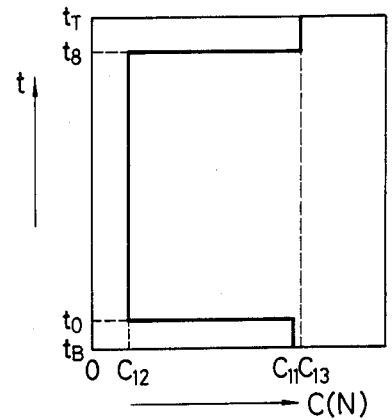

In the embodiment of FIG. 29, the oxygen atom concentration is made $C_{11}$ from the position $t_B$ to the position $t_7$, $C_{12}$ from the position $t_7$ to the position $t_8$ and $C_{13}$ from the position $t_8$ to the portion $t_T$. The concentration of nitrogen is made higher on the substrate side and on the free surface side.

Figure 30:
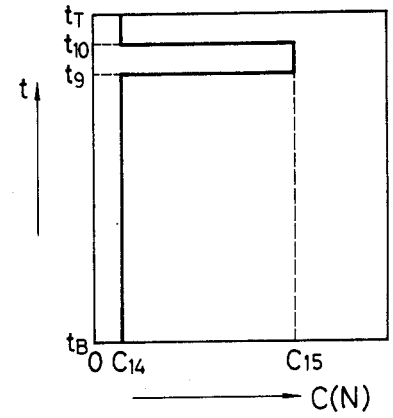

In the embodiment of FIG. 30, the nitrogen atom distribution concentration is made $C_{14}$ from the position $t_B$ to the position $t_9$, $C_{15}$ from the position $t_9$ to the position $t_{19}$ and $C_{14}$ from the position $t_{10}$ to the position $t_T$.

Figure 31:
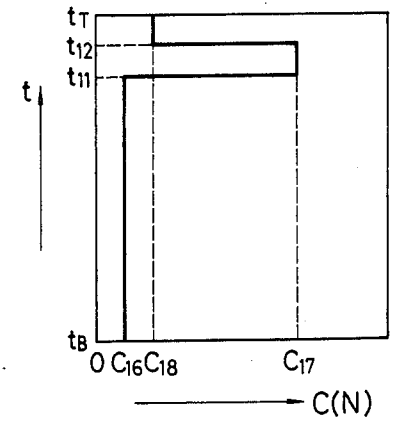

In the embodiment shown in FIG. 31, from the position $t_B$ to the position $t_{11}$, the nitrogen atom distribution concentration is made $C_{16}$, while it is increased stepwise up to $C_{17}$ from the position $t_{11}$ to the position $t_{12}$ and decreased to $C_{17}$ from the position $t_{12}$ to the position $t_T$.

Figure 32:
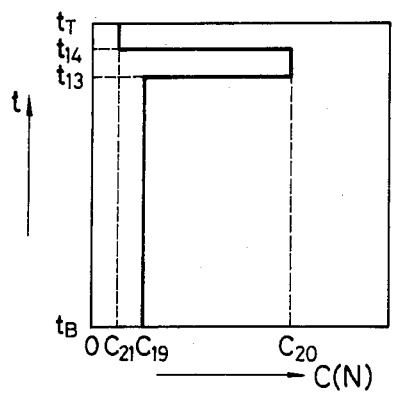

In the embodiment of FIG. 32. from the position $t_B$ to the position $t_{13}$, the nitrogen atom concentration is made $C_{19}$, while it is increased stepwise up to $C_{20}$ from the position $t_{13}$ to the position $t_{14}$ and the concentration is made $C_{21}$, which is lower than the initial nitrogen atom concentration, from the position $t_{14}$ to the position $t_T$.

Figure 33:
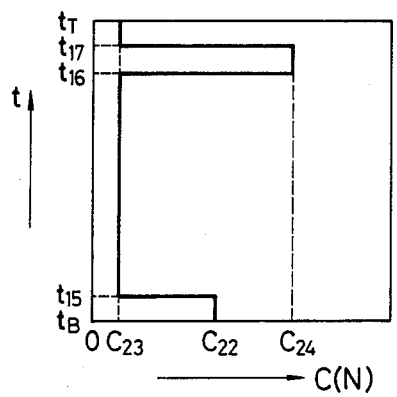

In the embodiment shown in FIG. 33, the nitrogen atom concentration is made $C_{22}$ from the position $t_B$ to the position $t_{15}$, decreased to $C_{23}$ from the position $t_{15}$ to the position $t_{16}$, increased stepwise up to $C_{24}$ from the position $t_{16}$ to the position $t_{17}$ and decreased to $C_{23}$ from the position $t_{18}$ to the position $t_T$.

Figure 34:
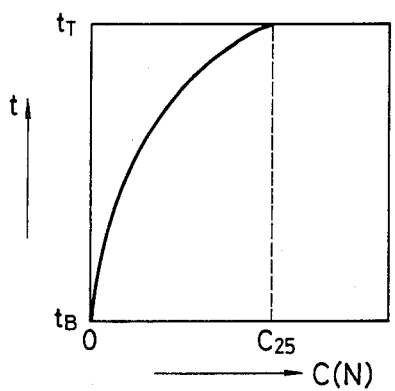
Figure 37:
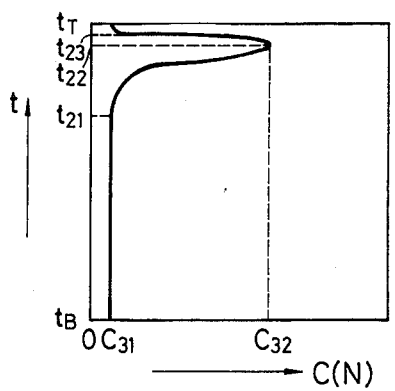
Figure 38:
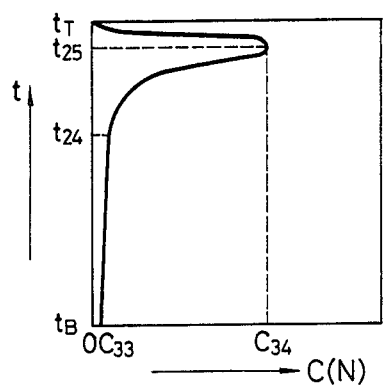
Figure 39:
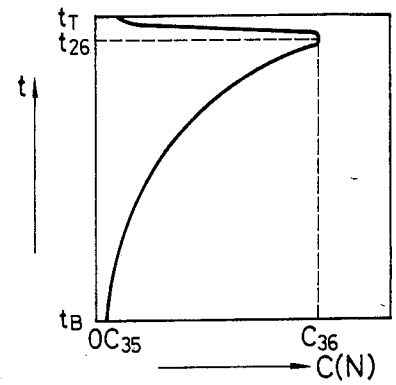
Figure 40:
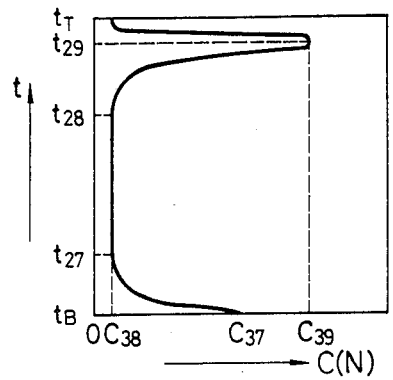

In the embodiment shown in FIG. 34, the distributed concentration C(N) of nitrogen atoms is continuously increased monotonously from the concentration 0 to $C_{25}$ from the position $t_B$ to the position $t_T$.

Figure 35:
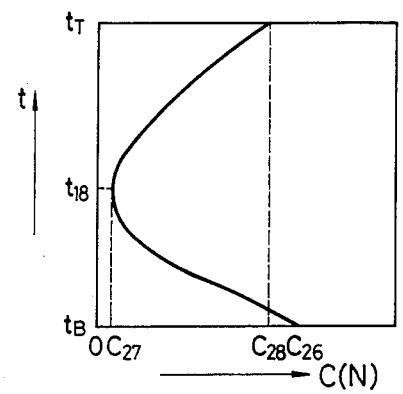

In the embodiment shown in FIG. 35, the distribution concentration C(N) of nitrogen atoms is made $C_{26}$ at the position $t_B$, which is then continuously decreased monotonously to the position $t_{18}$, whereat it becomes $C_{27}$. Between the position $t_{18}$ to the position $t_T$, the distribution concentration C(N) of nitrogen atoms is continuously increased monotonously until it becomes $C_{28}$ at the position $t_T$.

Figure 36:
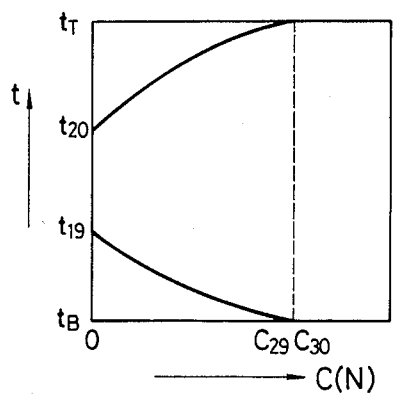

In the embodiment of FIG. 36, the depth profile is relatively similar to the embodiment of FIG. 35, but differs in that no nitrogen atoms is contained between the position $t_{19}$ and the position $t_{20}$.

Between the position $t_B$ and the position $t_{19}$, the concentration is decreased continuously and monotonously from the concentration $C_{29}$ to the concentration 0 at the chlorine, bromine and iodine; interhalogen compounds such as BrF, ClF, ClF$_3$, BrF$_5$, BrF$_3$, IF$_3$, IF$_7$, ICl, IBr, etc; and hydrogen halide such as HF, HCl, HBr, HI, etc.

The starting gas for introduction of carbon atoms to be used in formation of the second layer (II) may include compounds containing C and H as constituent atoms such as saturated hydrocarbons containing 1 to 4 carbon atoms, ethylenic hydrocarbons having 2 to 4 carbon atoms, acetylenic hydrocarbons having 2 to 3 carbons atoms.

More specifically, there may be included, as saturated hydrocarbons, methane (CH$_4$), ethane (C$_2$H$_6$), propane (C$_3$H$_8$), n-butane (n-C$_4$H$_{10}$), and pentane (C$_5$H$_{12}$); as ethylenic hydrocarbons, ethylene (C$_2$H$_4$), propylene (C$_3$H$_6$), butene-1 (C$_4$H$_8$), butene-2 (C$_4$H$_8$), isobutylene (C$_4$H$_8$), and pentene (C$_5$H$_{10}$); as acetylenic hydrocarbons, acetylene (C$_2$H$_2$), methyl acetylene (C$_3$H$_4$), and butyne (C$_4$H$_6$).

Otherwise, it is also possible to use halo-substituted paraffinic hydrocarbons such as CF$_4$, CCl$_4$, CBr$_4$, CHF$_3$, CH$_2$F$_2$, CH$_3$F, CH$_3$Cl, CH$_3$Br, CH$_3$I, C$_2$H$_5$Cl, etc.; silane derivatives, including alkyl silanes such as Si(CH$_3$)$_4$, Si(C$_2$H$_5$)$_4$, etc. and halo-containing alkyl silanes such as SiCl(CH$_3$)$_3$, SiCl$_2$(CH$_3$)$_2$, SiCl$_3$CH$_3$, etc. as effective ones.

The starting material effectively used as the starting gas for introduction of oxygen atoms (O) to be used during formation of the second layer (II), it is possible to use compounds containing O as constituent atom or compounds containing N and O as constituent atoms, such as oxygen (O$_2$), ozone (O$_3$), nitrogen monooxide (NO), nitrogen dioxide (NO$_2$), dinitrogen monooxide (N$_2$O), dinitrogen trioxide (N$_2$O$_3$), dinitrogen tetraoxide (N$_2$O$_4$), dinitrogen pentaoxide (N$_2$O$_5$), nitrogen trioxide, and lower siloxanes containing silicon atoms (Si), oxygen atoms (O) and hydrogen atoms (H) as constituent atoms such as disiloxane (H$_3$SiOSiH$_3$), trisiloxane (H$_3$SiOSiH$_2$OSiH$_3$), and the like.

The starting materials for formation of the above second amorphous layer (II) may be selected and employed as desired in formation of the second amorphous layer (II) so that silicon atoms, carbon atoms or/and oxygen atoms, optionally together with hydrogen atoms or halogen atoms may be contained at a predetermined composition ratio in the second amorphous layer (II) to be formed.

For example, Si(CH$_3$)$_4$ as the material capable of incorporating easily silicon atoms, carbon atoms and hydrogen atoms and forming a second amorphous layer (II) having desired characteristics and SiHCl$_3$, SiCl$_4$, SiH$_2$Cl$_2$ or SiH$_3$Cl as the material for incorporating halogen atoms may be mixed at a predetermined mixing ratio and introduced under gaseous state into a device for formation of a second amorphous layer (II), followed by excitation of glow discharge, whereby there can be formed a second amorphous layer (II) comprising a-(Si$_x$C$_{1-x}$)(Cl+H)$_{1-y}$.

In the present invention, as the diluting gas to be used in formation of the second layer (II) by the glow discharge method or the sputtering method, there may be included the so called rare gases such as He, Ne and Ar as preferable ones.

The second amorphous layer (II) in the present invention should be carefully formed so that the required characteristics may be given exactly as desired.

That is, the above material containing Si, C or/and O, optionally together with H or/and X can take various forms from crystalline to amorphous, electrical properties from conductive through semi-conductive to insulating and photoconductive properties from photoconductive to non-photoconductive depending on the preparation conditions. Therefore, in the present invention, the preparation conditions are strictly selected as desired so that there may be formed the amorphous material for constitution of the second layer (II) having desired characteristics depending on the purpose. For example, when the second amorphous layer (II) is to be provided primarily for the purpose of improvement of dielectric strength, the amorphous material for constitution of the second layer is prepared as an amorphous material having marked electric insulating behaviours under the use environment.

Alternatively, when the primary purpose for provision of the second amorphous layer (II) is improvement of continuous repeated use characteristics or environmental use characteristics, the degree of the above electric insulating property may be alleviated to some extent and the aforesaid amorphous material may be prepared as an amorphous material having sensitivity to some extent to the light irradiated.

In forming the second amorphous layer (II) on the surface of the first amorphous layer (I), the substrate temperature during layer formation is an important factor having influences on the structure and the characteristics of the layer to be formed, and it is desired in the present invention to control severely the substrate temperature during layer formation so that the second amorphous layer (II) having intended characteristics may be prepared as desired.

As the substrate temperature in forming the second amorphous layer (II) for accomplishing effectively the objects in the present invention, there may be selected suitably the optimum temperature range in conformity with the method for forming the second amorphous layer (II) in carrying out formation of the second amorphous layer (II), preferably 20° to 400° C., more preferably 50° to 350° C., most preferably 100° to 300° C.

For formation of the second layer (II), the glow discharge method or the sputtering method may be advantageously adopted, because severe control of the composition ratio of atoms constituting the layer or control of layer thickness can be conducted with relative ease as compared with other methods. In case when the amorphous material constituting the second layer (II) is to be formed according to these layer forming methods, the discharging power during layer formation is one of important factors influencing the characteristics of the above amorphous material for constitution of the second layer (II), to be prepared, similarly as the aforesaid substrate temperature.

The discharging power condition for preparing effectively the amorphous material for constitution of the second layer (II) having characteristics for accomplishing the objects of the present invention with good productivity may preferably be 10 to 300 W, more preferably 20 to 250 W, most preferably 50 to 200 W.

The gas pressure in a deposition chamber may preferably be 0.01 to 1 Torr, more preferably 0.1 to 0.5 Torr.

In the present invention, the above numerical ranges may be mentioned as preferable numerical ranges for the substrate temperature, discharging power for preparation of the second amorphous layer (II) However, these factors for layer formation should not be determined separately independently of each other, but it is desirable that the optimum values of respective layer forming factors should be determined based on mutual organic relationships so that the second layer (II) having desired characteristics may be formed.

The respective contents of carbon atoms, oxygen atoms or both thereof in the second layer (II) in the photoconductive member of the present invention are important factors for obtaining the desired characteristics to accomplish the objects of the present invention, similarly as the conditions for preparation of the second amorphous layer (II).

The respective contents of carbon atoms, oxygen atoms or the sum of both atoms contained in the second layer (II) in the present invention are determined as desired depending on the amorphous material constituting the second layer (II) and its characteristics.

More specifically, the amorphous material represented by the above formula a-$(Si_xC_{1-x})_y(H,X)_{1-y}$ may be broadly classified into an amorphous material constituted of silicon atoms and carbon atoms (hereinafter written as "a-$Si_aC_{1-a}$", where $0<a<1$), an amorphous material constituted of silicon atoms, carbons atoms and hydrogen atoms (hereinafter writeen as a-$(Si_bC_{1-b})_cH_{1-c}$, where $0<b, c<1$) and an amorphous material constituted of silicon atoms, carbon atoms, halogen atoms and optionally hydrogen atoms (hereinafter written as "a-$(Si_dC_{1-d})_e(H,X)_{1-e}$", where $0<d, e<1$).

In the present invention, when the second layer (II) is to be constituted of a-$Si_aC_{1-a}$, the content of carbon atoms (C) in the second layer (II) may generally be $1\times10^{-3}$ to 90 atomic %, more preferably 1 to 80 atomic %, most preferably 10 to 75 atomic namely in terms of representation by a, a being preferably 0.1 to 0.99999, more preferably 0.2 to 0.99, most preferably 0.25 to 0.9.

In the present invention, when the second layer (II) is to be constituted of a-$(Si_bC_{1-b})_cH_{1-c}$, the content of carbon atoms (C) may preferably be $1\times10^{-3}$ to 90 atomic %, more preferably 1 to 90 atomic %, most preferably 10 to 80 atomic %, the content of hydrogen atoms preferably 1 to 40 atomic more preferably 2 to 35 atomic %, most preferably 5 to 30 atomic %, and the photoconductive member formed when the hydrogen content is within these ranges can be sufficiently applicable as excellent one in practical aspect.

That is, in terms of the representation by the above a-$(Si_bC_{1-b})_cH_{1-c}$, b should preferably be 0.1 to 0.99999, more preferably 0.1 to 0.99, most preferably 0.15 to 0.9, and c preferably 0.6 to 0.99, more preferably 0.65 to 0.98, most preferably 0.7 to 0.95.

When the second layer (II) to be constituted of a-$(Si_dC_{1-d})_e(H,X)_{1-e}$, the content of carbon atoms may preferably be $1\times10^{-3}$ to 90 atomic %, more preferably 1 to 90 atomic %, most preferably 10 to 80 atomic %, the content of halogen atoms preferably 1 to 20 atomic %, more preferably 1 to 18 atomic %, most preferably 2 to 15 atomic %. When the content of halogen atoms is within these ranges, the photoconductive member prepared is sufficiently applicable in practical aspect. The content of hydrogen atoms optionally contained may preferably be 19 atomic % or less, more preferably 13 atomic % or less.

That is in terms of representation by d and e in the above a-$(Si_dC_{1-d})_e(H,X)_{1-e}$, d should preferably be 0.1 to 0.99999, more preferably 0.1 to 0.99, most preferably 0.15 to 0.9, and e preferably 0.8 to 0.99, more preferably 0.82-0.99, most preferably 0.85 to 0.98.

The amorphous material represented by the above formula a-$(Si_xO_{1-x})_y(H,X)_{1-y}$ may be broadly classified into an amorphous material constituted of silicon atoms and oxygen atoms (hereinafter written as "a-$Si_aO_{1-a}$", where $0<a<1$), an amorphous material constituted of silicon atoms, oxygen atoms and hydrogen atoms (hereinafter written as a-$(Si_bO_{1-b})_cH_{1-c}$, where $0<b, c<1$) and an amorphous material constituted of silicon atoms, oxygen atoms, halogen atoms and optionally hydrogen atoms (hereinafter written as "a-$(Si_dO_{1-d})_e(H,X)_{1-e}$", where $0<d, e<1$).

In the present invention, when the second layer (II) is to be constituted of a-$Si_aO_{1-a}$, the content of oxygen atoms in the second layer (II) may be, in terms of representation by a in the above a-$Si_aO_{1-a}$, preferably 0.33 to 0.99999, more preferably 0.5 to 0.99, most preferably 0.6 to 0.9.

In the present invention, when the second layer (II) is to be constituted of a-$(Si_bO_{1-b})_cH_{1-c}$, the content of oxygen atoms may be in terms of the representation by the above a-$(Si_bO_{1-b})_cH_{1-c}$, b preferably 0.33 to 0.99999, more preferably 0.5 to 0.99, most preferably 0.6 to 9.9, and c preferably 0.6 to 0.99, more preferably 0.65 to 0.98, most preferably 0.7 to 0.95.

When the second layer (II) is to be constituted of a-$(Si_dO_{1-d})_e(H,X)_{1-e}$, the content of oxygen atoms may be in terms of representation by d and e in the above a-$(Si_dN_{1-d})_e(H,X)_{1-e}$, d preferably 0.33 to 0.99999, more preferably 0.5 to 0.99, most preferably 0.6 to 0.9, and e preferably 0.8 to 0.99, more preferably 0.82 to 0.99, most preferably 0.85 to 0.98.

The range of the numerical value of layer thickness of the second amorphous layer (II) should desirably be determined depending on the intended purpose so as to effectively accomplish the objects of the present invention. The layer thickness of the second amorhpus layer (II) is also required to be determined as desired suitably with due considerations on the contents of carbon atoms or/and oxygen atoms, the relationship with the layer thickness of the first layer (I), as well as other organic relationships with the characteristics required for respective layer regions.

In addition, it is also desirable to have considerations from economical point of view such as productivity or capability of mass production.

The second amorphous layer (II) in the present invention is desired to have a layer thickness preferably of 0.003 to 30$\mu$, more preferably 0.004 to 20$\mu$, most preferably 0.005 to 10$\mu$.

The photoconductive member of the present invention designed to have such a layer constitution as described in detail above can solve all of the various problems as mentioned above and exhibit very excellent electrical, optical, photoconductive characteristics, dielectric strength, and use environment characteristics.

In particular, the photoconductive member of the present invention prevents sufficiently occurrence of light interference even with the use of light capable of interference, and is free from any influence from residual potential on image formation when applied for an image forming member for electrophotography, with its electrical characteristics being stable with high sensitivity, having a high SN ratio as well as excellent light fatigue resistance and excellent repeated use characteristic and being capable of providing images of high quality of high density, clear halftone and high resolution repeatedly and stably.

Further, the photoconductive member of the present invention is high in photosensitivity over all the visible quired to be linear, but the flow rate may be controlled according to a change rate curve previously designed by means of, for example, a microcomputer to give a desired content curve.

In case when the layer region (N) is formed by the sputtering method, formation of a desired depth profile of nitrogen atoms in the direction of layer thickness by varying the distribution concentration C(N) of nitrogen atoms in the direction of layer thickness may be performed first similarly as in case of the glow discharge method by employing a starting material for introduction of nitrogen atoms under gaseous state and varying suitably as desired the gas flow rate of said gas when introduced into the deposition chamber.

Secondly, formation of such a depth profile can also be achieved by previously changing the composition of a target for sputtering. For example, when a target comprising a mixture of Si and $Si_3N_4$ is to be used, the mixing ratio of Si to $Si_3N_4$ may be varied in the direction of layer thickness of the target.

The support to be used in the present invention may be either electroconductive or insulating. As the electroconductive material, there may be mentioned metals such as NiCr, stainless steel, Al, Cr, Mo, Au, Nb, Ta, V, Ti, Pt, Pd etc. or alloys thereof.

As insulating supports, there may conventionally be used films or sheets of synthetic resins, including polyester, polyethylene, polycarbonate, cellulose acetate, polypropylene, polyvinyl chloride, polyvinylidene chloride, polystyrene, polyamide, etc., glasses, ceramics, papers and so on. These insulating supports should preferably have at least one surface subjected to electroconductive treatment, and it is desirable to provide other layers on the side at which said electroconductive treatment has been applied.

For example, electroconductive treatment of a glass can be effected by providing a thin film of NiCr, Al, Cr, Mo, Au, Ir, Nb, Ta, V, Ti, Pt, Pd, $In_2O_3$, $SnO_2$, ITO ($In_2O_3+SnO_2$) thereon. Alternatively, a synthetic resin film such as polyester film can be subjected to the electroconductive treatment on its surface by vacuum vapor deposition, electron-beam deposition or sputtering of a metal such as NiCr, Al, Ag, Pb, Zn, Ni, Au, Cr, Mo, Ir, Nb, Ta, V, Ti, Pt, etc. or by laminating treatment with said metal, thereby imparting electroconductivity to the surface. The support may be shaped in any form such as cylinders, belts, plates or others, and its form may be determined as desired. For example, when the photoconductive member 100 in FIG. 1 is to be used as an image forming member for electrophotography, it may desirably be formed into an endless belt or a cylinder for use in continuous high speed copying. The support may have a thickness, which is conveniently determined so that a photoconductive member as desired may be formed. When the photoconductive member is required to have a flexibility, the support is made as thin as possible, so far as the function of a support can be exhibited. However, in such a case, the thickness is preferably 10 μ or more from the points of fabrication and handling of the support as well as its mechanical strength.

Figure 41:
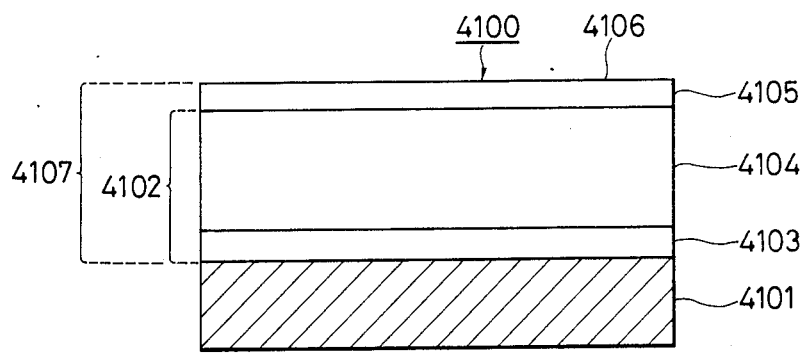

FIG. 41 shows a schematic illustration for explanation of the layer structure of the second embodiment of the photoconductive member of the present invention.

The photoconductive member 4100 shown in FIG. 41 has a light receiving layer 4107 consisting of a first layer (I) 4102 and a second layer (II) 4105 on a substrate 4101 for photoconductive member, said light receiving layer 4107 having a free surface 4106 on one end surface.

The photoconductive member 4100 shown in FIG. 41 is the same as the photoconductive member 100 shown in FIG. 1 except for having a second layer (II) 4105 on the first layer (I) 4102, and all the descriptions are applicable for description of the portion excluding the second layer (II) 4105. That is, the support 4101 corresponds to the substrate 101, the first layer (I) to the light receiving layer 102, the first layer region (G) 4103 and the second layer region (S) 4104 correspond, respectively, to the first layer region (G) 103 and the second layer region (S) 104.

In the photoconductive member shown in FIG. 4100, the second layer (II) 4105 formed on the first layer (I) has a free surface and is provided for accomplishing the objects of the present invention primarily in humidity resistance, continuous repeated use characteristic, dielectric strength use environment characteristic and durability.

The second layer (II) is constituted of an amorphous material containing silicon atoms (Si) and at least one of carbon atoms (C) and oxygen atoms (O), optionally together with at least one of hydrogen atoms (H) and halogen atoms (X).

The above amorphous material constituting the second layer (II) may include an amorphous material containing silicon atoms (Si) and carbon atoms (C), optionally together with hydrogen atoms (H) or/and halogen atoms (X) (hereinafter written as "a-$(Si_xC_{1-x})_y(H,X)_{1-y}$", wherein $0<x$, $y<1$) and an amorphous material containing silicon atoms (Si) and oxygen atoms (O), optionally together with hydrogen atoms (H) or/and halogen atoms (X) (hereinafter written as "a-$(Si_xO_{1-x})_y(H,X)_{1-y}$", wherein $0<x$, $y<1$).

Formation of the second amorphous layer (II) constituted of these amorphous materials may be performed according to the glow discharge method, the sputtering method, the ion implantation method, the ion plating method, the electron beam method, etc. These preparation methods may be suitably selected depending on various factors such as the preparation conditions, the extent of the load for capital investment for installations, the production scale, the desirable characteristics required for the photoconductive member to be prepared, etc. For the advantages of relatively easy control of the preparation conditions for preparing photoconductive members having desired characteristics and easy introduction of carbon atoms, oxygen atoms, hydrogen atoms and halogen atoms together with silicon atoms (Si) into the second amorphous layer (II) to be prepared, there may preferably be employed the glow discharge method or the sputtering method.

Further, in the present invention, the glow discharge method and the sputtering method may be used in combination in the same device system to form the second layer (II).

In the present invention, suitable halogen atoms (X) contained in the second layer are F, Cl, Br and I, particularly preferably F and Cl.

For formation of the second amorphous layer (II) according to the glow discharge method, starting gases for formation of the second layer (II), which may optionally be mixed with a diluting gas at a predetermined mixing ratio, may be introduced into a deposition chamber for vacuum deposition in which a support is placed, and glow discharge is excited in said deposition chamber to form the gases introduced into a gas plasma, thereby depositing an amorphous material constituting the aforesaid second layer (II) on the first amorphous layer (II) already formed on the support.

In the present invention, the starting gases which can be effectively used for formation of the second layer (II) may include gaseous or readily gasifiable substances at normal temperature and normal pressure.

In the present invention, as starting gases for formation of $a\text{-}(Si_xC_{1-x})_y(H,X)_{1-y}$, there may be employed most of substances containing at least one of silicon atoms (Si), carbon atoms (C), hydrogen atoms (H) and halogen atoms (X) as constituent atoms which are gaseous or gasified substances of readily gasifiable ones.

When a starting gas containing Si as one of the constituent atoms of Si, C, H and X, there may be employed, for example, a mixture of a starting gas containing Si as constituent atom, a starting gas containing C as constituent atom and optionally a starting gas containing H as constituent atom or/and a starting gas containing X as constituent atom at a desired mixing ratio, or a mixture of a starting gas containing Si as constituent atom and a starting gas containing C and H or/and a starting gas containing X as constituent atoms as constituent atoms also at a desired ratio, or a mixture of a starting gas containing Si as constituent atom and a starting gas containing three constituent atoms of Si, C and H or a starting gas containing three constituent atoms of Si, C and X.

Alternatively, it is also possible to use a mixture of a starting gas containing Si and H as constituent atoms with a starting gas containing C as constituent atom or a mixture of a starting gas containing Si and X as constituent atoms and a starting gas containing C as constituent atom.

In the present invention, as starting gases for formation of $a\text{-}(Si_xO_{1-x})_y(H,X)_{1-y}$, there may be employed most of substances containing at least one of silicon atoms (Si), oxygen atoms (O), hydrogen atoms (H) and halogen atoms (X) as constituent atoms which are gaseous or gasified substances of readily gasifiable ones.

When a starting gas containing Si as one of the constituent atoms of Si, O, H and X, there may be employed, for example, a mixture of a starting gas containing Si as constituent atom, a starting gas containing O as constituent atom and optionally a starting gas containing H as constituent atom or/and a starting gas containing X as constituent atom at a desired mixing ratio, or a mixture of a starting gas containing Si as constituent atom and a starting gas containing O and H or/and a starting gas containing X as constituent atoms as constituent atoms also at a desired ratio, or a mixture of a starting gas containing Si as constituent atom and a starting gas containing three constituent atoms of Si, O and H or a starting gas containing three constituent atoms of Si, O and X.

Alternatively, it is also possible to use a mixture of a starting gas containing Si and H as constituent atoms with a starting gas containing O as constituent atom or a mixture of a starting gas containing Si and X as constituent atoms and a starting gas containing O as constituent atom.

Formation of the second layer (II) according to the sputtering method may be practiced as follows.

In the first place, when a target constituted of Si is subjected to sputtering in an atmosphere of an inert gas such as Ar, He, etc. or a gas mixture based on these gases, a starting gas for introduction of carbon atoms (C) or/and a starting gas for introduction of oxygen atoms (O) may be introduced, optionally together with starting gases for introduction of hydrogen atoms (H) or/and halogen atoms (X), into a vacuum deposition chamber for carrying out sputtering.

In the second place, carbon atoms (C) or/and oxygen atoms (O) can be introduced into the second layer (II) formed by use of a target constituted of graphite or/and $SiO_2$ or two sheets of targets of a target constituted of Si and a target constituted of graphite or/and $SiO_2$, or a target constituted of Si, graphite or/and $SiO_2$. In this case, if the starting gas for introduction of carbon atoms (C) or/and the starting gas for introduction of oxygen atoms (O) as mentioned above are used in combination, the amount of carbon atoms (C) or/and oxygen atoms (O) to be incorporated in the second layer (II) can easily be controlled as desired by controlling the flow rate thereof.

The amount of carbon atoms (C) or/and oxygen atoms (O) to be incorporated into the second layer (II) can be controlled as desired by controlling the flow rate of the starting gas for introduction of carbon atoms (C) or/and the starting gas for introduction of oxygen atoms (O), adjusting the ratio of carbon atoms (C) or/and oxygen atoms (O) in the target for introduction of carbon atoms or/and oxygen atoms during preparation of the target, or performing both of these.

The starting gas for supplying Si to be used in the present invention may include gaseous or gasifiable hydrogenated silicons (silanes) such as $SiH_4$, $Si_2H_6$, $Si_3H_8$, $Si_4H_{10}$ and others as effective materials. In particular, $SiH_4$ and $Si_2H_6$ are preferred with respect to easy handling during layer formation and efficiency for supplying Si.

By use of these starting materials, H can also be incorporated together with Si in the second layer (II) formed by adequate choice of the layer forming conditions.

As the starting materials effectively used for supplying Si, in addition to hydrogenated silicon as mentioned above, there may be included silicon compounds containing halogen atoms (X), namely the so called silane derivatives substituted with halogen atoms, including halogenated silicon such as $SiF_4$, $Si_2F_6$, $SiCl_4$, $SiBr_4$, $SiCl_3Br$, $SiCl_2Br_2$, $SiClBr_3$, $SiCl_3I$, etc., as preferable ones.

Further, halides containing hydrogen atom as one of the constituents, which are gaseous or gasifiable, such as halo-substituted hydrogenated silicon, including $SiH_2F_2$, $SiH_2I_2$, $SiH_2Cl_2$, $SiHCl_3$, $SiH_3Br$, $SiH_2Br_2$, $SiHBr_3$, etc. may also be mentioned as the effective starting materials for supplying Si for formation of the second layer (II).

Also, in the case of employing a silicon compound containing halogen atoms (X), X can be introduced together with Si in the layer formed by suitable choice of the layer forming conditions as mentioned above.

Among the starting materials as described above, the halogenated silicon compounds containing hydrogen atoms may be used as suitable starting materials for introduction of halogen atoms (X), since hydrogen atoms (H) very effective for controlling electrical or photoelectric characteristics can be introduced simultaneously with introduction of halogen atoms during formation of the second layer (II).

Effective starting materials to be used as the starting gases for introduction of halogen atoms (X) in formation of the second layer (II) in the present invention, there may be included, in addition to those as mentioned above, for example, halogen gases such as fluorine, light region, particularly excellent in matching to semiconductor laser, and rapid in response to light.

An example of the process for producing the photoconductive member of this invention is to be briefly described below.

Figure 42:
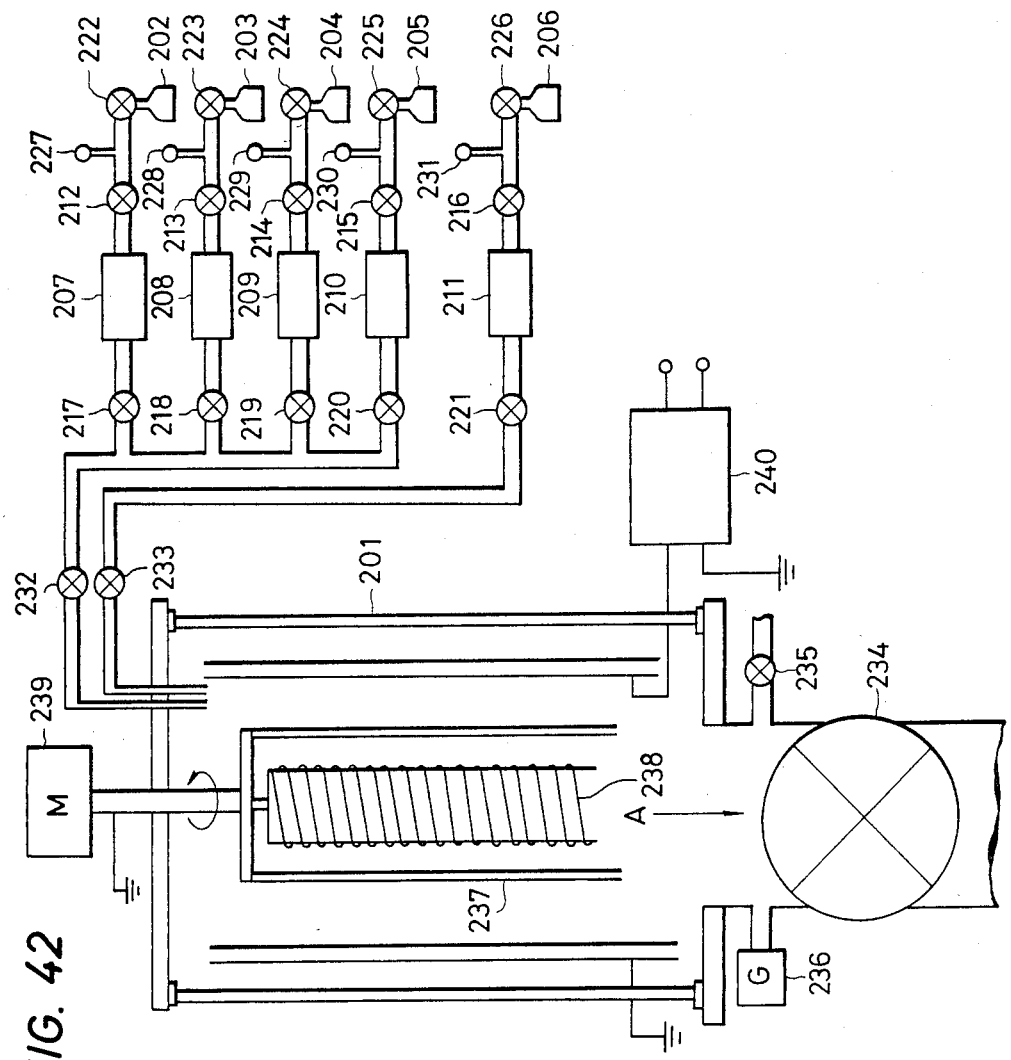
FIG. 42 is a schematic illustration of the device used in the present invention.

FIG. 42 shows one example of a device for producing a photoconductive member.

In the gas bombs 202 to 206, there are hermetically contained starting gases for formation of the photosensitive member of the present invention. For example, 202 is a bomb containing $SiF_4$ gas diluted with He (purity: 99.999%, hereinafter abbreviated as $SiF_4$/He), 203 is a bomb containing $GeF_4$ gas diluted with He (purity: 99.999%, hereinafter abbreviated as $GeF_4$/He), 204 is a $NH_3$ gas bomb (purity: 99.99%, hereinafter abbreviated as $NH_3$), 205 is a bomb containing $B_2H_6$ gas diluted with He (purity: 99.999%, hereinafter abbreviated as $B_2H_6$/He) and 206 is a bomb containing $H_2$ gas (purity: 99.999%).

For allowing these gases to flow into the reaction chamber 201, on confirmation of the valves 222-226 of the gas bombs 202-206 and the leak valve 235 to be closed, and the inflow valves 212-216, the outflow valves 217-221 and the auxiliary valves 232, 233 to be opened, the main valve 234 is first opened to evacuate the reaction chamber 201 and the gas pipelines. As the next step, when the reading on the vacuum indicator 236 becomes $5 \times 10^{-6}$ Torr, the auxiliary valves 232, 233 and the outflow valves 217-221 are closed.

Referring now to an example of forming a light receiving layer on the cylindrical substrate 237, $SiF_4$/He gas from the gas bomb 202, $GeF_4$/He gas from the gas bomb 203 NO gas from the gas bomb 204 and $H_2$ gas from the gas bomb 206 are permitted to flow into the mass-flow controllers 207, 208, 209 and 211 respectively, by opening the valves 222, 223, 224 and 226 and controlling the pressures at the outlet pressure gauges 227, 228, 229 and 231 to 1 Kg/cm$^2$ and opening gradually the inflow valves 212, 213, 214 and 216 respectively. Subsequently, the outflow valves 217, 218, 219, 221 and the auxiliary valve 232 are gradually opened to permit respective gases to flow into the reaction chamber 201. The outflow valves 217, 218, 219 and 221 are controlled so that the flow rate ratio of $SiF_4$/He, $GeF_4$/He, $NH_3$ gas and $H_2$ gas may have a desired value and opening of the main valve 234 is also controlled while watching the reading on the vacuum indicator 236 so that the pressure in the reaction chamber may reach a desired value. And, after confirming that the temperature of the substrate 237 is set at 50°-400° C. by the heater 238, the power source 240 is set at a desired power to excite glow discharge in the reaction chamber 201, thereby forming a first layer region (G) 103 on the substrate 237. When the first layer region (G) 103 is formed to a desired thickness, all the valves are completely closed.

By replacing the $SiF_4$/He gas bomb with the $SiH_4$/He gas bomb (purity of $SiH_4$:99.999%), setting desired glow discharge conditions by performing the same valve operations as described in formation of the first layer region (G) with the use of the $SiH_4$/He gas bomb line, the $B_2H_6$/He gas bomb line and the NO gas bomb line and maintaining glow discharging for a desired period of time, the second layer region (S) containing substantially no germanium atom can be formed on the first layer region (G) as described above.

Thus, a first layer (I) constituted of the first layer region (G) and the second layer region (S) is formed on the substrate 237.

Formation of a second layer (II) on the first layer (I) may be performed by use of, for example, $SiH_4$ gas, and $C_2H_4$ and/or NO, optionally diluted with a diluting gas such as He, according to same valve operation as in formation of the first layer (I), and exciting glow discharge following the desirable conditions. For incorporation of halogen atoms in the second layer (II), for example, $SiF_4$ gas, and $C_2H_4$ and/or NO gases, or a gas mixture further added with $SiH_4$ gas, may be used to form the second layer (II) according to the same procedure as described above.

During formation of the respective layers, outflow valves other than those for necessary gases should of course be closed. Also, during formation of respective layers, in order to avoid remaining of the gas employed for formation of the preceding layer in the reaction chamber 201 and the gas pipelines from the outflow valves 217-221 to the reaction chamber, the operation of evaluating the system to high vacuum by closing the outflow valves 217-221, opening the auxiliary valves 232, 233 and opening fully the main valve is conducted, if necessary.

The amount of carbon atoms and/or oxygen atoms contained in the second layer (II) can be controlled as desired by, for example, in the case of glow discharge, changing the flow rate ratio of $SiH_4$ gas to $C_2H_4$ gas and/or NO gas to be introduced into the reaction chamber 201 as desired, or in the case of layer formation by sputtering, changing the sputtering area ratio of silicon wafer to graphite wafer and/or silicon oxide wafer, or molding a target with the use of a mixture of silicon powder with graphite powder and/or silicon oxide powder at a desired mixing ratio. The content of halogen atoms (X) contained in the second layer (II) can be controlled by controlling the flow rate of the starting gas for introduction of halogen atoms such as $SiF_4$ gas when introduced into the reaction chamber 201.

Also, for uniformization of the layer formation, it is desirable to rotate the substrate 237 by means of a motor 239 at a constant speed during layer formation.

The present invention is described in more detail by referring to the following Examples.

EXAMPLE 1

By means of the device shown in FIG. 42, respective samples of image forming members for electrophotography (see Table 2A) were prepared, respectively, on cylindrical aluminum substrates under the conditions shown in Table 1A.

Figure 44A:
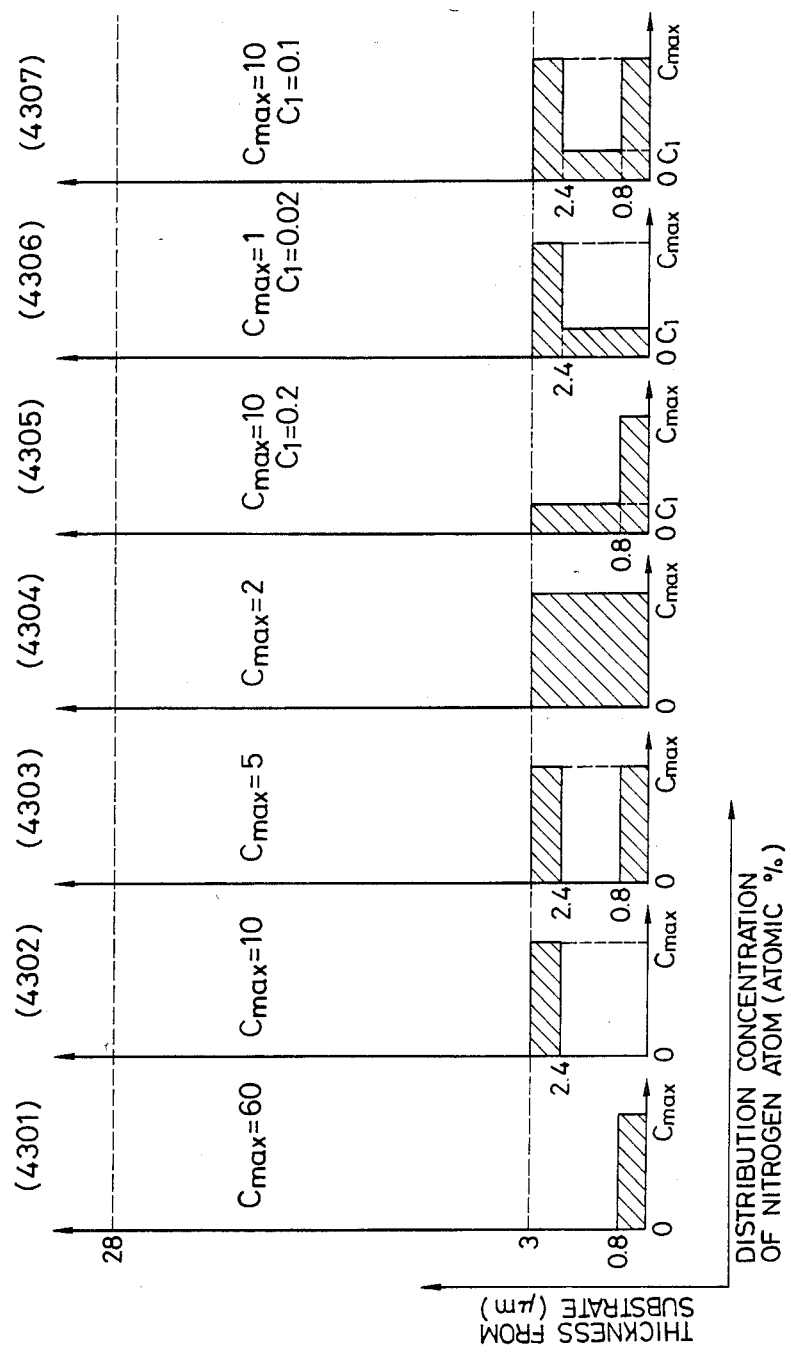
Figure 44B:
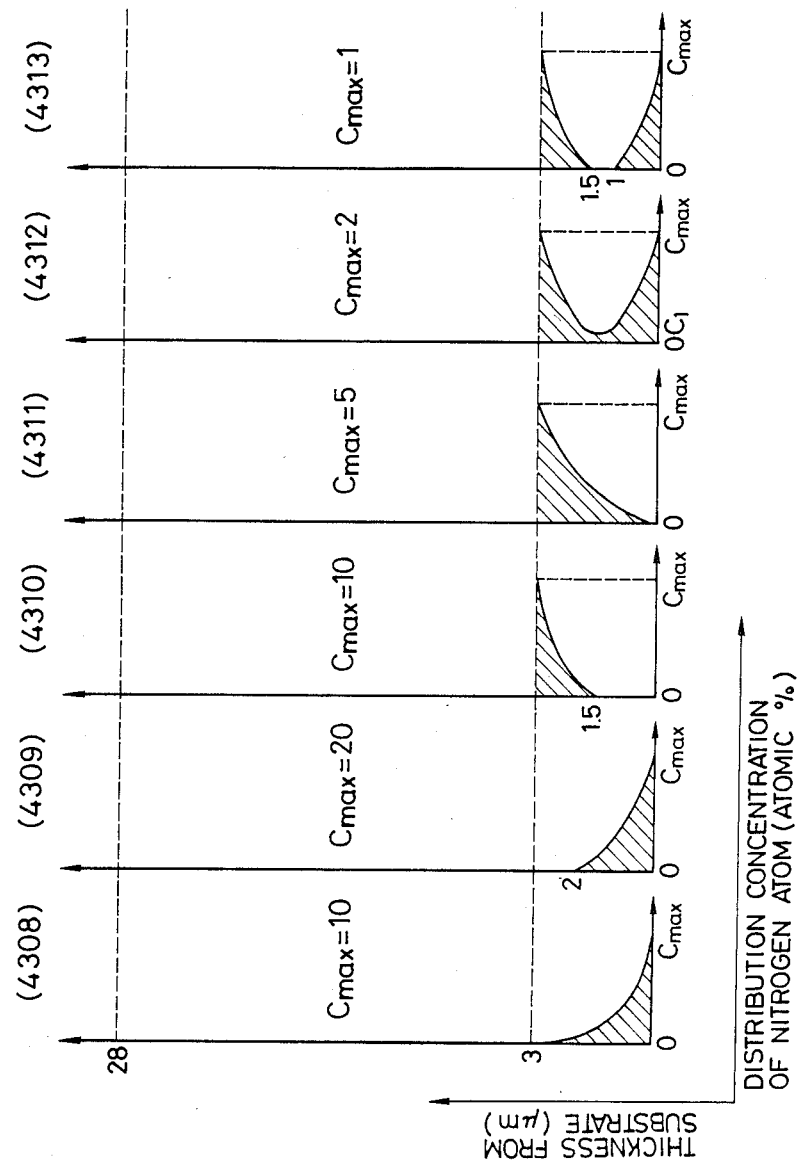

The depth profiles of the distribution concentration of impurity atoms (B or P) in respective samples are shown in FIG. 43, and those of nitrogen atoms in FIG. 44A and FIG. 44B. The depth profiles of respective atoms were controlled by changing the flow rate ratios of corresponding gases according to the change rate curve previously designed.

Each of the samples thus obtained was set in a charging-exposure testing device and subjected to corona charging at ⊕ 5.0 KV for 0.3 sec., followed immediately by irradiation of a light image. The light image was irradiated by means of a tungsten lamp light source at a dose of 2 lux.sec through a transmission type test chart.

Immediately thereafter, ⊖ chargeable developer (containing toner and carrier) was cascaded on the surface of the light receiving layer to give a good toner image on the surface of the light receiving layer. When the toner image on the light receiving layer was transferred onto a transfer paper by corona charging of ⊕ 5.0 KV, a clear image of high density with excellent resolution and good gradation reproducibility was obtained in every sample.

The same experiments were repeated under the same toner image forming conditions as described above, except for using GaAs type semiconductor laser (10 mW) of 810 nm in place of the tungsten lamp as the light source, and image quality evaluation was performed for each sample. As the result, an image of high quality, excellent in resolution and good in gradation reproducibility, could be obtained in every sample.

EXAMPLE 2

By means of the device shown in FIG. 42, respective samples of image forming members for electrophotography (see Table 4A) were prepared, respectively, on cylindrical aluminum substrates under the conditions shown in Table 3A. The depth profiles of the distribution concentration of the impurity atoms in respective samples are shown in FIG. 43, and those of nitrogen atoms in FIG. 45.

For each of these samples, the same image evaluation test was conducted as in Example 1 to give a toner transferred image of high quality in each sample. Also, for each sample, usage test repeated for 200,000 times was performed under the environment of 38° C. and 80% RH. As the result, no lowering in image quality was observed in each sample.

EXAMPLE 3

By means of the device shown in FIG. 42, respective samples of image forming members for electrophotography (Samples No. 31-1A to 36-16A in Table 6A) were prepared, respectively, on cylindrical aluminum substrates under the conditions shown in Table 5A.

Figure 45:
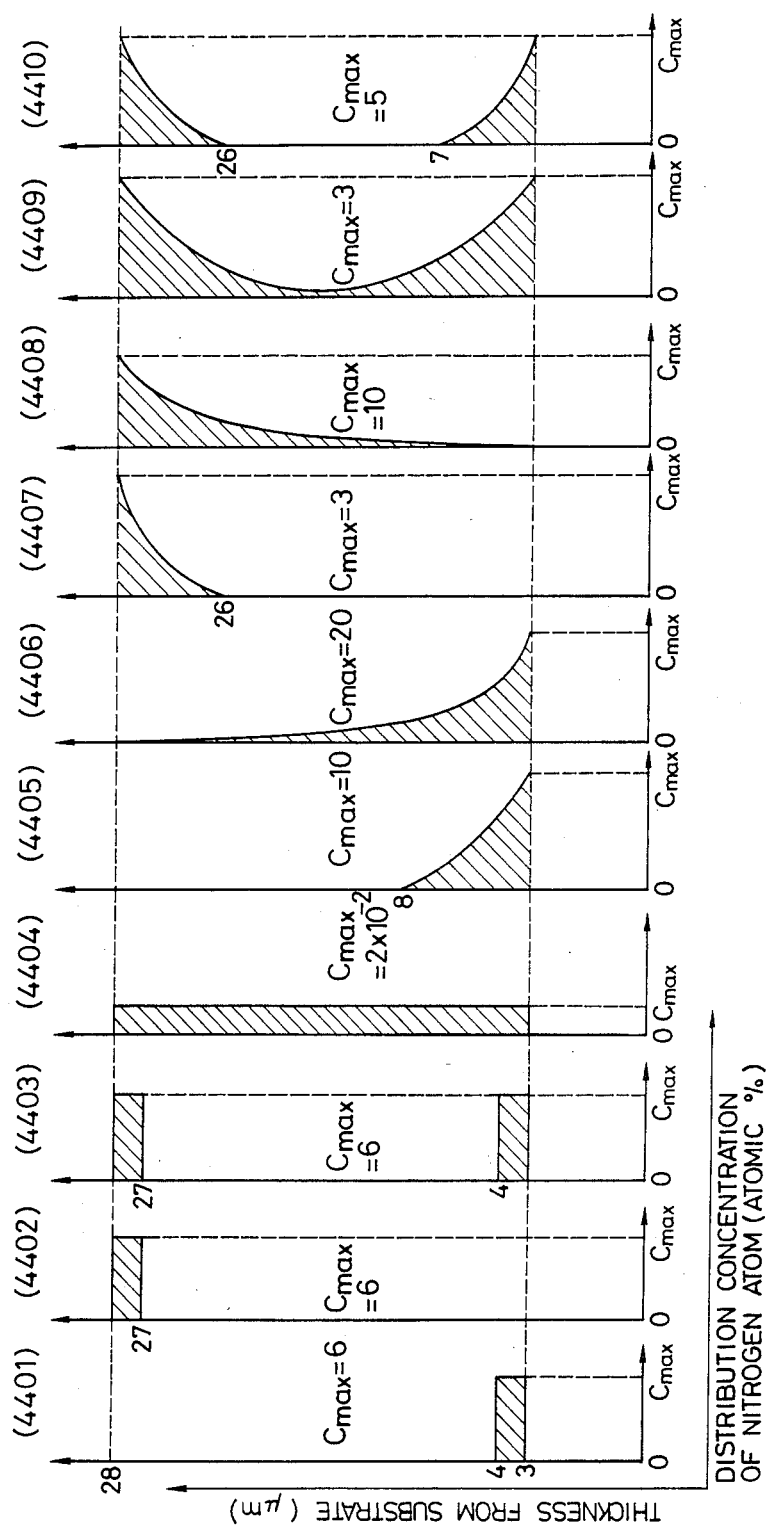

The depth profiles of the impurity atoms in respective samples are shown in FIG. 43 and those of nitrogen atoms in FIG. 44A, FIG. 44B and FIG. 45.

For each of these samples, the same image evaluation test was conducted as in Example 1 to give a toner transferred image of high quality in each sample. Also, for each sample, usage test repeated for 200,000 times was performed under the environment of 38° C. and 80% RH. As the result, no lowering in image quality was observed in each sample.

EXAMPLE 4

By means of the device shown in FIG. 42, respective samples of image forming members for electrophotography (see Samples No. 41-1A to 46-16A in Table 8A) were prepared, respectively, on cylindrical aluminum substrates under the conditions shown in Table 7A.

Figure 46:
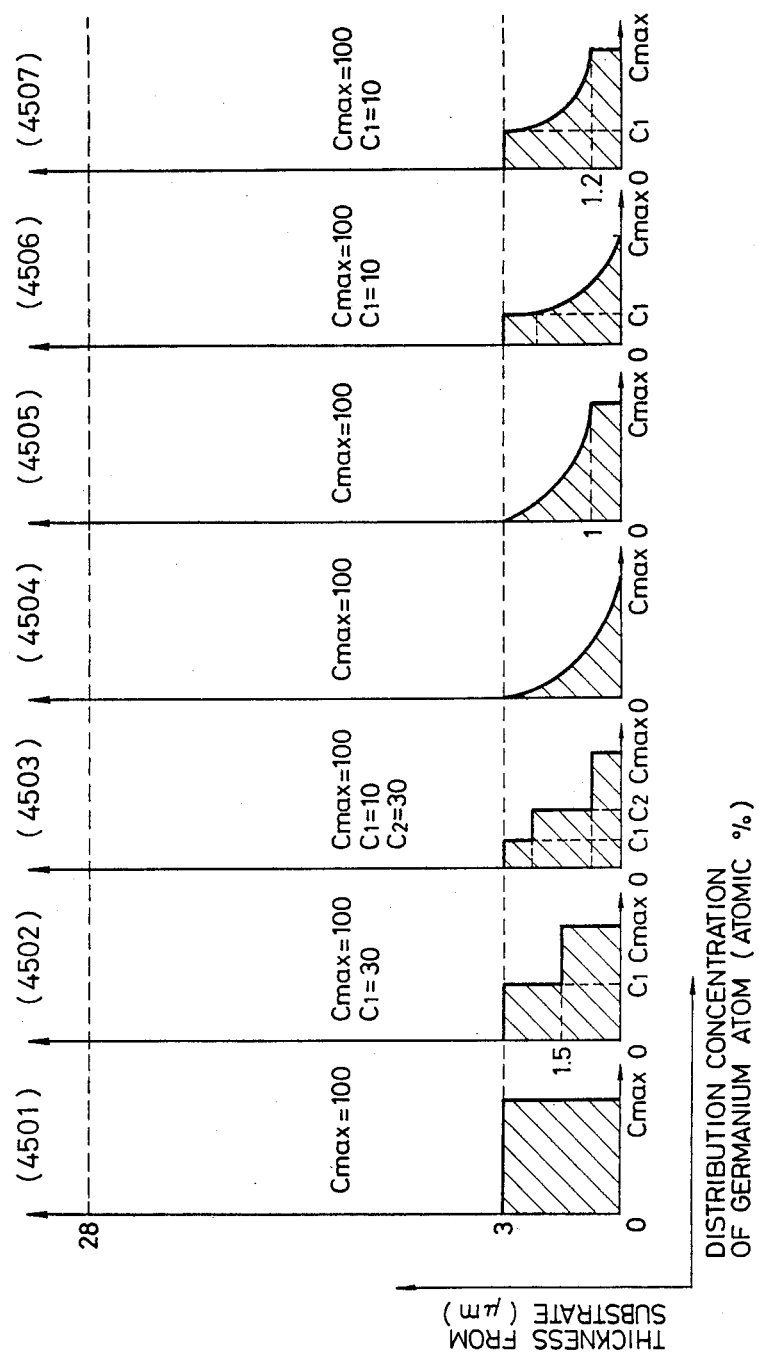

During formation of the first layer region (G), the flow rate ratio of GeH$_4$ gas was changed according to the change rate curve previously designed to form the Ge depth profile as shown in FIG. 46, and also during formation of the second layer region (S), by varying the flow rate ratio of B$_2$H$_6$ gas and PH$_3$ gas according to the change rate curves previously designed, respectively, the depth profiles of impurities as shown in FIG. 43 were formed for respective samples.

Each of the samples thus obtained was subjected to image evaluation similarly as described in Example 1 to give an image of high quality in each case.

Also, the flow rate ratio of NH$_3$ gas during formation of the first layer region (G) was changed according to the change rate curve previously designed to form the N depth profile as shown in FIGS. 44A and 44B.

Each of the resulting samples was evaluated for the image formation, and every sample gave an image of high quality.

EXAMPLE 5

By means of the device shown in FIG. 42, respective samples of image forming members for electrophotography (Samples No. 51-1A to No. 56-12A in Table 10A) were prepared, respectively, on cylindrical aluminum substrates under the conditions shown in Table 9A.

The depth profiles of impurity atoms in respective samples are shown in FIG. 43, those of nitrogen atoms in FIG. 45 and those of germanium atoms in FIG. 46.

For each of these samples, the same image evaluation test was conducted as in Example 1 to give a toner transferred image of high quality in each sample. Also, for each sample, usage test repeated for 200,000 times was performed under the environment of 38° C. and 80% RH. As the result, no lowering in image quality was observed in each sample.

EXAMPLE 6

By means of the device shown in FIG. 42, respective samples of image forming members for electrophotography (Samples No. 61-1A to No. 610-13A in Table 12A) were prepared, respectively, on cylindrical aluminum substrates under the conditions shown in Table 11A.

The depth profiles of impurity atoms in respective samples are shown in FIG. 43, those of nitrogen atoms in FIG. 44A, FIG. 44B and FIG. 45 and those of germanium atoms in FIG. 46.

For each of these samples, the same image evaluation test was conducted as in Example 1 to give a toner transferred image of high quality in each sample. Also, for each sample, usage test repeated for 200,000 times was performed under the environment of 38° C. and 80% RH. As the result, no lowering in image quality was obserbed in each sample.

EXAMPLE 7

By means of the device shown in FIG. 42, respective samples of image forming members for electrophotography (see Table 2B) were prepared, respectively, on cylindrical aluminum substrates under the conditions shown in Table 1B.

The depth profiles of impurity atoms (B or P) in respective samples are shown in FIG. 43, and those of nitrogen atoms in FIG. 44A and FIG. 44B. The depth profiles of respective atoms were controlled by changing the flow rate ratios of corresponding gases according to the change rate curve previously designed.

Each of the samples thus obtained was set in a charging-exposure testing device and subjected to corona charging at ⊕ 5.0 KV for 0.3 sec., followed immediately by irradiation of a light image. The light image was irradiated by means of a tungsten lamp light source at a dose of 2 lux.sec through a transmission type test chart.

Immediately thereafter, ⊖ chargeable developer (containing toner and carrier) was cascaded on the surface of the light receiving layer to give a good toner image on the surface of the light receiving layer. When the toner image on the light receiving layer was transferred onto a transfer paper by corona charging of ⊕ 5.0 KV, a clear image of high density with excellent resolution and good gradation reproducibility was obtained in every sample.

The same experiments were repeated under the same toner image forming conditions as described above, except for using GaAs type semiconductor laser (10 mW) of 810 nm in place of the tungsten lamp as the light source, and image quality evaluation was performed for each sample. As the result, an image of high quality, excellent in resolution and good in gradation reproducibility, could be obtained in every sample.

EXAMPLE 8

By means of the device shown in FIG. 42, respective samples of image forming members for electrophotography (see Table 4B) were prepared, respectively, on cylindrical aluminum substrates under the conditions shown in Table 3B.

The depth profiles of the impurity atoms in respective samples are shown in FIG. 43, and those of nitrogen atoms in FIG. 45.

For each of these samples, the same image evaluation test was conducted as in Example 7 to give a toner transferred image of high quality in each sample. Also, for each sample, usage test repeated for 200,000 times was performed under the environment of 38° C. and 80% RH. As the result, no lowering in image quality was observed in each sample.

EXAMPLE 9

By means of the device shown in FIG. 42, respective samples of image forming members for electrophotography (Samples No. 31-1B to No. 36-16B in Table 6B) were prepared, respectively, on cylindrical aluminum substrates under the conditions shown in Table 5B.

The depth profiles of impurity atoms in respective samples are shown in FIG. 43 and those of nitrogen atoms in FIG. 44A, FIG. 44B and FIG. 45.

For each of these samples, the same image evaluation test was conducted as in Example 7 to give a toner transferred image of high quality in each sample. Also, for each sample, usage test repeated for 200,000 times was performed under the environment of 38° C. and 80% RH. As the result, no lowering in image quality was observed in each sample.

EXAMPLE 10

By means of the device shown in FIG. 42, respective samples of image forming members for electrophotography (see Samples No. 41-1B to 46-16B in Table 8B) were prepared, respectively, on cylindrical aluminum substrates under the conditions shown in Table 7B.

During formation of the first layer region (G), the flow rate ratio of GeH$_4$ gas was changed according to the change rate curve previously designed to form the depth profile of distribution concentration of germanium as shown in FIG. 46, and also during formation of the second layer region (S), by varying the flow rate ratio of B$_2$H$_6$ gas and PH$_3$ gas according to the change rate curves previously designed, respectively, the depth profiles of impurities as shown in FIG. 43 were formed for respective samples.

Also, the flow rate ratio of NH$_3$ gas during formation of the first layer region (G) was changed according to the change rate curve previously designed to obtain the first layer region (G) having the nitrogen depth profiles as shown in FIG. 44A and FIG. 44B.

Each of the samples thus obtained was subjected to image evaluation similarly as described in Example 7 to give an image of high quality in each case.

EXAMPLE 11

By means of the device shown in FIG. 42, respective samples of image forming members for electrophotography (see Samples No. 51-1B to 56-12B in Table 10B) were prepared, respectively, on cylindrical aluminum substrates by controlling the respective gas flow rate ratios similarly as in Example 7 under the conditions shown in Table 9B.

The depth profiles of impurity atoms in respective samples are shown in FIG. 43, those of nitrogen atoms in FIG. 45, and those of germanium atoms in FIG. 46.

For each of these samples, the same image evaluation test was conducted as in Example 7 to give a toner transferred image of high quality in each sample. Also, for each sample, usage test repeated for 200,000 times was performed under the environment of 38° C. and 80% RH. As the result, no lowering in image quality was observed in each sample.

EXAMPLE 12

By means of the device shown in FIG. 42, respective samples of image forming members for electrophotography (see Samples No. 61-1B to 610-13B in Table 12B) were prepared, respectively, on cylindrical aluminum substrates by controlling the respective gas flow rate ratios similarly as in Example 7 under the conditions shown in Table 11B.

The depth profiles of the distribution concentration of impurity atoms in respective samples are shown in FIG. 43, those of nitrogen atoms in FIG. 44A, FIG. 44B and FIG. 45, and those of germanium atoms in FIG. 46.

For each of these samples, the same image evaluation test was conducted as in Example 7 to give a toner transferred image of high quality in each sample. Also, for each sample, usage test repeated for 200,000 times was performed under the environment of 38° C. and 80% RH. As the result, no lowering in image quality was observed in each sample.

EXAMPLE 13

Following the same conditions and the procedure as in Samples Nos. 11-1B, 12-1B and 13-1B in Example 7, except for changing the conditions for preparation of the second layer (II) to the respective conditions as shown in 13B, image forming members for electrophotography were prepared, respectively (24 Samples of Sample No. 11-1-1B to 11-1-8B, 12-1-1B to 12-1-8B, 13-1-1B to 13-1-8B). The respective image forming members for electrophotography thus prepared were individually set on a copying device, and corona charging was effected at ⊖5 KV for 0.2 sec., followed by irradiation of a light image. As the light source, a tungsten lamp was employed at a dosage of 1.0 lux·sec. The latent image was developed with a positively chargeable developer (containing toner and carrier) and transferred onto a plain paper. The transferred image was very good. The toner remaining on the image forming member for electrography without being transferred was cleaned with a rubber blade. When such step were repeated for 100,000 times or more, no deterioration of image was observed in every case.

The results of the overall image quality evaluation and evaluation of durability by repeated continuous use for respective samples are shown in Table 14B.

EXAMPLE 14

Various image forming members were prepared according to the same method as in Sample No. 11-2B in Example 7, respectively, except for varying the content ratio of silicon atoms to oxygen atoms in the second layer (II) by varying the ratio of Ar to NO in the gas mixture and the target area ratio of silicon wafer to $SiO_2$ during formation of the second layer (II). For each of the image forming members thus obtained, the steps of image formation, developing and cleaning as described in Example 7 were repeated for about 50,000 times, and thereafter image evaluations were conducted to obtain the results as shown in Table 15B.

EXAMPLE 15

Various image forming members were prepared according to the same method as in Sample No. 11-3B in Example 7, respectively, except for varying the content ratio of silicon atoms to oxygen atoms in the second layer (II) by varying the flow rate ratio of $SiH_4$ gas to NO gas during formation of the second layer (II). For each of the image forming members thus obtained, the steps up to transfer were repeated for about 50,000 times according to the methods as described in Example 7, and thereafter image evaluations were conducted to obtain the results as shown in Table 16B.

EXAMPLE 16

Various image forming members were prepared according to the same method as in Sample No. 11-4B in Example 7, respectively, except for varying the content ratio of silicon atoms to oxygen atoms in the second layer (II) by varying the flow rate ratio of $SiH_4$ gas, $SiF_4$ gas and NO gas during formation of the second layer (II). For each of the image forming members thus obtained, the steps of image formation, developing and cleaning as described in Example 7 were repeated for about 50,000 times, and thereafter image evaluations were conducted to obtain the results as shown in Table 17B.

EXAMPLE 17

Respective image forming members were prepared in the same manner as in Sample No. 11-5B in Example 7, except for changing the layer thickness of the second layer (II), and the steps of image formation, developing and cleaning as described in Example 7 were repeated to obtain the results as shown in Table 18B.

EXAMPLE 18

By means of the device shown in FIG. 42, respective samples of image forming members for electrophotography (see Table 2C) were prepared, respectively, on cylindrical aluminum substrates under the conditions shown in Table 1C.

The depth profiles of impurity atoms (B or P) in respective samples are shown in FIG. 43, and those of nitrogen atoms in FIG. 44A and FIG. 44B. The depth profiles of respective atoms were controlled by changing the flow rate ratios of corresponding gases according to the change rate curve previously designed.

Each of the samples thus obtained was set in a charging-exposure testing device and subjected to corona charging at ⊕5.0 KV for 0.3 sec., followed immediately by irradiation of a light image. The light image was irradiated by means of a tungsten lamp light source at a dose of 2 lux·sec through a transmission type test chart.

Immediately thereafter, ⊖ chargeable developer (containing toner and carrier) was cascaded on the surface of the light receiving layer to give a good toner image on the surface of the light receiving layer. When the toner image on the light receiving layer was transferred onto a transfer paper by corona charging of ⊕5.0 KV, a clear image of high density with excellent resolution and good gradation reproducibility was obtained in every sample.

The same experiments were repeated under the same toner image forming conditions as described above, except for using GaAs type semiconductor layer (10 mW) of 810 nm in place of the tungsten lamp as the light source, and image quality evaluation was performed for each sample. As the result, an image of high quality, excellent in resolution and good in gradation reproducibility, could be obtained in every sample.

EXAMPLE 19

By means of the device shown in FIG. 42, respective samples of image forming members for electrophotography (see Table 4C) were prepared, respectively, on cylindrical aluminum substrates under the conditions shown in Table 3C.

The depth profiles of the impurity atoms in respective samples are shown in FIG. 43, and those of nitrogen atoms in FIG. 45.

For each of these samples, the same image evaluation test was conducted as in Example 18 to give a toner transferred image of high quality in each sample. Also, for each sample, usage test repeated for 200,000 times was performed under the environment of 38° C. and 80% RH. As the result, no lowering in image quality was observed in each sample.

EXAMPLE 20

By means of the device shown in FIG. 42, respective samples of image forming members for electrophotography (Samples No. 31-1C to No. 36-16C in Table 6C) were prepared, respectively, on cylindrical aluminum substrates under the conditions shown in Table 5C.

The depth profiles of impurity atoms in respective samples are shown in FIG. 43 and the depth profiles of nitrogen atoms in FIG. 44A, FIG. 44B and FIG. 45.

For each of these samples, the same image evaluation test was conducted as in Example 18 to give a toner transferred image of high quality in each sample. Also, for each sample, usage test repeated for 200,000 times was performed under the environment of 38° C. and 80% RH. As the result, no lowering in image quality was observed in each sample.

EXAMPLE 21

By means of the device shown in FIG. 42, respective samples of image forming members for electrophotography (see Samples No. 41-1C to 46-16C in Table 8C) were prepared, respectively, on cylindrical aluminum substrates under the conditions shown in Table 7C.

During formation of the first layer region (G), the flow rate ratio of $GeH_4$ gas was changed according to the change rate curve previously designed to form the depth profile of the distribution concentration of of germanium as shown in FIG. 46, and also during formation of the layer region (S), by varying the flow rate ratio of $B_2H_6$ gas and $PH_3$ gas according to the change rate curves previously designed, respectively, the depth profiles of impurities as shown in FIG. 43 were formed for respective samples.

Also, the flow rate ratio of $NH_3$ gas during formation of the first layer region (G) was changed according to the change rate curve previously designed to obtain the layer region (G) having the nitrogen depth profiles as shown in FIG. 44A and FIG. 44B.

Each of the samples thus obtained was subjected to image evaluation similarly as described in Example 18 to give an image of high quality in each case

EXAMPLE 22

By means of the device shown in FIG. 42, respective samples of image forming members for electrophotography (see Samples No. 51-1C to 56-12C in Table 10C) were prepared, respectively, on cylindrical aluminum substrates by controlling the respective gas flow rate ratios similarly as in Example 18 under the conditions shown in Table 9C.

The depth profiles of the distribution concentration of impurity atoms in respective samples are shown in FIG. 43, those of nitrogen atoms in FIG. 45, and those of germanium atoms in FIG. 46.

For each of these samples, the same image evaluation test was conducted as in Example 18 to give a toner transferred image of high quality in each sample. Also, for each sample, usage test repeated for 200,000 times was performed under the environment of 38° C. and 80% RH. As the result, no lowering in image quality was observed in each sample.

EXAMPLE 23

By means of the device shown in FIG. 42, respective samples of image forming members for electrophotography (see Samples No. 61-1C to 610-13C in Table 12C) were prepared, respectively, on cylindrical aluminum substrates by controlling the respective gas flow rate ratios similarly as in Example 18 under the conditions shown in Table 11C.

The depth profiles of the distribution concentration of impurity atoms in respective samples are shown in FIG. 43, those of nitrogen atoms in FIG. 44A, FIG. 44B and FIG. 45, and those of germanium atoms in FIG. 46.

For each of these samples, the same image evaluation test was conducted as in Example 18 to give a toner transferred image of high quality in each sample. Also, for each sample, usage test repeated for 200,000 times was performed under the environment of 38° C. and 80% RH. As the result, no lowering in image quality was observed in each sample.

EXAMPLE 24

Following the same conditions and the procedure as in Samples Nos. 11-1C, 12-1C and 13-1C in Example 18, except for changing the conditions for preparation of the second layer (II) to the respective conditions as shown in Table 13C, image forming members for electrophotography were prepared, respectively (24 Samples of Sample No. 11-1-1C to 11-1-8C, 12-1-1C to 12-1-8C, 13-1-1C to 13-1-8C).

The respective image forming members for electrophotography thus prepared were individually set on a copying device, and for the respective image forming members for electrophotography corresponding to respective examples, under the same conditions as described in respective examples, overall image quality evaluation of the transferred image and evaluation of durability by repeated continuous uses were performed.

The results of the overall image quality evaluation and evaluation of durability by repeated continuous use for respective samples are shown in Table 14C.

EXAMPLE 25

Various image forming members were prepared according to the same method as in Sample No. 11-2C in Example 18, respectively, except for varying the content ratio of silicon atoms to carbon atoms in the second layer (II) by varying the target area ratio of silicon wafer to graphite during formation of the second layer (II). For each of the image forming members thus obtained, the steps of image formation, developing and cleaning as described in Example 18 were repeated for about 50,000 times, and thereafter image evaluations were conducted to obtain the results as shown in Table 15C.

EXAMPLE 26

Various image forming members were prepared according to the same method as in Sample No. 11-3C in Example 18, respectively, except for varying the content ratio of silicon atoms to carbon atoms in the second layer (II) by varying the flow rate ratio of $SiH_4$ gas to $C_2H_4$ gas during formation of the second layer (II). For each of the image forming members thus obtained, the steps up to transfer were repeated for about 50,000 times according to the methods as described in Example 18, and thereafter image evaluations were conducted to obtain the results as shown in Table 16C.

EXAMPLE 27

Various image forming members were prepared according to the same method as Sample No. 11-4C in Example 18, respectively, except for varying the content ratio of silicon atoms to carbon atoms in the second layer (II) by varying the flow rate ratio of $SiH_4$ gas, $SiF_4$ gas and $C_2H_4$ gas during formation of the second layer (II). For each of the image forming members thus obtained, the steps of image formation, developing and cleaning as described in Example 18 were repeated for about 50,000 times, and thereafter image evaluations were conducted to obtain the results as shown in Table 17C.

EXAMPLE 28

Respective image forming members were prepared in the same manner as in Sample No. 11-5C in Example 18, except for changing the layer thickness of the second layer (II), and the steps of image formation, developing and cleaning as described in Example 18 were repeated to obtain the results as shown in Table 18C.

The common layer forming conditions in the respective Examples of the present invention are shown below:

Substrate temperature:
  Germanium atom (Ge) containing layer . . . about 200° C.
  No germanium atom (Ge) containing layer . . . about 250° C.
Discharging frequency: 13.56 MHz
Inner pressure in reaction chamber during the reaction: 0.3 Torr.

TABLE 1A

| Layer constitution | Gases employed | Flow rate (SCCM) | Flow rate ratio | | Discharging power (W/cm²) | Layer formation rate (Å/sec) | Layer thickness (μ) |
|---|---|---|---|---|---|---|---|
| Layer region (G) | $GeH_4/He = 0.5$<br>$SiH_4/He = 0.5$ | $GeH_4 + SiH_4 = 200$ | $\dfrac{(GeH_4 + SiH_4)}{(GeH_4 + SiH_4 + H_2)}$ | $= \dfrac{7}{10}$ | 0.18 | 15 | 3 |
|  | $H_2$<br>$NH_3$ |  | $\dfrac{GeH_4}{(GeH_4 + SiH_4 + H_2)}$ | $= \dfrac{1}{100}$ |  |  |  |
| Layer region (S) | $SiH_4/He = 0.5$<br>$B_2H_6/He = 1 \times 10^{-3}$<br>$(PH_3/He = 1 \times 10^{-3})$ | $SiH_4 = 200$ |  |  | 0.18 | 15 | 25 |

TABLE 2A

| Depth profile of N | | Depth profile of impurity atoms | | | | | |
|---|---|---|---|---|---|---|---|
|  | Sample No. | 4201 | 4202 | 4203 | 4204 | 4205 | 4206 |
|  | 4301 | 11-1A | 12-1A | 13-1A | 14-1A | 15-1A | 16-1A |
|  | 4302 | 11-2A | 12-2A | 13-2A | 14-2A | 15-2A | 16-2A |
|  | 4303 | 11-3A | 12-3A | 13-3A | 14-3A | 15-3A | 16-3A |
|  | 4304 | 11-4A | 12-4A | 13-4A | 14-4A | 15-4A | 16-4A |
|  | 4305 | 11-5A | 12-5A | 13-5A | 14-5A | 15-5A | 16-5A |
|  | 4306 | 11-6A | 12-6A | 13-6A | 14-6A | 15-6A | 16-6A |
|  | 4307 | 11-7A | 12-7A | 13-7A | 14-7A | 15-7A | 16-7A |
|  | 4308 | 11-8A | 12-8A | 13-8A | 14-8A | 15-8A | 16-8A |
|  | 4309 | 11-9A | 12-9A | 13-9A | 14-9A | 15-9A | 16-9A |
|  | 4310 | 11-10A | 12-10A | 13-10A | 14-10A | 15-10A | 16-10A |
|  | 4311 | 11-11A | 12-11A | 13-11A | 14-11A | 15-11A | 16-11A |
|  | 4312 | 11-12A | 12-12A | 13-12A | 14-12A | 15-12A | 16-12A |
|  | 4313 | 11-13A | 12-13A | 13-13A | 14-13A | 15-13A | 16-13A |

TABLE 3A

| Layer constitution | Gases employed | Flow rate (SCCM) | Flow rate ratio | | Discharging power (W/cm²) | Layer formation rate (Å/sec) | Layer thickness (μ) |
|---|---|---|---|---|---|---|---|
| Layer region (G) | $GeF_4/He = 0.5$<br>$SiF_4/He = 0.5$ | $GeF_4 + SiF_4 = 200$ | $\dfrac{(GeF_4 + SiF_4)}{(GeF_4 + SiF_4 + H_2)}$ | $= \dfrac{7}{10}$ | 0.18 | 15 | 3 |
|  | $H_2$ |  | $\dfrac{GeF_4}{(GeF_4 + SiF_4 + H_2)}$ | $= \dfrac{1}{100}$ |  |  |  |
| Layer region (S) | $SiH_4/He = 0.5$<br>$B_2H_6/He = 1 \times 10^{-3}$<br>$(PH_3/He = 1 \times 10^{-3})$<br>$NH_3$ | $SiH_4 = 200$ |  |  | 0.18 | 15 | 25 |

TABLE 4A

| Depth profile of N | | Depth profile of impurity atoms | | | | | |
|---|---|---|---|---|---|---|---|
|  | Sample No. | 4201 | 4202 | 4203 | 4204 | 4205 | 4206 |
|  | 4401 | 21-1A | 22-1A | 23-1A | 24-1A | 25-1A | 26-1A |
|  | 4402 | 21-2A | 22-2A | 23-2A | 24-2A | 25-2A | 26-2A |
|  | 4403 | 21-3A | 22-3A | 23-3A | 24-3A | 25-3A | 26-3A |
|  | 4404 | 21-4A | 22-4A | 23-4A | 24-4A | 25-4A | 26-4A |
|  | 4405 | 21-5A | 22-5A | 23-5A | 24-5A | 25-5A | 26-5A |
|  | 4406 | 21-6A | 22-6A | 23-6A | 24-6A | 25-6A | 26-6A |
|  | 4407 | 21-7A | 22-7A | 23-7A | 24-7A | 25-7A | 26-7A |
|  | 4408 | 21-8A | 22-8A | 23-8A | 24-8A | 25-8A | 26-8A |
|  | 4409 | 21-9A | 22-9A | 23-9A | 24-9A | 25-9A | 26-9A |
|  | 4410 | 21-10A | 22-10A | 23-10A | 24-10A | 25-10A | 26-10A |

TABLE 5A

| Layer constitution | Gases employed | Flow rate (SCCM) | Flow rate ratio | Discharging power ($W/cm^2$) | Layer formation rate (Å/sec) | Layer thickness ($\mu$) |
|---|---|---|---|---|---|---|
| Layer region (G) | $GeF_4/He = 0.5$<br>$SiF_4/He = 0.5$<br>$H_2$<br>$NH_3$ | $SiF_4 + GeF_4 = 200$ | $\dfrac{(GeF_4 + SiF_4)}{(GeF_4 + SiF_4 + H_2)} = \dfrac{7}{10}$<br>$\dfrac{GeF_4}{(GeF_4 + SiF_4 + H_2)} = \dfrac{1}{100}$ | 0.18 | 15 | 3 |
| Layer region (S) | $SiH_4/He = 0.5$<br>$B_2H_6/He = 1 \times 10^{-3}$<br>$(PH_3/He = 1 \times 10^{-3})$<br>$NH_3$ | $SiH_4 = 200$ | | 0.18 | 15 | 25 |

TABLE 6A

| Depth profile of N | Sample No. | Depth profile of impurity atoms | | | | | |
|---|---|---|---|---|---|---|---|
| | | 4201 | 4202 | 4203 | 4204 | 4205 | 4206 |
| 4401 4302 | | 31-1A | 32-1A | 33-1A | 34-1A | 35-1A | 36-1A |
| 4402 4301 | | 31-2A | 32-2A | 33-2A | 34-2A | 35-2A | 36-2A |
| 4403 4304 | | 31-3A | 32-3A | 33-3A | 34-3A | 35-3A | 36-3A |
| 4404 4305 | | 31-4A | 32-4A | 33-4A | 34-4A | 35-4A | 36-4A |
| 4405 4306 | | 31-5A | 32-5A | 33-5A | 34-5A | 35-5A | 36-5A |
| 4406 4307 | | 31-6A | 32-6A | 33-6A | 34-6A | 35-6A | 36-6A |
| 4407 4308 | | 31-7A | 32-7A | 33-7A | 34-7A | 35-7A | 36-7A |
| 4408 4309 | | 31-8A | 32-8A | 33-8A | 34-8A | 35-8A | 36-8A |
| 4409 4310 | | 31-9A | 32-9A | 33-9A | 34-9A | 35-9A | 36-9A |
| 4410 4311 | | 31-10A | 32-10A | 33-10A | 34-10A | 35-10A | 36-10A |
| 4410 4312 | | 31-11A | 32-11A | 33-11A | 34-11A | 35-11A | 36-11A |
| 4410 4313 | | 31-12A | 32-12A | 33-12A | 34-12A | 35-12A | 36-12A |
| 4407 4308 | | 31-13A | 32-13A | 33-13A | 34-13A | 35-13A | 36-13A |
| 4407 4309 | | 31-14A | 32-14A | 33-14A | 34-14A | 35-14A | 36-14A |
| 4408 4308 | | 31-15A | 32-15A | 33-15A | 34-15A | 35-15A | 36-15A |
| 4408 4309 | | 31-16A | 32-16A | 33-16A | 34-16A | 35-16A | 36-16A |

TABLE 7A

| Layer constitution | Gases employed | Flow rate (SCCM) | Flow rate ratio | Discharging power ($W/cm^2$) | Layer formation rate (Å/sec) | Layer thickness ($\mu$) |
|---|---|---|---|---|---|---|
| Layer region (G) | $GeH_4/He = 0.5$<br>$SiH_4/He = 0.5$<br>$H_2$<br>$NH_3$ | $SiH_4 + GeH_4 = 200$ | | 0.18 | 15 | 3 |
| Layer region (S) | $SiH_4/He = 0.5$<br>$B_2H_6/He = 1 \times 10^{-3}$<br>$(PH_3/He = 1 \times 10^{-3})$ | $SiH_4 = 200$ | | 0.18 | 15 | 25 |

TABLE 8A

| Depth profile of Ge and N | Sample No. | Depth profile of impurity atoms | | | | | |
|---|---|---|---|---|---|---|---|
| | | 4201 | 4202 | 4203 | 4204 | 4205 | 4206 |
| 4301 4501 | | 41-1A | 42-1A | 43-1A | 44-1A | 45-1A | 46-1A |
| 4302 4502 | | 41-2A | 42-2A | 43-2A | 44-2A | 45-2A | 46-2A |

TABLE 8A-continued

| Depth profile of Ge and N | Sample No. | Depth profile of impurity atoms | | | | | |
|---|---|---|---|---|---|---|---|
| | | 4201 | 4202 | 4203 | 4204 | 4205 | 4206 |
| 4303 4503 | | 41-3A | 42-3A | 43-3A | 44-3A | 45-3A | 46-3A |
| 4304 4504 | | 41-4A | 42-4A | 43-4A | 44-4A | 45-4A | 46-4A |
| 4305 4505 | | 41-5A | 42-5A | 43-5A | 44-5A | 45-5A | 46-5A |
| 4306 4506 | | 41-6A | 42-6A | 43-6A | 44-6A | 45-6A | 46-6A |
| 4307 4507 | | 41-7A | 42-7A | 43-7A | 44-7A | 45-7A | 46-7A |
| 4308 4504 | | 41-8A | 42-8A | 43-8A | 44-8A | 45-8A | 46-8A |
| 4308 4505 | | 41-9A | 42-9A | 43-9A | 44-9A | 45-9A | 46-9A |
| 4309 4506 | | 41-10A | 42-10A | 43-10A | 44-10A | 45-10A | 46-10A |
| 4310 4507 | | 41-11A | 42-11A | 43-11A | 44-11A | 45-11A | 46-11A |
| 4311 4507 | | 41-12A | 42-12A | 43-12A | 44-12A | 45-12A | 46-12A |
| 4312 4504 | | 41-13A | 42-13A | 43-13A | 44-13A | 45-13A | 46-13A |
| 4313 4505 | | 41-14A | 42-14A | 43-14A | 44-14A | 45-14A | 46-14A |
| 4308 4506 | | 41-15A | 42-15A | 43-15A | 44-15A | 45-15A | 46-15A |
| 4309 4503 | | 41-16A | 42-16A | 43-16A | 44-16A | 45-16A | 46-16A |

TABLE 9A

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer region (G) | GeH$_4$/He = 0.5<br>SiH$_4$/He = 0.5 | SiH$_4$ + GeH$_4$ = 200 | | 0.18 | 15 | 3 |
| Layer region (S) | SiH$_4$/He = 0.5<br>B$_2$H$_6$/He = 1 × 10$^{-3}$<br>(PH$_3$/He = 1 × 10$^{-3}$)<br>NH$_3$ | SiH$_4$ = 200 | | 0.18 | 15 | 25 |

TABLE 10A

| Depth profile of Ge and N | Sample No. | Depth profile of impurity atoms | | | | | |
|---|---|---|---|---|---|---|---|
| | | 4201 | 4202 | 4203 | 4204 | 4205 | 4206 |
| 4401 4501 | | 51-1A | 52-1A | 53-1A | 54-1A | 55-1A | 56-1A |
| 4402 4502 | | 51-2A | 52-2A | 53-2A | 54-2A | 55-2A | 56-2A |
| 4403 4503 | | 51-3A | 52-3A | 53-3A | 54-3A | 55-3A | 56-3A |
| 4404 4504 | | 51-4A | 52-4A | 53-4A | 54-4A | 55-4A | 56-4A |
| 4405 4505 | | 51-5A | 52-5A | 53-5A | 54-5A | 55-5A | 56-5A |
| 4406 4506 | | 51-6A | 52-6A | 53-6A | 54-6A | 55-6A | 56-6A |
| 4407 4507 | | 51-7A | 52-7A | 53-7A | 54-7A | 55-7A | 56-7A |
| 4408 4504 | | 51-8A | 52-8A | 53-8A | 54-8A | 55-8A | 56-8A |
| 4409 4505 | | 51-9A | 52-9A | 53-9A | 54-9A | 55-9A | 56-9A |
| 4410 4501 | | 51-10A | 52-10A | 53-10A | 54-10A | 55-10A | 56-10A |
| 4407 4505 | | 51-11A | 52-11A | 53-11A | 54-11A | 55-11A | 56-11A |
| 4408 4506 | | 51-12A | 52-12A | 53-12A | 54-12A | 55-12A | 56-12A |

TABLE 11A

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer region (G) | GeH$_4$/He = 0.5<br>SiH$_4$/He = 0.5<br>NH$_3$ | SiH$_4$ + GeH$_4$ = 200 | | 0.18 | 15 | 3 |
| Layer region (S) | SiH$_4$/He = 0.5<br>B$_2$H$_6$/He = 1 × 10$^{-3}$<br>(PH$_3$/He = 1 × 10$^{-3}$)<br>NH$_3$ | SiH$_4$ = 200 | | 0.18 | 15 | 25 |

TABLE 12A

| Depth profile of N | Sample No. | \multicolumn{6}{c}{Depth profile of B and Ge} | | | | |
|---|---|---|---|---|---|---|---|---|---|---|---|
| | | 4201<br>4501 | 4202<br>4502 | 4203<br>4503 | 4204<br>4504 | 4205<br>4505 | 4206<br>4506 | 4201<br>4507 | 4202<br>4504 | 4204<br>4505 | 4205<br>4506 |
| 4401<br>4301 | | 61-1A | 62-1A | 63-1A | 64-1A | 65-1A | 66-1A | 67-1A | 68-1A | 69-1A | 610-1A |
| 4402<br>4302 | | 61-2A | 62-2A | 63-2A | 64-2A | 65-2A | 66-2A | 67-2A | 68-2A | 69-2A | 610-2A |
| 4403<br>4303 | | 61-3A | 62-3A | 63-3A | 64-3A | 65-3A | 66-3A | 67-3A | 68-3A | 69-3A | 610-3A |
| 4404<br>4304 | | 61-4A | 62-4A | 63-4A | 64-4A | 65-4A | 66-4A | 67-4A | 68-4A | 69-4A | 610-4A |
| 4405<br>4305 | | 61-5A | 62-5A | 63-5A | 64-5A | 65-5A | 66-5A | 67-5A | 68-5A | 69-5A | 610-5A |
| 4406<br>4306 | | 61-6A | 62-6A | 63-6A | 64-6A | 65-6A | 66-6A | 67-6A | 68-6A | 69-6A | 610-6A |
| 4407<br>4307 | | 61-7A | 62-7A | 63-7A | 64-7A | 65-7A | 66-7A | 67-7A | 68-7A | 69-7A | 610-7A |
| 4408<br>4308 | | 61-8A | 62-8A | 63-8A | 64-8A | 65-8A | 66-8A | 67-8A | 68-8A | 69-8A | 610-8A |
| 4409<br>4309 | | 61-9A | 62-9A | 63-9A | 64-9A | 65-9A | 66-9A | 67-9A | 68-9A | 69-9A | 610-9A |
| 4410<br>4310 | | 61-10A | 62-10A | 63-10A | 64-10A | 65-10A | 66-10A | 67-10A | 68-10A | 69-10A | 610-10A |
| 4409<br>4311 | | 61-11A | 62-11A | 63-11A | 64-11A | 65-11A | 66-11A | 67-11A | 68-11A | 69-11A | 610-11A |
| 4410<br>4312 | | 61-12A | 62-12A | 63-12A | 64-12A | 65-12A | 66-12A | 67-12A | 68-12A | 69-12A | 610-12A |
| 4410<br>4313 | | 61-13A | 62-13A | 63-13A | 64-13A | 65-13A | 66-13A | 67-13A | 68-13A | 69-13A | 610-13A |

TABLE 1B

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer region (G) | GeH$_4$/He = 0.5<br>SiH$_4$/He = 0.5<br>H$_2$<br>NH$_3$ | GeH$_4$ + SiH$_4$ = 200 | $\dfrac{(GeH_4 + SiH_4)}{(GeH_4 + SiH_4 + H_2)} = \dfrac{7}{10}$<br><br>$\dfrac{GeH_4}{(GeH_4 + SiH_4 + H_2)} = \dfrac{1}{100}$<br><br>$\dfrac{NH_3}{GeH_4 + SiH_4} = (*)$ | 0.18 | 15 | 3 |
| Second Layer region | SiH$_4$/He = 0.5<br>B$_2$H$_6$/He = 1 × 10$^{-3}$<br>(PH$_3$/He = 1 × 10$^{-3}$) | SiH$_4$ = 200 | $\dfrac{B_2H_6}{SiH_4} = (**)$ | 0.18 | 15 | 25 |
| Layer (II) | SiH$_4$/He = 0.5<br>NO | SiH$_4$ = 100 | SiH$_4$/NO = 1 | 0.18 | 10 | 0.5 |

(*) (**) ... Flow rate ratio is changed according to the change rate curve previously designed.

TABLE 2B

| Depth profile of N | Sample No. | \multicolumn{6}{c}{Depth profile of impurity atoms} | | | | | |
|---|---|---|---|---|---|---|---|
| | | 4201 | 4202 | 4203 | 4204 | 4205 | 4206 |
| 4301 | | 11-1B | 12-1B | 13-1B | 14-1B | 15-1B | 16-1B |

TABLE 2B-continued

| Depth profile of N | Sample No. | Depth profile of impurity atoms | | | | | |
|---|---|---|---|---|---|---|---|
| | | 4201 | 4202 | 4203 | 4204 | 4205 | 4206 |
| 4302 | | 11-2B | 12-2B | 13-2B | 14-2B | 15-2B | 16-2B |
| 4303 | | 11-3B | 12-3B | 13-3B | 14-3B | 15-3B | 16-3B |
| 4304 | | 11-4B | 12-4B | 13-4B | 14-4B | 15-4B | 16-4B |
| 4305 | | 11-5B | 12-5B | 13-5B | 14-5B | 15-5B | 16-5B |
| 4306 | | 11-6B | 12-6B | 13-6B | 14-6B | 15-6B | 16-6B |
| 4307 | | 11-7B | 12-7B | 13-7B | 14-7B | 15-7B | 16-7B |
| 4308 | | 11-8B | 12-8B | 13-8B | 14-8B | 15-8B | 16-8B |
| 4309 | | 11-9B | 12-9B | 13-9B | 14-9B | 15-9B | 16-9B |
| 4310 | | 11-10B | 12-10B | 13-10B | 14-10B | 15-10B | 16-10B |
| 4311 | | 11-11B | 12-11B | 13-11B | 14-11B | 15-11B | 16-11B |
| 4312 | | 11-12B | 12-12B | 13-12B | 14-12B | 15-12B | 16-12B |
| 4313 | | 11-13B | 12-13B | 13-13B | 14-13B | 15-13B | 16-13B |

TABLE 3B

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer region (G) | GeF$_4$/He = 0.5<br>SiF$_4$/He = 0.5<br>H$_2$ | GeF$_4$ + SiF$_4$ = 200 | $\dfrac{(GeF_4 + SiF_4)}{(GeF_4 + SiF_4 + H_2)} = \dfrac{7}{10}$<br><br>$\dfrac{GeF_4}{(GeF_4 + SiF_4 + H_2)} = \dfrac{1}{100}$ | 0.18 | 15 | 3 |
| Second layer region (S) | SiH$_4$/He = 0.5<br>B$_2$H$_6$/He = 1 × 10$^{-3}$<br>(PH$_3$/He = 1 × 10$^{-3}$)<br>NH$_3$ | SiH$_4$ = 200 | $\dfrac{B_2H_6}{SiH_4} = (*)$<br><br>$\dfrac{NH_3}{SiH_4} = (**)$ | 0.18 | 15 | 25 |
| Layer (II) | SiH$_4$/He = 0.5<br>NO | SiH$_4$ = 100 | SiH$_4$/NO = 1 | 0.18 | 10 | 0.5 |

(*) (**) ... Flow rate ratio is changed according to the change rate curve previously designed.

TABLE 4B

| Depth profile of N | Sample No. | Depth profile of impurity atoms | | | | | |
|---|---|---|---|---|---|---|---|
| | | 4201 | 4202 | 4203 | 4204 | 4205 | 4206 |
| 4401 | | 21-1B | 22-1B | 23-1B | 24-1B | 25-1B | 26-1B |
| 4402 | | 21-2B | 22-2B | 23-2B | 24-2B | 25-2B | 26-2B |
| 4403 | | 21-3B | 22-3B | 23-3B | 24-3B | 25-3B | 26-3B |
| 4404 | | 21-4B | 22-4B | 23-4B | 24-4B | 25-4B | 26-4B |
| 4405 | | 21-5B | 22-5B | 23-5B | 24-5B | 25-5B | 26-5B |
| 4406 | | 21-6B | 22-6B | 23-6B | 24-6B | 24-6B | 26-6B |
| 4407 | | 21-7B | 22-7B | 23-7B | 24-7B | 25-7B | 26-7B |
| 4408 | | 21-8B | 22-8B | 23-8B | 24-8B | 25-8B | 26-8B |
| 4409 | | 21-9B | 22-9B | 23-9B | 24-9B | 25-9B | 26-9B |
| 4410 | | 21-10B | 22-10B | 23-10B | 24-10B | 25-10B | 26-10B |

TABLE 5B

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer region (G) | GeF$_4$/He = 0.5<br>SiF$_4$/He = 0.5<br>H$_2$<br>NH$_3$ | SiF$_4$ + GeF$_4$ = 200 | $\dfrac{(GeF_4 + SiF_4)}{(GeF_4 + SiF_4 + H_2)} = \dfrac{7}{10}$<br><br>$\dfrac{GeF_4}{(GeF_4 + SiF_4 + H_2)} = \dfrac{1}{100}$<br><br>$\dfrac{NH_3}{GeF_4 + SiF_4} = (*)$ | 0.18 | 15 | 3 |
| Second layer | SiH$_4$/He = 0.5<br>B$_2$H$_6$/He = 1 × 10$^{-3}$ | SiH$_4$ = 200 | $\dfrac{B_2H_6}{SiH_4} = (**)$ | 0.18 | 15 | 25 |

TABLE 5B-continued

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| region (S) | (PH$_3$/He = 1 × 10$^{-3}$) | | $\dfrac{NH_3}{SiH_4}$ = (***) | | | |
| Layer (II) | SiH$_4$/He = 0.5<br>NO | SiH$_4$ = 100 | SiH$_4$/NO = 1 | 0.18 | 10 | 0.5 |

(*) () (*) ... Flow rate ratio is changed according to the change rate curve previously designed.

TABLE 6B

| Depth profile of N | | Depth profile impurity atoms | | | | | |
|---|---|---|---|---|---|---|---|
| | Sample No. | 4201 | 4202 | 4203 | 4204 | 4205 | 4206 |
| 4401 4302 | | 31-1B | 32-1B | 33-1B | 34-1B | 35-1B | 36-1B |
| 4402 4301 | | 31-2B | 32-2B | 33-2B | 34-2B | 35-2B | 36-2B |
| 4403 4304 | | 31-3B | 32-3B | 33-3B | 34-3B | 35-3B | 36-3B |
| 4404 4305 | | 31-4B | 32-4B | 33-4B | 34-4B | 35-4B | 36-4B |
| 4405 4306 | | 31-5B | 32-5B | 33-5B | 34-5B | 35-5B | 36-5B |
| 4406 4307 | | 31-6B | 32-6B | 33-6B | 34-6B | 35-6B | 36-6B |
| 4407 4308 | | 31-7B | 32-7B | 33-7B | 34-7B | 35-7B | 36-7B |
| 4408 4309 | | 31-8B | 32-8B | 33-8B | 34-8B | 35-8B | 36-8B |
| 4409 4310 | | 31-9B | 32-9B | 33-9B | 34-9B | 35-9B | 36-9B |
| 4410 4311 | | 31-10B | 32-10B | 33-10B | 34-10B | 35-10B | 36-10B |
| 4410 4312 | | 31-11B | 32-11B | 33-11B | 34-11B | 35-11B | 36-11B |
| 4410 4313 | | 31-12B | 32-12B | 33-12B | 34-12B | 35-12B | 36-12B |
| 4407 4307 | | 31-13B | 32-13B | 33-13B | 34-13B | 35-13B | 36-13B |
| 4407 4309 | | 31-14B | 32-14B | 33-14B | 34-14B | 35-14B | 36-14B |
| 4408 4308 | | 31-15B | 32-15B | 33-15B | 34-15B | 35-15B | 36-15B |
| 4408 4310 | | 31-16B | 32-16B | 33-16B | 34-16B | 35-16B | 36-16B |

TABLE 7B

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | GeH$_4$/He = 0.5<br>SiH$_4$/He = 0.5 | SiH$_4$ + GeH$_4$ = 200 | $\dfrac{GeH_4}{GeH_4 + SiH_4 + H_2}$ = (*) | 0.18 | 15 | 3 |
| region (G) | N$_2$<br>NH$_3$ | | $\dfrac{NH_3}{GeH_4 + SiH_4}$ = (**) | | | |
| Second layer | SiH$_4$/He = 0.5<br>B$_2$H$_6$/He = 1 × 10$^{-3}$ | SiH$_4$ = 200 | $\dfrac{B_2H_6}{SiH_4}$ = (***) | 0.18 | 15 | 25 |
| Layer (II) | SiH$_4$/He = 0.5<br>NO | SiH$_4$ = 100 | SiH$_4$/NO = 1 | 0.18 | 10 | 0.5 |

(*) () (*) ... Flow rate ratio is changed according to the change rate curve previously designed.

TABLE 8B

| Depth profile of Ge and N | | Depth profile of impurity atoms | | | | | |
|---|---|---|---|---|---|---|---|
| | Sample No. | 4201 | 4202 | 4203 | 4204 | 4205 | 4206 |
| 4301 | | 41-1B | 42-1B | 43-1B | 44-1B | 45-1B | 46-1B |

TABLE 8B-continued

| Depth profile of Ge and N | Sample No. | Depth profile of impurity atoms | | | | | |
|---|---|---|---|---|---|---|---|
| | | 4201 | 4202 | 4203 | 4204 | 4205 | 4206 |
| 4501 | | | | | | | |
| 4302 | | 41-2B | 42-2B | 43-2B | 44-2B | 45-2B | 46-2B |
| 4502 | | | | | | | |
| 4303 | | 41-3B | 42-3B | 43-3B | 44-3B | 45-3B | 46-3B |
| 4503 | | | | | | | |
| 4304 | | 41-4B | 42-4B | 43-4B | 44-4B | 45-4B | 46-4B |
| 4504 | | | | | | | |
| 4305 | | 41-5B | 42-5B | 43-5B | 44-5B | 45-5B | 46-5B |
| 4505 | | | | | | | |
| 4306 | | 41-6B | 42-6B | 43-6B | 44-6B | 45-6B | 46-6B |
| 4506 | | | | | | | |
| 4307 | | 41-7B | 42-7B | 43-7B | 44-7B | 45-7B | 46-7B |
| 4507 | | | | | | | |
| 4308 | | 41-8B | 42-8B | 43-8B | 44-8B | 45-8B | 46-8B |
| 4504 | | | | | | | |
| 4308 | | 41-9B | 42-9B | 43-9B | 44-9B | 45-9B | 46-9B |
| 4505 | | | | | | | |
| 4309 | | 41-10B | 42-10B | 43-10B | 44-10B | 45-10B | 46-10B |
| 4506 | | | | | | | |
| 4310 | | 41-11B | 42-11B | 43-11B | 44-11B | 45-11B | 46-11B |
| 4507 | | | | | | | |
| 4311 | | 41-12B | 42-12B | 43-12B | 44-12B | 45-12B | 46-12B |
| 4507 | | | | | | | |
| 4312 | | 41-13B | 42-13B | 43-13B | 44-13B | 45-13B | 46-13B |
| 4504 | | | | | | | |
| 4313 | | 41-14B | 42-14B | 43-14B | 44-14B | 45-14B | 46-14B |
| 4505 | | | | | | | |
| 4308 | | 41-15B | 42-15B | 43-15B | 44-15B | 45-15B | 46-15B |
| 4506 | | | | | | | |
| 4309 | | 41-16B | 42-16B | 43-16B | 44-16B | 45-16B | 46-16B |
| 4503 | | | | | | | |

TABLE 9B

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer region (G) | GeH$_4$/He = 0.5<br>SiH$_4$/He = 0.5 | SiH$_4$ + GeH$_4$ = 200 | $\frac{GeH_4}{GeH_4 + SiH_4} = (*)$ | 0.18 | 15 | 3 |
| Second layer region (S) | SiH$_4$/He = 0.5<br>B$_2$H$_6$/He = 1 × 10$^{-3}$<br>(PH$_3$/He = 1 × 10$^{-3}$)<br>NH$_3$ | SiH$_4$ = 200 | $\frac{B_2H_6}{SiH_4} = (*)$<br>$\frac{NH_2}{SiH_4} = (***)$ | 0.18 | 15 | 25 |
| Layer (II) | SiH$_4$/He = 0.5<br>NO | SiH$_4$ = 100 | SiH$_4$/NO = 1 | 0.18 | 10 | 0.5 |

(*) () (*) . . . Flow rate ratio is changed according to the change rate curve previously designed.

TABLE 10B

| Depth profile of Ge and N | Sample No. | Depth profile of impurity atoms | | | | | |
|---|---|---|---|---|---|---|---|
| | | 4201 | 4202 | 4203 | 4204 | 4205 | 4206 |
| 4401 | | 51-1B | 52-1B | 53-1B | 54-1B | 55-1B | 56-1B |
| 4501 | | | | | | | |
| 4402 | | 51-2B | 52-2B | 53-2B | 54-2B | 55-2B | 56-2B |
| 4502 | | | | | | | |
| 4403 | | 51-3B | 52-3B | 53-3B | 54-3B | 55-3B | 56-3B |
| 4503 | | | | | | | |
| 4404 | | 51-4B | 52-4B | 53-4B | 54-4B | 55-4B | 56-4B |
| 4504 | | | | | | | |
| 4405 | | 51-5B | 52-5B | 53-5B | 54-5B | 55-5B | 56-5B |
| 4505 | | | | | | | |
| 4406 | | 51-6B | 52-6B | 53-6B | 54-6B | 55-6B | 56-6B |
| 4506 | | | | | | | |
| 4407 | | 51-7B | 52-7B | 53-7B | 54-7B | 55-7B | 56-7B |
| 4507 | | | | | | | |
| 4408 | | 51-8B | 52-8B | 53-8B | 54-8B | 55-8B | 56-8B |

TABLE 10B-continued

| Depth profile of Ge and N | Sample No. | Depth profile of impurity atoms |  |  |  |  |  |
|---|---|---|---|---|---|---|---|
| | | 4201 | 4202 | 4203 | 4204 | 4205 | 4206 |
| 4504 4409 4509 | | 51-9B | 52-9B | 53-9B | 54-9B | 55-9B | 56-9B |
| 4410 4501 | | 51-10B | 52-10B | 53-10B | 54-10B | 55-10B | 56-10B |
| 4407 4505 | | 51-11B | 52-11B | 53-11B | 54-11B | 55-11B | 56-11B |
| 4408 4506 | | 51-12B | 52-12B | 53-12B | 54-12B | 55-12B | 56-12B |

TABLE 11B

| Layer constitution | Gases employed | Flow rate (SCCM) | Flow rate ratio | Discharging power (W/cm$^2$) | Layer formation rate (Å/sec) | Layer thickness (μ) |
|---|---|---|---|---|---|---|
| Layer (I) | | | | | | |
| First layer | GeH$_4$/He = 0.5<br>SiH$_4$/He = 0.5 | SiH$_4$ + GeH$_4$ = 200 | $\frac{GeH_4}{GeH_4 + SiH_4} = (*)$ | 0.18 | 15 | 3 |
| region (G) | NH$_3$ | | $\frac{NH_3}{GeH + SiH_4} = (**)$ | | | |
| Second layer | SiH$_4$/He = 0.5<br>B$_2$H$_6$/He = 1 × 10$^{-3}$ | SiH$_4$ = 200 | $\frac{B_2H_6}{SiH_4} = (***)$ | 0.18 | 15 | 25 |
| region (S) | (PH$_3$/He = 1 × 10$^{-3}$)<br>NH$_3$ | | $\frac{NH_3}{SiH_3} = (***)$ | | | |
| Layer (II) | SiH$_4$/He = 0.5<br>NO | SiH$_4$ = 100 | SiH$_4$/NO = 1 | 0.18 | 10 | 0.5 |

(*) () (*) ... Flow rate ratio is changed according to the change rate curve previously designed.

TABLE 12B

| Depth profile of N | Sample No. | Depth profile of B and Ge |  |  |  |  |  |  |  |  |  |
|---|---|---|---|---|---|---|---|---|---|---|---|
| | | 4201<br>4501 | 4202<br>4502 | 4203<br>4503 | 4204<br>4504 | 4205<br>4505 | 4206<br>4506 | 4201<br>4507 | 4202<br>4504 | 4204<br>4505 | 4205<br>4506 |
| 4401 4301 | | 61-1B | 62-1B | 63-1B | 64-1B | 65-1B | 66-1B | 67-1B | 68-1B | 69-1B | 610-1B |
| 4402 4302 | | 61-2B | 62-2B | 63-2B | 64-2B | 65-2B | 66-2B | 67-2B | 68-2B | 69-2B | 610-2B |
| 4403 4303 | | 61-3B | 62-3B | 63-3B | 64-3B | 65-3B | 66-3B | 67-3B | 68-3B | 69-3B | 610-3B |
| 4404 4304 | | 61-4B | 62-4B | 63-4B | 64-4B | 65-4B | 66-4B | 67-4B | 68-4B | 69-4B | 610-4B |
| 4405 4305 | | 61-5B | 62-5B | 63-5B | 64-5B | 65-5B | 66-5B | 67-5B | 68-5B | 69-5B | 610-5B |
| 4406 4306 | | 61-6B | 62-6B | 63-6B | 64-6B | 65-6B | 66-6B | 67-6B | 68-6B | 69-6B | 610-6B |
| 4407 4307 | | 61-7B | 62-7B | 63-7B | 64-7B | 65-7B | 66-7B | 67-7B | 68-7B | 69-7B | 610-7B |
| 4408 4308 | | 61-8B | 62-8B | 63-8B | 64-8B | 65-8B | 66-8B | 67-8B | 68-8B | 69-8B | 610-8B |
| 4409 4309 | | 61-9B | 62-9B | 63-9B | 64-9B | 65-9B | 66-9B | 67-9B | 68-9B | 69-9B | 610-9B |
| 4410 4310 | | 61-10B | 62-10B | 63-10B | 64-10B | 65-10B | 66-10B | 67-10B | 68-10B | 69-10B | 610-10B |
| 4409 4311 | | 61-11B | 62-11B | 63-11B | 64-11B | 65-11B | 66-11B | 67-11B | 68-11B | 69-11B | 610-11B |
| 4410 4312 | | 61-12B | 62-12B | 63-12B | 64-12B | 65-12B | 66-12B | 67-12B | 68-12B | 69-12B | 610-12B |
| 4410 4313 | | 61-13B | 62-13B | 63-13B | 64-13B | 65-13B | 66-13B | 67-13B | 68-13B | 69-13B | 610-13B |

TABLE 13B

| Conditions | Gases employed | Flow rate (CCM) | Flow rate ratio or area ratio | Discharging power (W/cm$^2$) | Layer thickness (μ) |
|---|---|---|---|---|---|
| 13-1B | Ar (NO/Ar) | 200 (1/1) | Si wafer:SiO$_2$ = 1:30 | 0.3 | 0.5 |

TABLE 13B-continued

| Conditions | Gases employed | Flow rate (CCM) | Flow rate ratio or area ratio | Discharging power (W/cm$^2$) | Layer thickness ($\mu$) |
|---|---|---|---|---|---|
| 13-2B | Ar (NO/Ar) | 200 (1/1) | Si wafer:SiO$_2$ = 1:60 | 0.3 | 0.3 |
| 13-3B | Ar (NO/Ar) | 200 (1/1) | Si wafer:SiO$_2$ = 6:4 | 0.3 | 1.0 |
| 13-4B | SiH$_4$/He = 1 NO | SiH$_4$ = 15 | SiH$_4$:NO = 5:1 | 0.18 | 0.3 |
| 13-5B | SiH$_4$/He = 0.5 NO | SiH$_4$ = 100 | SiH$_4$:NO = 1:1 | 0.18 | 1.5 |
| 13-6B | SiH$_4$/He = 0.5 SiF$_4$/He = 0.5 NO | SiH$_4$ + SiF$_4$ = 150 | SiH$_4$:SiF$_4$:NO = 2:1:1 | 0.18 | 0.5 |
| 13-7B | SiH$_4$/He = 0.5 SiF$_4$/He = 0.5 NO | SiH$_4$ + SiF$_4$ = 15 | SiH$_4$:SiF$_4$:NO = 2:1:4 | 0.18 | 0.3 |
| 13-8B | SiH$_4$/He = 0.5 SiF$_4$/He = 0.5 NO | SiH$_4$ + SiF$_4$ = 150 | SiH$_4$:SiF$_4$:NO = 1:1:3 | 0.18 | 1.5 |

TABLE 14B

| Layer (II) forming conditions | Sample No./Evaluation | | |
|---|---|---|---|
| 13-1B | 11-1-1B  O O | 12-1-1B  O O | 13-1-1B  O O |
| 13-2B | 11-1-2B  O O | 12-1-2B  O O | 13-1-2B  O O |
| 13-3B | 11-1-3B  O O | 12-1-3B  O O | 13-1-3B  O O |
| 13-4B | 11-1-4B  ⊙ ⊙ | 12-1-4B  ⊙ ⊙ | 13-1-4B  ⊙ ⊙ |
| 13-5B | 11-1-5B  ⊙ ⊙ | 12-1-5B  ⊙ ⊙ | 13-1-5B  ⊙ ⊙ |
| 13-6B | 11-1-6B  ⊙ ⊙ | 12-1-6B  ⊙ ⊙ | 13-1-6B  ⊙ ⊙ |
| 13-7B | 11-1-7B  O O | 12-1-7B  O O | 13-1-7B  O O |
| 13-8B | 11-1-8B  O O | 12-1-8B  O O | 13-1-8B  O O |

Sample No.
Overall image quality evaluation   Durability evaluation

Evaluation standard:
⊙ — Excellent
O — Good

TABLE 15B

| Sample No. | 1501B | 1502B | 1503B | 1504B | 1505B | 1506B | 1507B |
|---|---|---|---|---|---|---|---|
| Si:SiO$_2$ target (Area ratio) (NO/Ar) | 9:1 (0/1) | 6.5:3.5 (1/1) | 4:10 (1/1) | 2:60 (1/1) | 1:100 (2/1) | 1:100 (3/1) | 1:100 (4/1) |
| Si:O (Content ratio) | 9.7:0.3 | 8.8:1.2 | 7.3:2.7 | 5.0:5.0 | 4.5:5.5 | 4:6 | 3:7 |
| Image quality evaluation | Δ | ⊙ | ⊙ | O | O | Δ | X |

⊙: Very good
O: Good
Δ: Practically satisfactory
X: Image defect formed

TABLE 16B

| Sample No. | 1601B | 1602B | 1603B | 1604B | 1605B | 1606B | 1607B |
|---|---|---|---|---|---|---|---|
| SiH$_4$:NO (Flow rate ratio) | 1000:1 | 99:1 | 5:1 | 1:1 | 1:2 | 3:10 | 1:1000 |
| Si:O (Content ratio) | 9.9999:0.0001 | 9.9:0.1 | 9:1 | 6:4 | 5:5 | 3.3:6.7 | 2:8 |
| Image quality evaluation | Δ | O | ⊙ | ⊙ | O | Δ | X |

⊙: Very good
O: Good
Δ: Practically satisfactory
X: Image defect formed

TABLE 17B

| Sample No. | 1701B | 1702B | 1703B | 1704B | 1705B | 1706B | 1707B |
|---|---|---|---|---|---|---|---|
| SiH$_4$:SiF$_4$:NO (Flow rate ratio) | 500:400:1 | 50:50:1 | 5:5:2 | 5:5:10 | 1:1:4 | 3:3:20 | 1:1:2000 |
| Si:O (Content ratio) | 9.9998:0.0002 | 9.8:0.2 | 8.8:1.2 | 6.3:3.7 | 5.1:4.9 | 3.5:6.5 | 2.3:7.7 |
| Image quality | Δ | O | ⊙ | ⊙ | O | Δ | X |

TABLE 17B-continued

| Sample No. | 1701B | 1702B | 1703B | 1704B | 1705B | 1706B | 1707B |
|---|---|---|---|---|---|---|---|
| evaluation | | | | | | | |

⊚: Very good
O: Good
Δ: Practically satisfactory
X: Image defect formed

TABLE 18B

| Sample No. | Thickness of layer (II) (μ) | Results |
|---|---|---|
| 1801B | 0.001 | Image defect liable to be formed |
| 1802B | 0.02 | No image defect formed up to successive copying for 20,000 times |
| 1803B | 0.05 | Stable up to successive copying for 50,000 times |
| 1804B | 1 | Stable up to successive copying for 200,000 times |

TABLE 2C

| Depth profile of N | Sample No. | Depth profile of impurity atoms |||||| 
|---|---|---|---|---|---|---|---|
| | | 4201 | 4202 | 4203 | 4204 | 4205 | 4206 |
| 4301 | | 11-1C | 12-1C | 13-1C | 14-1C | 15-1C | 16-1C |
| 4302 | | 11-2C | 12-2C | 13-2C | 14-2C | 15-2C | 16-2C |
| 4303 | | 11-3C | 12-3C | 13-3C | 14-3C | 15-3C | 16-3C |
| 4304 | | 11-4C | 12-4C | 13-4C | 14-4C | 15-4C | 16-4C |
| 4305 | | 11-5C | 12-5C | 13-5C | 14-5C | 15-5C | 16-5C |
| 4306 | | 11-6C | 12-6C | 13-6C | 14-6C | 15-6C | 16-6C |
| 4307 | | 11-7C | 12-7C | 13-7C | 14-7C | 15-7C | 16-7C |
| 4308 | | 11-8C | 12-8C | 13-8C | 14-8C | 15-8C | 16-8C |
| 4309 | | 11-9C | 12-9C | 13-9C | 14-9C | 15-9C | 16-9C |
| 4310 | | 11-10C | 12-10C | 13-10C | 14-10C | 15-10C | 16-10C |
| 4311 | | 11-11C | 12-11C | 13-11C | 14-11C | 15-11C | 16-11C |
| 4312 | | 11-12C | 12-12C | 13-12C | 14-12C | 15-12C | 16-12C |
| 4313 | | 11-13C | 12-13C | 13-13C | 14-13C | 15-13C | 16-13C |

TABLE 1C

| Layer constitution | Gases employed | Flow rate (SCCM) | Flow rate ratio | Discharging power (W/cm$^2$) | Layer formation rate (Å/sec) | Layer thickness (μ) |
|---|---|---|---|---|---|---|
| Layer (I) | | | | | | |
| First layer | GeH$_4$/He = 0.5<br>SiH$_4$/He = 0.5 | GeH$_4$ + SiH$_4$ = 200 | $\frac{(GeH_4 + SiH_4)}{(GeH_4 + SiH_4 + H_2)} = \frac{7}{10}$ | 0.18 | 15 | 3 |
| region (G) | H$_2$<br>NH$_3$ | | $\frac{GeH_4}{(GeH_4 + SiH_4 + H_2)} = \frac{1}{100}$<br><br>$\frac{NH_3}{(GeH_4 + SiH_4)} = (*)$ | | | |
| Second layer | SiH$_4$/He = 0.5<br>B$_2$H$_6$/He = 1 × 10$^{-3}$ | SiH$_4$ = 200 | $\frac{B_2H_6}{SiH_4} = (**)$ | 0.18 | 15 | 25 |
| region (S) | (PH$_3$/He = 1 × 10$^{-3}$) | | | | | |
| Layer (II) | SiH$_4$/He = 0.5<br>C$_2$H$_4$ | SiH$_4$ = 100 | SiH$_4$/C$_2$H$_4$ = 3/7 | 0.18 | 10 | 0.5 |

(*) (**) . . . Flow rate ratio is changed according to the change rate curve previously designed.

TABLE 3C

| Layer constitution | Gases employed | Flow rate (SCCM) | Flow rate ratio | Discharging power (W/cm$^2$) | Layer formation rate (Å/sec) | Layer thickness (μ) |
|---|---|---|---|---|---|---|
| Layer (I) | | | | | | |
| First layer | GeF$_4$/He = 0.5<br>SiF$_4$/He = 0.5 | GeF$_4$ + SiF$_4$ = 200 | $\frac{(GeF_4 + SiF_4)}{(GeF_4 + SiF_4 + H_2)} = \frac{7}{10}$ | 0.18 | 15 | 3 |
| region (G) | H$_2$ | | $\frac{GeF_4}{(GeF_4 + SiF_4 + H_2)} = \frac{1}{100}$ | | | |
| Second layer | SiH$_4$/He = 0.5<br>B$_2$H$_6$/He = 1 × 10$^{-3}$ | SiH$_4$ = 200 | $\frac{B_2H_6}{SiH_4} = (*)$ | 0.18 | 15 | 25 |
| region (S) | (PH$_3$/He = 1 × 10$^{-3}$)<br>NH$_3$ | | $\frac{NH_3}{SiH_4} = (**)$ | | | |
| Layer (II) | SiH$_4$/He = 0.5<br>C$_2$H$_4$ | SiH$_4$ = 100 | SiH$_4$/C$_2$H$_4$ = 3/7 | 0.18 | 10 | 0.5 |

(*) (**) . . . Flow rate ratio is changed according to the change rate curve previously designed.

TABLE 4C

| Depth profile of N | Sample No. | Depth profile of impurity atoms | | | | | |
|---|---|---|---|---|---|---|---|
| | | 4201 | 4202 | 4203 | 4204 | 4205 | 4206 |
| 4401 | | 21-1C | 22-1C | 23-1C | 24-1C | 25-1C | 26-1C |
| 4402 | | 21-2C | 22-2C | 23-2C | 24-2C | 25-2C | 26-2C |
| 4403 | | 21-3C | 22-3C | 23-3C | 24-3C | 25-3C | 26-3C |
| 4404 | | 21-4C | 22-4C | 23-4C | 24-4C | 25-4C | 26-4C |
| 4405 | | 21-5C | 22-5C | 23-5C | 24-5C | 25-5C | 26-5C |
| 4406 | | 21-6C | 22-6C | 23-6C | 24-6C | 25-6C | 26-6C |
| 4407 | | 21-7C | 22-7C | 23-7C | 24-7C | 25-7C | 26-7C |
| 4408 | | 21-8C | 22-8C | 23-8C | 24-8C | 25-8C | 26-8C |
| 4409 | | 21-9C | 22-9C | 23-9C | 24-9C | 25-9C | 26-9C |
| 4410 | | 21-10C | 22-10C | 23-10C | 24-10C | 25-10C | 26-10C |

TABLE 5C

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | GeF$_4$/He = 0.5<br>SiF$_4$/He = 0.5 | GeF$_4$ + SiF$_4$ = 200 | $\frac{(GeF_4 + SiF_4)}{(GeF_4 + SiF_4 + H_2)} = \frac{7}{10}$ | 0.18 | 15 | 3 |
| region (G) | H$_2$<br>NH$_3$ | | $\frac{GeF_4}{(GeF_4 + SiF_4 + H_2)} = \frac{1}{100}$ | | | |
| | | | $\frac{NH_3}{(GeF_4 + SiF_4)} = (*)$ | | | |
| Second layer | SiH$_4$/He = 0.5<br>B$_2$H$_6$/He = 1 × 10$^{-3}$ | SiH$_4$ = 200 | $\frac{B_2H_6}{SiH_4} = (**)$ | 0.18 | 15 | 25 |
| region (S) | (PH$_3$/He = 1 × 10$^{-3}$)<br>NH$_3$ | | $\frac{NH_3}{SiH_4} = (***)$ | | | |
| Layer (II) | SiH$_4$/He = 0.5<br>C$_2$H$_4$ | SiH$_4$ = 100 | SiH$_4$/C$_2$H$_4$ = 3/7 | 0.18 | 10 | 0.5 |

(*) () (*) ... Flow rate ratio is changed according to the change rate curve previously designed.

TABLE 6C

| Depth profile of N | Sample No. | Depth profile of impurity atoms | | | | | |
|---|---|---|---|---|---|---|---|
| | | 4201 | 4202 | 4203 | 4204 | 4205 | 4206 |
| 4401 4302 | | 31-1C | 32-1C | 33-1C | 34-1C | 35-1C | 36-1C |
| 4402 4301 | | 31-2C | 32-2C | 33-2C | 34-2C | 35-2C | 36-2C |
| 4403 4304 | | 31-3C | 32-3C | 33-3C | 34-3C | 35-3C | 36-3C |
| 4404 4305 | | 31-4C | 32-4C | 33-4C | 34-4C | 35-4C | 36-4C |
| 4405 4306 | | 31-5C | 32-5C | 33-5C | 34-5C | 35-5C | 36-5C |
| 4406 4307 | | 31-6C | 32-6C | 33-6C | 34-6C | 35-6C | 36-6C |
| 4407 4308 | | 31-7C | 32-7C | 33-7C | 34-7C | 35-7C | 37-7C |
| 4408 4309 | | 31-8C | 32-8C | 33-8C | 34-8C | 35-8C | 37-8C |
| 4409 4310 | | 31-9C | 32-9C | 33-9C | 34-9C | 35-9C | 36-9C |
| 4410 4311 | | 31-10C | 32-10C | 33-10C | 34-10C | 35-10C | 36-10C |
| 4410 4312 | | 31-11C | 32-11C | 33-11C | 34-11C | 35-11C | 36-11C |
| 4410 4313 | | 31-12C | 32-12C | 33-12C | 34-12C | 35-12C | 36-12C |
| 4407 4308 | | 31-13C | 32-13C | 33-13C | 34-13C | 35-13C | 36-13C |
| 4407 4309 | | 31-14C | 32-14C | 33-14C | 34-14C | 35-14C | 36-14C |
| 4408 4308 | | 31-15C | 32-15C | 33-15C | 34-15C | 35-15C | 36-15C |
| 4408 4309 | | 31-16C | 32-16C | 33-16C | 34-16C | 35-16C | 36-16C |

TABLE 7C

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer | GeH$_4$/He = 0.5<br>SiH$_4$/He = 0.5 | SiH$_4$ GeH$_4$ = 200 | $\frac{GeH_4}{(SiH_4 + GeH_4 + H_2)} = (*)$ | 0.18 | 15 | 3 |
| region (G) | H$_2$<br>NH$_3$ | | $\frac{NH_3}{(SiH_4 + GeH_4)} = (**)$ | | | |
| Second layer | SiH$_4$/He = 0.5<br>B$_2$H$_6$/He = 1 × 10$^{-3}$ | SiH$_4$ = 200 | $\frac{B_2H_6}{SiH_4} = (***)$ | 0.18 | 15 | 25 |
| region (S) | (PH$_3$/He = 1 × 10$^{-3}$) | | | | | |
| Layer (II) | SiH$_4$/He = 0.5 | SiH$_4$ = 100 | SiH$_4$/C$_2$H$_4$ = 3/7 | 0.18 | 10 | 0.5 |

TABLE 7C-continued

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| | C$_2$H$_4$ | | | | | |

(*) () (*) . . . Flow rate ratio is changed according to the change rate curve previously designed.

TABLE 8C

| Depth profile of Ge and N | Sample No. | Depth profile of impurity atoms | | | | | |
|---|---|---|---|---|---|---|---|
| | | 4201 | 4202 | 4203 | 4204 | 4205 | 4206 |
| 4301 4501 | | 41-1C | 42-1C | 43-1C | 44-1C | 45-1C | 46-1C |
| 4302 4502 | | 41-2C | 42-2C | 43-2C | 44-2C | 45-2C | 46-2C |
| 4303 4503 | | 41-3C | 42-3C | 43-3C | 44-3C | 45-3C | 46-3C |
| 4304 4504 | | 41-4C | 42-4C | 43-4C | 44-4C | 45-4C | 46-4C |
| 4305 4505 | | 41-5C | 42-5C | 43-5C | 44-5C | 45-5C | 46-5C |
| 4306 4506 | | 41-6C | 42-6C | 43-6C | 44-6C | 45-6C | 46-6C |
| 4307 4507 | | 41-7C | 42-7C | 43-7C | 44-7C | 45-7C | 46-7C |
| 4308 4504 | | 41-8C | 42-8C | 43-8C | 44-8C | 45-8C | 46-8C |
| 4308 4505 | | 41-9C | 42-9C | 43-9C | 44-9C | 45-9C | 46-9C |
| 4309 4506 | | 41-10C | 42-10C | 43-10C | 44-10C | 45-10C | 46-10C |
| 4310 4507 | | 41-11C | 42-11C | 43-11C | 44-11C | 45-11C | 46-11C |
| 4311 4507 | | 41-12C | 42-12C | 43-12C | 44-12C | 45-12C | 46-12C |
| 4312 4504 | | 41-13C | 42-13C | 43-13C | 44-13C | 45-13C | 46-13C |
| 4313 4505 | | 41-14C | 42-14C | 43-14C | 44-14C | 45-14C | 46-14C |
| 4308 4506 | | 41-15C | 42-15C | 43-15C | 44-15C | 45-15C | 46-15C |
| 4309 4503 | | 41-16C | 42-16C | 43-16C | 44-16C | 45-16C | 46-16C |

TABLE 9C

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) First layer | GeH$_4$/He = 0.5 SiH$_4$/He = 0.5 | SiH$_4$ + GeH$_4$ = 200 | $\frac{GeH_4}{(SiH_4 + GeH_4)}$ = (*) | 0.18 | 15 | 3 |
| region (G) | SiH$_4$/He = 0.5 | | | | | |
| Second layer | SiH$_4$/He = 0.5 B$_2$H$_6$/He = 1 × 10$^{-3}$ | SiH$_4$ = 200 | $\frac{B_2H_6}{SiH_4}$ = (**) | 0.18 | 15 | 25 |
| region (S) | (PH$_3$/He = 1 × 10$^{-3}$) NH$_3$ | | $\frac{NH_3}{SiH_4}$ = (***) | | | |
| Layer (II) | SiH$_4$/He = 0.5 C$_2$H$_4$ | SiH$_4$ = 100 | SiH$_4$/C$_2$H$_4$ = 3/7 | 0.18 | 10 | 0.5 |

(*) () (*) . . . Flow rate ratio is changed according to the change rate curve previously designed.

TABLE 10C

| Depth profile of Ge and N | Sample No. | Depth profile of impurity atoms | | | | | |
|---|---|---|---|---|---|---|---|
| | | 4201 | 4202 | 4203 | 4204 | 4205 | 4206 |
| 4401 4501 | | 51-1C | 52-1C | 53-1C | 54-1C | 55-1C | 56-1C |
| 4402 | | 51-2C | 52-2C | 53-2C | 54-2C | 55-2C | 56-2C |

TABLE 10C-continued

| Depth profile of Ge and N | Sample No. | Depth profile of impurity atoms | | | | | |
|---|---|---|---|---|---|---|---|
| | | 4201 | 4202 | 4203 | 4204 | 4205 | 4206 |
| 4502 4403 4503 | | 51-3C | 52-3C | 53-3C | 54-3C | 55-3C | 56-3C |
| 4404 4504 | | 51-4C | 52-4C | 53-4C | 54-4C | 55-4C | 56-4C |
| 4405 4505 | | 51-5C | 52-5C | 53-5C | 54-5C | 55-5C | 56-5C |
| 4406 4506 | | 51-6C | 52-6C | 53-6C | 54-6C | 55-6C | 56-6C |
| 4407 4507 | | 51-7C | 52-7C | 53-7C | 54-7C | 55-7C | 56-7C |
| 4408 4504 | | 51-8C | 52-8C | 53-8C | 54-8C | 55-8C | 56-8C |
| 4409 4505 | | 51-9C | 52-9C | 53-9C | 54-9C | 55-9C | 56-9C |
| 4410 4501 | | 51-10C | 52-10C | 53-10C | 54-10C | 55-10C | 56-10C |
| 4407 4505 | | 51-11C | 52-11C | 53-11C | 54-11C | 55-11C | 56-11C |
| 4408 4506 | | 51-12C | 52-12C | 53-12C | 54-12C | 55-12C | 56-12C |

TABLE 11C

| Layer constitution | Gases employed | Flow rate (SCCM) | Flow rate ratio | Discharging power (W/cm$^2$) | Layer formation rate (Å/sec) | Layer thickness ($\mu$) |
|---|---|---|---|---|---|---|
| Layer (I) | | | | | | |
| First layer region (G) | GeH$_4$/He = 0.5<br>SiH$_4$/He = 0.5<br>NH$_3$ | SiH$_4$ + GeH$_4$ = 200 | $\frac{GeH_4}{(GeH_4 + SiH_4)} = (*)$<br><br>$\frac{NH_3}{(GeH_4 + SiH_4)} = (**)$ | 0.18 | 15 | 3 |
| Second layer region (S) | SiH$_4$/He = 0.5<br>B$_2$H$_6$/He = 1 × 10$^{-3}$<br>(PH$_3$/He = 1 × 10$^{-3}$)<br>NH$_3$ | SiH$_4$ = 200 | $\frac{B_2H_6}{SiH_4} = (*)$<br><br>$\frac{NH_3}{SiH_4} = (**)$ | 0.18 | 15 | 25 |
| Layer (II) | SiH$_4$/He = 0.5<br>C$_2$H$_4$ | SiH$_4$ = 100 | SiH$_4$/C$_2$H$_4$ = 3/7 | 0.18 | 10 | 0.5 |

(*) () (*) (****) ... Flow rate ratio is changed according to the change rate curve previously designed.

TABLE 12C

| Depth profile of N | Sample No. | Depth profile of B and Ge | | | | | | | | |
|---|---|---|---|---|---|---|---|---|---|---|
| | | 4201 4501 | 4202 4502 | 4203 4503 | 4204 4504 | 4205 4505 | 4206 5406 | 4201 4507 | 4202 4504 | 4204 4505 | 4205 4506 |
| 4401 4301 | | 61-1C | 62-1C | 63-1C | 64-1C | 65-1C | 66-1C | 67-1C | 68-1C | 69-1C | 610-1C |
| 4402 4302 | | 61-2C | 62-2C | 63-2C | 64-2C | 65-2C | 66-2C | 67-2C | 68-2C | 69-2C | 610-2C |
| 4403 4303 | | 61-3C | 62-3C | 63-3C | 64-3C | 65-3C | 66-3C | 67-3C | 68-3C | 69-3C | 610-3C |
| 4404 4304 | | 61-4C | 62-4C | 63-4C | 64-4C | 65-4C | 66-4C | 67-4C | 68-4C | 69-4C | 610-4C |
| 4405 4305 | | 61-5C | 62-5C | 63-5C | 64-5C | 65-5C | 66-5C | 67-5C | 68-5C | 69-5C | 610-5C |
| 4406 4306 | | 61-6C | 62-6C | 63-6C | 64-6C | 65-6C | 66-6C | 67-6C | 68-6C | 69-6C | 610-6C |
| 4407 4307 | | 61-7C | 62-7C | 63-7C | 64-7C | 65-7C | 66-7C | 67-7C | 68-7C | 69-7C | 610-7C |
| 4408 4308 | | 61-8C | 62-8C | 63-8C | 64-8C | 65-8C | 66-8C | 67-8C | 68-8C | 69-8C | 610-8C |
| 4409 4309 | | 61-9C | 62-9C | 63-9C | 64-9C | 65-9C | 66-9C | 67-9C | 68-9C | 69-9C | 610-9C |
| 4410 4310 | | 61-10C | 62-10C | 63-10C | 64-10C | 65-10C | 66-10C | 67-10C | 68-10C | 69-10C | 610-10C |
| 4409 4311 | | 61-11C | 62-11C | 63-11C | 64-11C | 65-11C | 66-11C | 67-11C | 68-11C | 69-11C | 610-11C |
| 4410 4312 | | 61-12C | 62-12C | 63-12C | 64-12C | 65-12C | 66-12C | 67-12C | 68-12C | 69-12C | 610-12C |

TABLE 12C-continued

| Depth profile of N | Sample No. | Depth profile of B and Ge | | | | | | | | | |
|---|---|---|---|---|---|---|---|---|---|---|---|
| | | 4201 4501 | 4202 4502 | 4203 4503 | 4204 4504 | 4205 4505 | 4206 5406 | 4201 4507 | 4202 4504 | 4204 4505 | 4205 4506 |
| 4410 4313 | | 61-13C | 62-13C | 63-13C | 64-13C | 65-13C | 66-13C | 67-13C | 68-13C | 69-13C | 610-13C |

TABLE 13C

| Conditions | Gases employed | Flow rate (SCCM) | Flow rate ratio or area ratio | Discharging power (W/cm$^2$) | Layer thickness ($\mu$) |
|---|---|---|---|---|---|
| 13-1C | Ar | 200 | Si Wafer:graphite = 1.5:8.5 | 0.3 | 0.5 |
| 13-2C | Ar | 200 | Si wafer:graphite = 0.5:9.5 | 0.3 | 0.3 |
| 13-3C | Ar | 200 | Si wafer:graphite = 6:4 | 0.3 | 1.0 |
| 13-4C | SiH$_4$/He = 1 C$_2$H$_4$ | SiH$_4$ = 15 | SiH$_4$:C$_2$H$_4$ = 0.4:9.6 | 0.18 | 0.3 |
| 13-5C | SiH$_4$/He = 0.5 C$_2$H$_4$ | SiH$_4$ = 100 | SiH$_4$:C$_2$H$_4$ = 5:5 | 0.18 | 1.5 |
| 13-6C | SiH$_4$/He = 0.5 SiF$_4$/He = 0.5 C$_2$H$_4$ | SiH$_4$ + SiF$_4$ = 150 | SiH$_4$:SiF$_4$:C$_2$H$_4$ = 1.5:1.5:7 | 0.18 | 0.5 |
| 13-7C | SiH$_4$/He = 0.5 SiF$_4$/He = 0.5 C$_2$H$_4$ | SiH$_4$ + SiF$_4$ = 15 | SiH$_4$:SiF$_4$:C$_2$H$_4$ = 0.3:0.1:9.6 | 0.18 | 0.3 |
| 13-8C | SiH$_4$/He = 0.5 SiF$_4$/He = 0.5 C$_2$H$_4$ | SiH$_4$ + SiF$_4$ = 150 | SiH$_4$:SiF$_4$:C$_2$H$_4$ = 3:3:4 | 0.18 | 1.5 |

TABLE 14C

| Layer (II) forming conditions | Sample No./Evaluation | | |
|---|---|---|---|
| 13-1C | 11-1-1C O O | 12-1-1C O O | 13-1-1C O O |
| 13-2C | 11-1-2C O O | 12-1-2C O O | 13-1-2C O O |
| 13-3C | 11-1-3C O O | 12-1-3C O O | 13-1-3C O O |
| 13-4C | 11-1-4C ⊚ ⊚ | 12-1-4C ⊚ ⊚ | 13-1-4C ⊚ ⊚ |
| 13-5C | 11-1-5C ⊚ ⊚ | 12-1-5C ⊚ ⊚ | 13-1-5C ⊚ ⊚ |
| 13-6C | 11-1-6C ⊚ ⊚ | 12-1-6C ⊚ ⊚ | 13-1-6C ⊚ ⊚ |
| 13-7C | 11-1-7C O O | 12-1-7C O O | 13-1-7C O O |
| 13-8C | 11-1-8C O O | 12-1-8C O O | 13-1-8C O O |

| Sample No. | | |
|---|---|---|
| Overall image quality evaluation | Durability evaluation | |

Evaluation standard:
⊚ — Excellent
O — Good

TABLE 15C

| Sample No. | 1501C | 1502C | 1503C | 1504C | 1505C | 1506C | 1507C |
|---|---|---|---|---|---|---|---|
| Si:C target (Area ratio) | 9:1 | 6.5:3.5 | 4:6 | 2:8 | 1:9 | 0.5:9.5 | 0.2:9.8 |
| Si:C (Content ratio) | 9.7:0.3 | 8.8:1.2 | 7.3:2.7 | 4.8:5.2 | 3:7 | 2:8 | 0.8:9.2 |
| Image quality evaluation | Δ | O | ⊚ | ⊚ | O | Δ | X |

⊚: Very good
O: Good
Δ: Practically satisfactory
X: Image defect formed

TABLE 16C

| Sample No. | 1601C | 1602C | 1603C | 1604C | 1605C | 1606C | 1607C | 1608C |
|---|---|---|---|---|---|---|---|---|
| SiH$_4$:C$_2$H$_4$ (Flow rate ratio) | 9:1 | 6:4 | 4:6 | 2:8 | 1:9 | 0.5:9.5 | 0.35:9.65 | 0.2:9.8 |
| Si:C (Content ratio) | 9:1 | 7:3 | 5.5:4.5 | 4:6 | 3:7 | 2:8 | 1.2:8.8 | 0.8:9.2 |
| Image quality evaluation | Δ | O | ⊚ | ⊚ | ⊚ | O | Δ | X |

⊚: Very good
O: Good
Δ: Practically satisfactory
X: Image defect formed

TABLE 17C

| Sample No. | 1701C | 1702C | 1703C | 1704C | 1705C | 1706C | 1707C | 1708C |
|---|---|---|---|---|---|---|---|---|
| $SiH_4:SiF_4:C_2H_4$ (Flow rate ratio) | 5:4:1 | 3:3.5:3.5 | 2:2:6 | 1:1:8 | 0.6:0.4:9 | 0.2:0.3:9.5 | 0.2:0.15:9.65 | 0.1:0.1:9.8 |
| Si:C (Content ratio) | 9:1 | 7:3 | 5.5:4.5 | 4:6 | 3:7 | 2:8 | 1.2:8.8 | 0.8:9.2 |
| Image quality evaluation | ∆ | O | ⊚ | ⊚ | ⊚ | O | ∆ | X |

⊚: Very good
O: Good
∆: Practically satisfactory
X: Image defect formed

TABLE 18C

| Sample No. | Thickness of layer (II) (μ) | Results |
|---|---|---|
| 1801C | 0.001 | Image defect liable to be formed |
| 1802C | 0.02 | No image defect formed up to successive copying for 20,000 times |
| 1803C | 0.05 | Stable up to successive copying for 50,000 times or more |
| 1804C | 1 | Stable up to successive copying for 200,000 times or more |

We claim:

1. A photoconductive member comprising a substrate for photoconductive member and a light receiving layer provided on said substrate having a layer constitution in which a first layer region (G) comprising an amorphous material containing germanium atoms and a second layer region (S) exhibiting photoconductivity comprising an amorphous material containing silicon atoms are successively provided from the substrate side, said light receiving layer containing nitrogen atoms together with a substance (C) for controlling conductivity in a distribution state such that, in said light receiving layer, the maximum value $C(PN)_{max}$ of the content of said substance (C) in the layer thickness direction exists within said second layer region (S) or at the interface between said first and second layer regions and, in said second layer region (S), said substance (C) is distributed in greater amount on the side of said substrate.

2. A photoconductive member according to claim 1, wherein silicon atoms are contained in the first layer region (G).

3. A photoconductive member according to claim 1, wherein the germanium atoms are distributed in the first layer region (G) ununiformly in the layer thickness direction.

4. A photoconductive member according to claim 1, wherein the germanium atoms are distributed in the first layer region (G) uniformly in the layer thickness direction.

5. A photoconductive member according to claim 1, wherein hydrogen atoms are contained in at lease one of the first layer region (G) and the second layer region (S).

6. A photoconductive member according to claim 1, wherein halogen atoms are contained in at least one of the first layer region (G) and the second layer region (S).

7. A photoconductive member according to claim 5, wherein halogen atoms are contained in at least one of the first layer region (G) and the second layer region (S).

8. A photoconductive member according to claim 2, wherein germanium atoms are distributed in the first layer region (G) more enriched on the side of said substrate.

9. A photoconductive member according to claim 1, wherein the substance (C) for controlling conductivity is an atom belonging to the group III of the periodic table.

10. A photoconductive member according to claim 1, wherein the substance (C) for controlling conductivity is an atom belonging to the group V of the periodic table.

11. A photoconductive member according to claim 3, wherein the maximum value of the content Cmax in the layer thickness direction of germanium atoms in the first layer region (G) is 1000 atomic ppm or more based on the sum with silicon atoms in the first layer region (G).

12. A photoconductive member according to claim 1, wherein the germanium atoms are contained in the first layer region (G) at relatively higher content on the side of the substrate.

13. A photoconductive member according to claim 1, wherein the amount of germanium atoms contained in the first layer region (G) is 1 to $1 \times 10^6$ atomic ppm.

14. A photoconductive member according to claim 1, wherein the first layer region (G) has a layer thickness $T_B$ of 30 Å to 50μ.

15. A photoconductive member according to claim 1, wherein the second layer region (S) has a layer thickness T of 0.5 to 90μ.

16. A photoconductive member according to claim 1, wherein there is the relationship between the layer thickness $T_B$ of the first layer region (G) and the layer thickness T of the second layer region (S) of $T_B/T \leq 1$.

17. A photoconductive member according to claim 1, wherein the layer thickness $T_B$ of the first region (G) is 30μ or less, when the content of germanium atoms contained in the first layer region (G) is $1 \times 10^5$ atomic ppm or more.

18. A photoconductive member according to claim 1, wherein 0.01 to 40 atomic % of hydrogen atoms are contained in the first layer region (G).

19. A photoconductive member according to claim 1, wherein 0.01 to 40 atomic % of halogen atoms are contained in the first layer region (G).

20. A photoconductive member according to claim 1, wherein 0.01 to 40 atomic % in total of hydrogen atoms and halogen atoms are contained in the first layer region (G).

21. A photoconductive member according to claim 1, wherein the substance (C) for controlling conductivity is contained in the entire region in the layer thickness direction of the second layer region (S).

22. A photoconductive member according to claim 1, wherein the substance (C) for controlling conductivity is contained in a part of the layer region in the second layer region (S).

23. A photoconductive member according to claim 1, wherein the substance (C) for controlling conductivity is contained in the end portion on the substrate side of the second layer region (S).

24. A photoconductive member according to claim 1, wherein the distribution concentration of the substance (C) in the layer thickness direction is increased toward the direction of the substrate side.

25. A photoconductive member according to claim 1, wherein the substance (C) is contained in the first layer region (G).

26. A photoconductive member according to claim 1, wherein the maximum distribution concentrations of the substance (C) for controlling conductivity $C(G)_{max}$ and $C(S)_{max}$ in the layer thickness direction in the first layer region (G) and the second layer region (S), respectively, satisfy the relationship of $C(G)_{max} < C(S)_{max}$.

27. A photoconductive member according to claim 9, wherein the atom belonging to the group III of the periodic table is selected from the group consisting of B, Al, Ga, In and Tl.

28. A photoconductive member according to claim 10, wherein the atom belonging to the group V of the periodic table is selected from the group consisting of P, As, Sb and Bi.

29. A photoconductive member according to claim 1, wherein the content of the substance (C) for controlling conductivity is 0.01 to $5 \times 10^4$ atomic ppm.

30. A photoconductive member according to claim 1, wherein the layer region (PN) containing the substance (C) strides on both the first layer region (G) and the second layer region (S).

31. A photoconductive member according to claim 30, wherein the content of the substance (C) in the layer region (PN) is 0.01 to $5 \times 10^4$ atomic ppm.

32. A photoconductive member according to claim 30, wherein there is provided a layer region (Z) in contact with the layer region (PN), which contains a substance (C) of the opposite polarity to that of the substance (C) contained in said layer region (PN).

33. A photoconductive member according to claim 1, wherein 1 to 40 atomic % of hydrogen atoms are contained in the second layer region (S).

34. A photoconductive member according to claim 1, wherein 1 to 40 atomic % of halogen atoms are contained in the second layer region (S).

35. A photoconductive member according to claim 1, wherein 1 to 40 atomic % as the total of hydrogen atoms and halogen atoms are contained in the second layer region (S).

36. A photoconductive member according to claim 1, wherein nitrogen atoms are contained throughout the whole layer region of the light receiving layer.

37. A photoconductive member according to claim 1, wherein nitrogen atoms are contained in a part of the layer region of the light receiving layer.

38. A photoconductive member according to claim 1, wherein nitrogen atoms are distributed ununiformly in the layer thickness direction in the light receiving layer.

39. A photoconductive member according to claim 1, wherein nitrogen atoms are distributed uniformly in the layer region of the light receiving layer.

40. A photoconductive member according to claim 1, wherein nitrogen atoms are contained in the end portion layer region on the substrate side of the light receiving layer.

41. A photoconductive member according to claim 1, wherein nitrogen atoms are contained in the layer region including the interface between the first layer region (G) and the second layer region (S).

42. A photoconductive member according to claim 1, wherein nitrogen atoms are contained in the first layer region (G) at higher content in the end portion layer region on the substrate side.

43. A photoconductive member according to claim 1, wherein nitrogen atoms are distributed at higher content on the substrate side and the free surface side of the light receiving layer.

44. A photoconductive member according to claim 1, wherein the depth profile of distribution concentration of nitrogen atoms in the layer thickness direction in the light receiving layer has a portion which is continuously changed.

45. A photoconductive member according to claim 1, wherein nitrogen atoms are contained in the layer region (N) at a proportion of 0.001 to 50 atomic % based on the sum T(SiGeN) of the content of the three kinds of atoms of silicon atoms, germanium atoms and nitrogen atoms in said layer region (N).

46. A photoconductive member according to claim 1, wherein the upper limit of the nitrogen atoms contained in said layer region (N) is not more than 30 atomic % based on the sum T(SiGeN) of the content of the three kinds of atoms of silicon atoms, germanium atoms and nitrogen atoms in said layer region (N), when the layer thickness $T_O$ containing nitrogen atoms comprises 2/5 or more of the layer thickness T of the light receiving layer.

47. A photoconductive member according to claim 1, wherein the maximum value Cmax of the distribution concentration of nitrogen atoms in the layer thickness direction is 500 atomic ppm or more based on the sum T(SiGeN) of the content of the three kinds of atoms of silicon atoms, germanium atoms and nitrogen atoms in the layer region (N) containing nitrogen atoms.

48. A photoconductive member according to claim 1, wherein the maximum value Cmax of the distribution concentration of nitrogen atoms in the layer thickness direction is 67 atomic % or less based on the sum T(SiGeN) of the content of the three kinds of atoms of silicon atoms, germanium atoms and nitrogen atoms in the layer region (N) containing nitrogen atoms.

49. A photoconductive member comprising a substrate for photoconductive member and a light receiving layer provided on said substrate consisting of a first layer (I) with a layer constitution in which a first layer region (G) comprising an amorphous material containing germanium atoms and a second layer region (S) exhibiting photoconductivity comprising an amorphous material containing silicon atoms are successively provided from the substrate side and a second layer (II) comprising an amorphous material containing silicon atoms and at least one atom selected from carbon atoms and oxygen atoms, said first layer (I) containing nitrogen atoms together with a substance for controlling conductivity (C) in a distribution state such that the maximum value of the distribution concentration C(PN)$_{max}$ of said substance (C) in the layer thickness direction exists within said second layer region (S) and, in said second layer region (S), said substance (C) is distributed in greater amount on the side of said substrate.

50. A photoconductive member according to claim 49, wherein silicon atoms are contained in the first layer region (G).

51. A photoconductive member according to claim 49, wherein the germanium atoms are distributed in the first layer region (G) ununiformly in the layer thickness direction.

52. A photoconductive member according to claim 49, wherein the germanium atoms are distributed in the first layer region (G) uniformly in the layer thickness direction.

53. A photoconductive member according to claim 49, wherein hydrogen atoms are contained in at least one of the first layer region (G) and the second layer region (S).

54. A photoconductive member according to claim 49, wherein halogen atoms are contained in at least one of the first layer region (G) and the second layer region (S).

55. A photoconductive member according to claim 52, wherein halogen atoms are contained in at least one of the first layer region (G) and the second layer region (S).

56. A photoconductive member according to claim 50, wherein germanium atoms are distributed in the first layer region (G) more enriched on the side of said substrate.

57. A photoconductive member according to claim 49, wherein the substance (C) for controlling conductivity is an atom belonging to the group III of the periodic table.

58. A photoconductive member according to claim 49, wherein the substance (C) for controlling conductivity is an atom belonging to the group V of the periodic table.

59. A photoconductive member according to claim 51, wherein the maximum value of the content Cmax in the layer thickness direction of germanium atoms in the first layer region (G) is 1000 atomic ppm or more based on the sum with silicon atoms in the first layer region (G).

60. A photoconductive member according to claim 49, wherein germanium atoms are contained in the first layer region (G) at relatively higher content on the side of the substrate.

61. A photoconductive member according to claim 49, wherein the amount of germanium atoms contained in the first layer region (G) is 1 to $1 \times 10^6$ atomic ppm.

62. A photoconductive member according to claim 49, wherein the first layer region (G) has a layer thickness $T_B$ of 30 Å to 50$\mu$.

63. A photoconductive member according to claim 49, wherein the second layer region (S) has a layer thickness T of 0.5 to 90$\mu$.

64. A photoconductive member according to claim 49, wherein there is the relationship between the layer thickness $T_B$ of the first layer region (G) and the layer thickness T of the second layer region (S) of $T_B/T \leq 1$.

65. A photoconductive member according to claim 49, wherein the layer thickness $T_B$ of the first layer region (G) is 30$\mu$ or less, when the content of germanium atoms contained in the first layer region (G) is $1 \times 10^5$ atomic ppm or more.

66. A photoconductive member according to claim 49, wherein 0.01 to 40 atomic % or hydrogen atoms are contained in the first layer region (G).

67. A photoconductive member according to claim 49, wherein 0.01 to 40 atomic % of halogen atoms are contained in the first layer region (G).

68. A photoconductive member according to claim 49, wherein 0.01 to 40 atomic % of hydrogen atoms and halogen atoms in total are contained in the first layer region (G).

69. A photoconductive member according to claim 49, wherein the substance (C) for controlling conductivity is contained throughout the entire region in the layer thickness direction of the second layer region (S).

70. A photoconductive member according to claim 49, wherein the substance (C) for controlling conductivity is contained in a part of the layer region in the second layer region (S).

71. A photoconductive member according to claim 49, wherein the substance (C) for controlling conductivity is contained in the end portion on the substrate side of the second layer region (S).

72. A photoconductive member according to claim 49, wherein the distribution concentration of the substance (C) in the layer thickness direction is increased toward the direction of the substrate side.

73. A photoconductive member according to claim 49, wherein the substance (C) is contained in the first layer region (G).

74. A photoconductive member according to claim 49, wherein the maximum content of the substance (C) for controlling conductivity C(G)$_{max}$ and C(S)$_{max}$ in the layer thickness direction in the first layer region (G) and the second layer region (S), respectively, satisfy the relationship of C(G)$_{max}$ < C(G)$_{max}$.

75. A photoconductive member according to claim 57, wherein the atom belonging the group III of the periodic table is selected from the group consisting of B, Al, Ga, In and Tl.

76. A photoconductive member according to claim 58, wherein the atom belonging to the group V of the periodic table is selected from among P, As, Sb an Bi.

77. A photoconductive member according to claim 49, wherein the content of the substance (C) for controlling conductivity is 0.01 to $5 \times 10^4$ atomic ppm.

78. A photoconductive member according to claim 49, wherein the layer region (PN) containing the substance (C) strides on both of the first layer region (G) and the second layer region (S).

79. A photoconductive member according to claim 78, wherein the content of the substance (C) in the layer region (PN) is 0.01 to $5 \times 10^4$ atomic ppm.

80. A photoconductive member according to claim 78, wherein there is provided a layer region (Z) in contact with the layer region (PN), which contains a substance (C) of the opposite polarity to that of the substance (C) contained in said layer region (PN).

81. A photoconductive member according to claim 49, wherein 1 to 40 atomic % of hydrogen atoms are contained in the second layer region (S).

82. A photoconductive member according to claim 49, wherein 1 to 40 atomic % of halogen atoms are contained in the second layer region (S).

83. A photoconductive member according to claim 49, wherein 1 to 40 atomic % in total of hydrogen atoms and halogen atoms are contained in the second layer region (S).

84. A photoconductive member according to claim 49, wherein nitrogen atoms are contained throughout the whole layer region of the first layer (I).

85. A photoconductive member according to claim 49, wherein nitrogen atoms are contained in a part of the layer region of the first layer (I).

86. A photoconductive member according to claim 49, wherein nitrogen atoms are distributed in the first layer (I) ununiformly in the layer thickness direction.

87. A photoconductive member according to claim 49, wherein nitrogen atoms are distributed uniformly in the layer region of the first layer (I).

88. A photoconductive member according to claim 49, wherein nitrogen atoms are contained in the end portion layer region on the substrate side of the first layer (I).

89. A photoconductive member according to claim 49, wherein nitrogen atoms are contained in the layer region containing the interface between the first layer region (G) and the second layer region (S).

90. A photoconductive member according to claim 49, wherein nitrogen atoms are contained in the first layer region (G) at higher content in the end portion layer region on the substrate side.

91. A photoconductive member according to claim 49, wherein nitrogen atoms are distributed at higher content on the substrate side and the free surface side of the first layer (I).

92. A photoconductive member according to claim 49, wherein the depth profile of the distribution concentration of nitrogen atoms in the layer thickness direction in the first layer (I) has a portion which is continuously changed.

93. A photoconductive member according to claim 49, wherein nitrogen atoms are contained in the layer region (N) at a proportion of 0.001 to 50 atomic % based on the sum T(SiGeN) of the content of the three kinds of atoms of silicon atoms, germanium atoms and nitrogen atoms in said layer region (N).

94. A photoconductive member according to claim 49, wherein the upper limit of the nitrogen atoms contained in said layer region (N) is not more than 30 atomic % baased on the sum T(SiGeN) of the content of the three kinds of atoms of silicon atoms, germanium atoms and nitrogen atoms in said layer region (N), when the layer thickness $T_0$ containing atoms comprises 2/5 or more of the layer thickness T of the first layer (I).

95. A photoconductive member according to claim 49, wherein the maximum value Cmax of the content of nitrogen atoms in the layer thickness direction is 500 atomic ppm or more based on the sum T(SiGeN) of the content of the three kinds of atoms of silicon atoms, germanium atoms and nitrogen atoms in the layer region (N) containing nitrogen atoms.

96. A photoconductive member according to claim 49, wherein the maximum value Cmax of the content of nitrogen atoms in the layer thickness direction is 67 atomic % or less based on the sum T(SiGeN) of the content of the three kinds of atoms of silicon atoms, germanium atoms and nitrogen atoms in the layer region (N) containing nitrogen atoms.

97. A photoconductive member according to claim 49, wherein the amorphous material constituting the second layer (II) is an amorphous material represented by the following general formula:

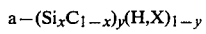
$a-(Si_xC_{1-x})_y(H,X)_{1-y}$ (where $0<x$, $y<1$, X is a halogen atom).

98. A photoconductive member according to claim 49, wherein the amorphorous material constituting the sceond layer (II) is an amorphous material represented by the folowing general formula:

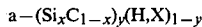
$a-(Si_xC_{1-x})_y(H,X)_{1-y}$ (where $0<x$, $y<1$, X is a halogen atom).

99. A photoconductive member according to claim 49, wherein the second layer (II) has a layer thickness of 0.003 to 30μ.

* * * * *

UNITED STATES PATENT AND TRADEMARK OFFICE
CERTIFICATE OF CORRECTION

PATENT NO. : 4,579,797

DATED : April 1, 1986

INVENTOR(S) : KEISHI SAITOH

It is certified that error appears in the above-identified patent and that said Letters Patent is hereby corrected as shown below:

COLUMN 14

Line 20, "a-S(H,X)" should read --a-Si(H,X)--.

Line 67, "$B_4H^{10}$," should read --$B_4H_{10}$,--.

COLUMN 15

Line 8, "$PBr_3$" should read --$\underline{PBr}_3$--.

Line 10, "$BiCl_{13}$," should read --$BiCl_3$,--.

COLUMN 28

Lines 8-9, "a-$(Si_dO_{1/d})_e(H,X)_{1-e}$," should read --
a-$(Si_dO_{1-d})_e(H,X)_{1-e}$",--.

COLUMN 45

TABLE 1B, "Second   should read  --Second--.
          Layer                   Layer
          region                  region
                                  (S)

COLUMN 48

TABLE 4B, "25-3B" should read --25-3B--.
          24-4B                  25-4b
          25-5B                  25-5B
          24-6B                  25-6B

UNITED STATES PATENT AND TRADEMARK OFFICE
CERTIFICATE OF CORRECTION

PATENT NO. : 4,579,797

DATED : April 1, 1986

INVENTOR(S) : KEISHI SAITOH

It is certified that error appears in the above-identified patent and that said Letters Patent is hereby corrected as shown below:

COLUMN 14

Line 20, "a-S(H,X)" should read --a-Si(H,X)--.

Line 67, "$B_4H^{10}$," should read --$B_4H_{10}$,--.

COLUMN 15

Line 8, "$PBr_3$" should read --$\underline{PBr}_3$--.

Line 10, "$BiCl_{13}$," should read --$BiCl_3$,--.

COLUMN 28

Lines 8-9, "$a-(Si_dO_{1/d})_e(H,X)_{1-e}$," should read --$a-(Si_dO_{1-d})_e(H,X)_{1-e}$",--.

COLUMN 45

TABLE 1B, "Second" should read --Second--.
            Layer                  Layer
            region               region
                                     (S)

COLUMN 48

TABLE 4B, "25-3B" should read --25-3B--.
           24-4B                25-4b
           25-5B                25-5B
           24-6B                25-6B

UNITED STATES PATENT AND TRADEMARK OFFICE
CERTIFICATE OF CORRECTION

PATENT NO. : 4,579,797
DATED : April 1, 1986
INVENTOR(S) : KEISHI SAITOH, EL AL.

It is certified that error appears in the above-identified patent and that said Letters Patent is hereby corrected as shown below:

COLUMN 49

TABLE 5B, "$(PH_3/He=1\times10^{-3})$" should read --$(PH_3/He=1\times10^{-3})$--.
$NH_4$ TABLE 7B, "Second" should read --Second--.
layer      layer region (S)

TABLE 7B, "$B_2H_6/He=1\times10^{-3}$" should read --$B_2H_6/He=1\times10^{-3}$--.
$(PH_3/He=1\times10^{-3}$

COLUMN 51

TABLE 9B, "$\dfrac{NH_2}{SiH_4}$" should read --$\dfrac{NH_3}{SiH_4}$--.

COLUMN 57

TABLE 3C, "$GeF_4=SiF_4=200$" should read --$GeF_4+SiF_4=200$--.

COLUMN 59

TABLE 7C, "$SiH_4GeH_4=200$" should read --$SiH_4+GeH_4=200$--.

COLUMN 61

TABLE 9C, "$SiH_4/He=0.5$" should read --$SiH_4/He=0.5$--.
$SiH_4/He=0.5$

UNITED STATES PATENT AND TRADEMARK OFFICE
CERTIFICATE OF CORRECTION

PATENT NO. : 4,579,797

DATED : April 1, 1986

Page 3 of 4

INVENTOR(S) : KEISHI SAITOH, ET AL.

It is certified that error appears in the above-identified patent and that said Letters Patent is hereby corrected as shown below:

COLUMN 67

Line 60, "lease" should read --least--.

COLUMN 69

Line 56, "as" should read --of--.

COLUMN 72

Line 2, "or" should read --of--.
Line 35, "C(G)max<C(G)max." should read --C(G)max<C(S)max.--.
Line 42, "Sb an Bi." should read --Sb and Bi.--.

UNITED STATES PATENT AND TRADEMARK OFFICE
CERTIFICATE OF CORRECTION

PATENT NO. : 4,579,797

DATED : April 1, 1986

INVENTOR(S) : KEISHI SAITOH, ET AL.

It is certified that error appears in the above-identified patent and that said Letters Patent is hereby corrected as shown below:

COLUMN 74

Line 4, "baased" should read --based--.
Line 7, "containing atoms" should read --containing nitrogen atoms--.
Line 30, "amorphorous" should read --amorphous--.
Line 32, "folowing" should read --following--.
Line 34, "$a-(Si_xC_{1-x})_y(H,X)_{1-y}$" should read $a-(Si_xN_{1-x})_y(H,X)_{1-y}$--.

Signed and Sealed this

Fourteenth Day of April, 1987

Attest:

DONALD J. QUIGG

Attesting Officer

Commissioner of Patents and Trademarks